(12) United States Patent
Hirose et al.

(10) Patent No.: US 9,384,961 B2
(45) Date of Patent: *Jul. 5, 2016

(54) METHOD FOR MANUFACTURING SEMICONDUCTOR DEVICE, METHOD FOR PROCESSING SUBSTRATE, SUBSTRATE PROCESSING APPARATUS AND RECORDING MEDIUM

(71) Applicant: HITACHI KOKUSAI ELECTRIC INC., Tokyo (JP)

(72) Inventors: Yoshiro Hirose, Toyama (JP); Ryuji Yamamoto, Kadaira (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 10 days.

This patent is subject to a terminal disclaimer.

(21) Appl. No.: 14/833,480

(22) Filed: Aug. 24, 2015

(65) Prior Publication Data

US 2015/0364318 A1    Dec. 17, 2015

Related U.S. Application Data

(63) Continuation of application No. 14/240,897, filed as application No. PCT/JP2012/069562 on Aug. 1, 2012, now Pat. No. 9,165,761.

(30) Foreign Application Priority Data

Aug. 25, 2011    (JP) ................. 2011-183815

(51) Int. Cl.

| | |
|---|---|
| *H01L 21/31* | (2006.01) |
| *H01L 21/02* | (2006.01) |
| *C23C 16/36* | (2006.01) |
| *C23C 16/40* | (2006.01) |
| *C23C 16/455* | (2006.01) |
| *H01L 21/67* | (2006.01) |
| *C23C 16/30* | (2006.01) |

(Continued)

(52) U.S. Cl.
CPC .......... *H01L 21/0214* (2013.01); *C23C 16/308* (2013.01); *C23C 16/36* (2013.01);
(Continued)

(58) Field of Classification Search
CPC .............. H01L 21/314; H01L 21/3141; H01L 21/3143; H01L 21/02126; H01L 21/0214; H01L 21/02164
USPC .......... 438/761, 763, 778, 780, 781, 790, 794
See application file for complete search history.

(56) References Cited

U.S. PATENT DOCUMENTS

| | | |
|---|---|---|
| 6,486,083 B1 | 11/2002 | Mizuno et al. |
| 2005/0095770 A1 | 5/2005 | Kumagai et al. |

(Continued)

FOREIGN PATENT DOCUMENTS

| | | |
|---|---|---|
| JP | 2001-230248 A | 8/2001 |
| JP | 2003-282566 A | 10/2003 |

(Continued)

OTHER PUBLICATIONS

Oct. 14, 2014 Office Action issued in Japanese Patent Application No. 2013-529946.

(Continued)

*Primary Examiner* — Kevin M Picardat
(74) *Attorney, Agent, or Firm* — Oliff PLC

(57) ABSTRACT

A method for manufacturing a semiconductor device includes forming a thin film containing a specific element and having a prescribed composition on a substrate by alternately performing the following steps prescribed number of times: forming a first layer containing the specific element, nitrogen, and carbon on the substrate by alternately performing prescribed number of times: supplying a first source gas containing the specific element and a halogen-group to the substrate, and supplying a second source gas containing the specific element and an amino-group to the substrate, and forming a second layer by modifying the first layer by supplying a reactive gas different from each of the source gases, to the substrate.

18 Claims, 26 Drawing Sheets

(51) Int. Cl.
*H01J 37/32* (2006.01)
*C23C 16/52* (2006.01)

(52) U.S. Cl.
CPC .......... *C23C 16/401* (2013.01); *C23C 16/455* (2013.01); *C23C 16/45531* (2013.01); *C23C 16/45542* (2013.01); *H01J 37/32449* (2013.01); *H01J 37/32541* (2013.01); *H01L 21/0217* (2013.01); *H01L 21/0228* (2013.01); *H01L 21/0262* (2013.01); *H01L 21/02109* (2013.01); *H01L 21/02115* (2013.01); *H01L 21/02123* (2013.01); *H01L 21/02126* (2013.01); *H01L 21/02167* (2013.01); *H01L 21/02205* (2013.01); *H01L 21/02211* (2013.01); *H01L 21/02219* (2013.01); *H01L 21/02263* (2013.01); *H01L 21/02274* (2013.01); *H01L 21/67098* (2013.01); *H01L 21/67109* (2013.01); *C23C 16/52* (2013.01)

(56) References Cited

U.S. PATENT DOCUMENTS

| | | |
|---|---|---|
| 2006/0032442 A1 | 2/2006 | Hasebe |
| 2008/0213479 A1 | 9/2008 | Chou et al. |
| 2010/0124621 A1 | 5/2010 | Kobayashi et al. |
| 2010/0130024 A1 | 5/2010 | Takasawa et al. |
| 2010/0136260 A1 | 6/2010 | Matsunaga et al. |
| 2011/0076857 A1 | 3/2011 | Akae et al. |

FOREIGN PATENT DOCUMENTS

| | | |
|---|---|---|
| JP | 2006-054432 A | 2/2006 |
| JP | 2008-227460 A | 9/2008 |
| JP | 2010-010497 A | 1/2010 |
| JP | 2010-090413 A | 4/2010 |
| JP | 2010-153795 A | 7/2010 |
| JP | 2011-097017 A | 5/2011 |
| JP | 2012-509354 A | 4/2012 |
| TW | 200938656 A | 9/2009 |

OTHER PUBLICATIONS

Dec. 19, 2014 Office Action issued in Korean Patent Application No. 10-2013-7029622.

May 9, 2014 Office Action issued in Taiwanese Application No. 101130626.

Oct. 30, 2012 International Search Report issued in International Application No. PCT/JP2012/069562.

Oct. 30, 2012 Written Opinion issued in International Application No. PCT/JP2012/069562.

US 9,384,961 B2

METHOD FOR MANUFACTURING SEMICONDUCTOR DEVICE, METHOD FOR PROCESSING SUBSTRATE, SUBSTRATE PROCESSING APPARATUS AND RECORDING MEDIUM

This application is a continuation application of U.S. application Ser. No. 14/240,897 filed Feb. 25, 2014, which in turn is the U.S. National Phase of PCT Application No. PCT/JP2012/069562 filed Aug. 1, 2012. The entire disclosures of these parent applications are incorporated herein by reference.

BACKGROUND

1. Technical Field

The present invention relates to a method for manufacturing a semiconductor device including forming a thin film on a substrate, a method for processing a substrate, a substrate processing apparatus and a recording medium.

2. Description of Related Art

The step of manufacturing a semiconductor device includes the step of forming a silicon insulating film such as a silicon oxide film ($SiO_2$) and a silicon nitride film ($Si_3N_4$) on a wafer such as a silicon wafer. The silicon oxide film has excellent insulation property and low dielectric property, and is widely used as an insulating film and an inter-layer film. Further, the silicon nitride film has excellent insulation property, corrosion-resistant property, and film stress controllability, etc., and is widely used as the insulating film and a mask film, a charge storage film, and a stress control film. When a thin film such as a silicon insulating film, etc., is formed by the CVD method and the ALD method, either a chlorosilane-based source or an aminosilane-based source is generally used for example, as a silicon source (for example see patent document 1).

PRIOR ART DOCUMENT

Patent Documents

Patent document 1:
Japanese Patent Laid Open Publication No. 2001-230248

SUMMARY OF THE INVENTION

Problem to be Solved by the Invention

However, when the thin film such as the insulating film, etc., is formed particularly in a low temperature region, using either a source containing a chloro-group such as the chlorosilane-based source, etc., or an amino-group such as the aminosilane-based source, etc., reduction of a film quality is observed, like a case that the insulating film with low silicon density is formed. Further, when $SiH_4$ and $Si_2H_6$ are used for depositing silicon in a process of forming the insulating film, thin film control is carried out by adjusting a wafer temperature and an inner pressure of a processing chamber. However, layered deposition is difficult in this case, and therefore a deposition method by surface reaction is expected. Note that according to an experiment by inventors of the present invention, it is difficult to deposit silicon at a film formation rate satisfying a production efficiency, when the chlorosilane-based source alone is used and when temperature is set to 500° C. or less. Further, when the aminosilane-based source alone is used, deposition of silicon is not confirmed at 500° C. or less.

Accordingly, an object of the present invention is to provide a method for manufacturing a semiconductor device, a method for processing a substrate, a substrate processing apparatus, and a recording medium capable of forming a high quality thin film in a low temperature region, when the thin film is formed using a source containing a chloro-group and a source containing an amino-group.

Means for Solving the Problem

According to an aspect of the present invention, there is provided a method for manufacturing a semiconductor device including:
forming a thin film containing a specific element and having a prescribed composition on a substrate by alternately performing the following steps prescribed number of times:
forming a first layer containing the specific element, nitrogen, and carbon on the substrate by alternately performing prescribed number of times: supplying a first source gas containing the specific element and a halogen-group to the substrate, and supplying a second source gas containing the specific element and an amino-group to the substrate; and
forming a second layer by modifying the first layer by supplying a reactive gas different from each of the source gases, to the substrate.

According to further other aspect of the present invention, there is provided a substrate processing apparatus, including:
a processing chamber configured to house a substrate;
a first source gas supply system configured to supply a first source gas containing a specific element and a halogen-group to a substrate in the processing chamber;
a second source gas supply system configured to supply the specific element and an amino-group to the substrate in the processing chamber;
a reactive gas supply system configured to supply a reactive gas different from each of the source gases, to the substrate in the processing chamber; and
a controller configured to control the first source gas supply system, the second source gas supply system, and the reactive gas supply system, so that a thin film containing the specific element and having a prescribed composition is formed on the substrate by alternately performing the following processes prescribed number of times:
a process of forming a first layer containing the specific element, nitrogen, and carbon on the substrate by alternately performing prescribed number of times:
a process of supplying a first source gas to the substrate in the processing chamber, and a process of supplying the second source gas to the substrate in the processing chamber; and
a process of forming a second layer by modifying the first layer by supplying the reactive gas to the substrate in the processing chamber.

According to further other aspect of the present invention, there is provided a non-transitory computer-readable recording medium recording a program for causing a computer to execute:
forming a thin film having a prescribed composition and containing a specific element on a substrate by alternately performing the following procedures prescribed number of times:
a procedure of forming a first layer containing the specific element, nitrogen, and carbon on the substrate by alternately performing prescribed number of times: a procedure of supplying a first source gas containing the specific element and a halogen-group to the substrate in a processing chamber of a substrate processing apparatus, and a procedure of supplying a second source gas containing the specific element and an amino-group to the substrate in the processing chamber; and a procedure of forming a second layer by modifying the first layer by supplying a reactive gas different from each of the source gases, to the substrate in the processing chamber.

Advantage of the Invention

According to the present invention, there is provided a method for manufacturing a semiconductor device, a method for processing a substrate, a substrate processing apparatus, and a recording medium capable of forming an excellent thin film in a low temperature region when the thin film is formed by using a source containing a chloro-group and a source containing an amino-group.

BRIEF DESCRIPTION OF THE DRAWINGS

FIGS. 3A-3D are views showing a timing of gas supply and plasma power supply in a first sequence of this embodiment, wherein FIG. 3A shows an example of a sequence in which film formation is performed by non-plasma, and FIG. 3B shows an example of a sequence in which film formation is performed using plasma, FIG. 3C shows a modified example of the sequence shown in FIG. 3A, and FIG. 3D shows a modified example of the sequence shown in FIG. 3B.

FIGS. 5A-5D are views showing a timing of gas supply and plasma power source in a third sequence of this embodiment, wherein FIG. 5A shows an example of a sequence in which film formation is performed by non-plasma, FIG. 5B shows an example of a sequence in which film formation is performed using plasma, FIG. 5C shows a modified example of the sequence shown in FIG. 5A, and FIG. 5D shows a modified example of the sequence shown in FIG. 5B.

DESCRIPTION OF DETAILED EMBODIMENT OF THE INVENTION

Preferred embodiments of the present invention will be described hereafter based on the drawings.

Figure 1:
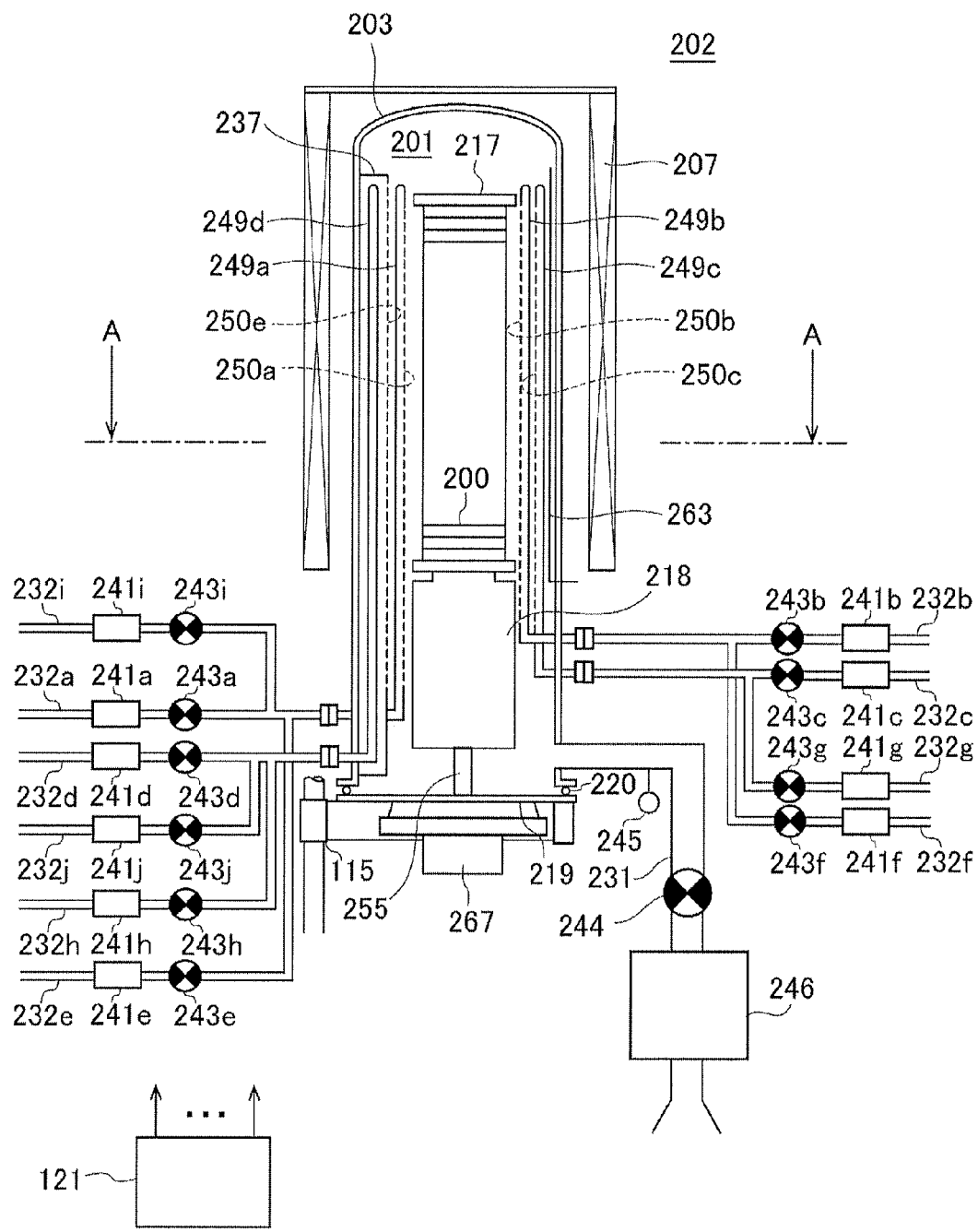
FIG. 1 is a vertical sectional view of a processing furnace of a substrate processing apparatus suitably used in this embodiment, showing a vertical sectional view of a processing furnace portion.
Figure 2:
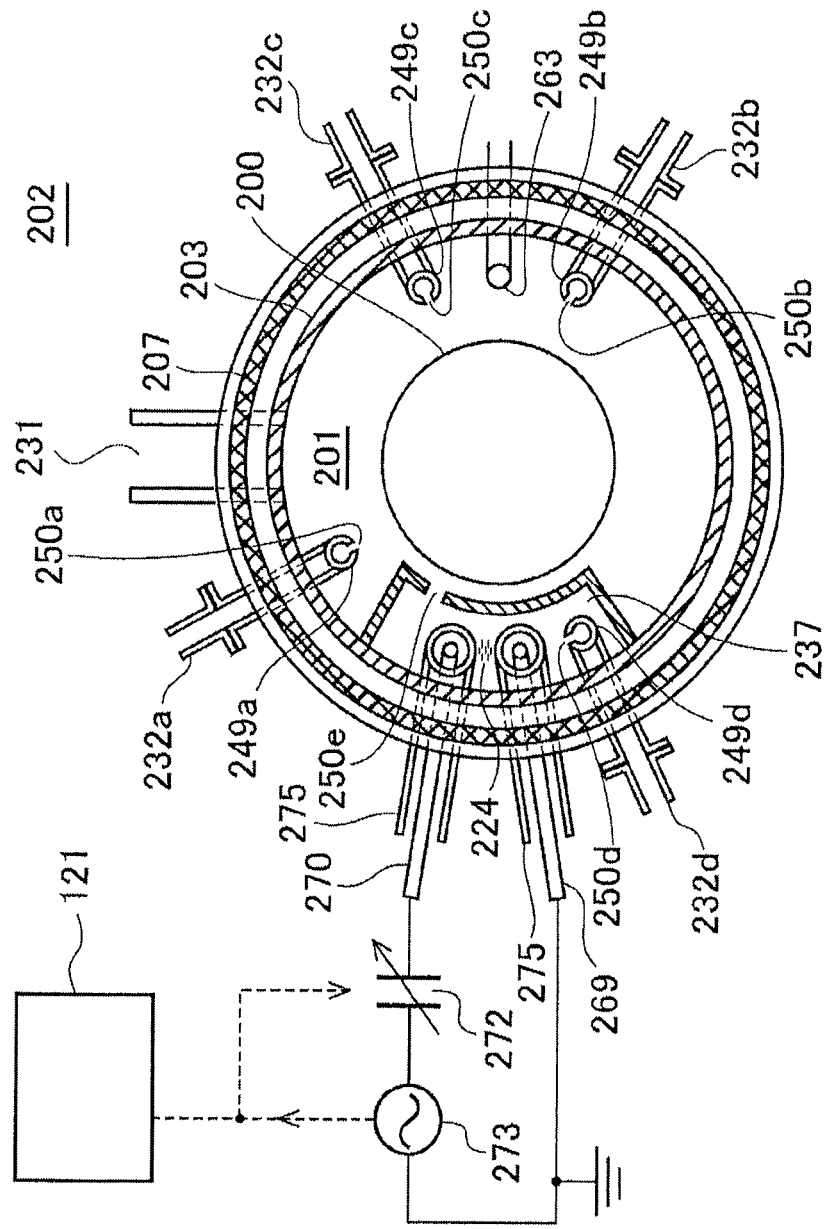
FIG. 2 is a schematic block diagram of the vertical processing furnace of the substrate processing apparatus suitably used in this embodiment, showing a sectional view of the processing furnace portion taken along the line A-A of FIG. 1.

FIG. 1 is a schematic block diagram of a vertical processing furnace of a substrate processing apparatus suitably used in this embodiment, showing a processing furnace 202 portion by a vertical sectional view, and FIG. 2 is a schematic block diagram of the vertical processing furnace suitably used in this embodiment, showing the processing furnace 202 portion by a sectional view taken along the line A-A of FIG. 1.

As shown in FIG. 1, the processing furnace 202 has a heater 207 being a heating unit (heating mechanism). The heater 207 has a cylindrical shape, and is installed on a heater base (not shown) being a holding plate by being supported thereby.

Note that the heater 207 also functions as an activation mechanism for thermally activating gas as will be describe later.

A reaction tube 203 is disposed inside of the heater 207, so as to constitute a reaction vessel (processing vessel) concentrically with the heater 207. The reaction tube 203 is made of a heat-resistant material such as quartz ($SiO_2$) or silicon carbide (SiC), and is formed into a cylindrical shape with an upper end closed and a lower end opened. A processing chamber 201 is formed in a cylindrical hollow part of the reaction tube 203, so that wafers 200 being substrates can be housed in a state of being arranged in multiple stages in a horizontal posture vertically by a boat 217 as will be described later.

A first nozzle 249a, a second nozzle 249b, a third nozzle 249c, and a fourth nozzle 249d are provided in the processing chamber 201 so as to pass through a lower part of the reaction tube 203. A first gas supply pipe 232a, a second gas supply pipe 232b, a third gas supply pipe 232c, and a fourth gas supply pipe 232d are respectively connected to the first nozzle 249a, the second nozzle 249b, the third nozzle 249c, and the fourth nozzle 249d. Further, a fifth gas supply pipe 232i is connected to the first gas supply pipe 232a, and a sixth gas supply pipe 232j is connected to a fourth gas supply pipe 232d. Thus, the reaction tube 203 is provided with four nozzles 249a, 249b, 249c, 249d, and six gas supply pipes 232a, 232b, 232c, 232d, 232i, 232j, so that a plurality of kinds of gases, six kinds here, can be supplied into the processing chamber 201.

A metal manifold supporting the reaction tube 203 is provided in a lower part of the reaction tube 203, an each nozzle may be provided so as to pass through a side wall of the metal manifold. In this case, the exhaust pipe 231 may be further provided in the metal manifold. In this case, the exhaust pipe 231 may be provided not in the metal manifold but in the lower part of the reaction tube 203. Thus, a furnace throat portion of the processing furnace 202 is made of metal and a nozzle, etc., may be attached to such a metal furnace throat portion.

The first gas supply pipe 232a is provided with a mass flow controller (MFC) 241a being a flow rate control unit (flow rate controller) and a valve 243a being an open/close valve, sequentially from an upstream direction. Further, a fifth gas supply pipe 232i is connected to a downstream side of the valve 243a of the first gas supply pipe 232a. The fifth gas supply pipe 232i is provided with a mass flow controller 241i being a flow rate control unit (flow rate controller), and a valve 243i being an open/close valve, sequentially from an upstream direction. Further, a first inert gas supply pipe 232e is connected to the downstream side of a connection part connected to the fifth gas supply pipe 232i in the first gas supply pipe 232a. The first inert gas supply pipe 232e is provided with a mass flow controller 241e being a flow rate control unit (flow rate controller), and a valve 243e being an open/close valve sequentially from the upstream direction. Further, the aforementioned first nozzle 249a is connected to a tip end part of the first gas supply pipe 232a. The first nozzle 249a is provided in an arc-shaped space between an inner wall of the reaction tube 203 and the wafers 200 so as to rise toward an upper part of a lamination direction of the wafers 200 extending from a lower part to the upper part of the inner wall of the reaction tube 203. Namely, the first nozzle 249a is provided in a region horizontally surrounding a wafer arrangement region in a side part of the wafer arrangement region in which wafers 200 are arranged, along the wafer arrangement region. The first nozzle 249a is formed as an L-shaped long nozzle, with its horizontal portion provided so as to pass through a lower side wall of the reaction tube 203, and its vertical portion provided so as to rise toward the other end side from one end side of at least the wafer arrangement region. Gas supply holes 250a for supplying gas are provided on a side face of the first nozzle 249a. The gas supply holes 250a are opened to face a center of the reaction tube 203, so that a gas can be supplied toward the wafer 200.

The first gas supply system is mainly constituted of the first gas supply pipe 232a, the mass flow controller 241a, the valve 243a, and the first nozzle 249a. Further, the fifth gas supply system is mainly constituted of the fifth gas supply pipe 232i, the mass flow controller 241i, the valve 243i, and the first nozzle 249a. Further, the first inert gas supply system is mainly constituted of the first inert gas supply pipe 232e, the mass flow controller 241e, and the valve 243e.

The second gas supply pipe 232b is provide with the mass flow controller (MFC) 241b being the flow rate control unit (flow rate controller), and a valve 243b being the open/close valve, sequentially from the upstream direction. Further, a second inert gas supply pipe 232f is connected to the downstream side of the valve 243b of the second gas supply pipe 232b. The second inert gas supply pipe 232f is provided with a mass flow controller 241f being the flow rate control unit (flow rate controller), and a valve 243f being the open/close valve, sequentially from the upstream direction. Further, the aforementioned second nozzle 249b is connected to the tip end part of the second gas supply pipe 232b. The second nozzle 249b is provided in the arc-shaped space between the inner wall of the reaction tube 203 and the wafers 200 so as to rise toward the upper part of the lamination direction of the wafers 200, extending from the lower part to the upper part of the inner wall of the reaction tube 203. Namely, the second nozzle 249b is provided in the region horizontally surrounding the wafer arrangement region in the side part of the wafer arrangement region in which the wafers 200 are arranged, along the wafer arrangement region. The second nozzle 249b is formed as an L-shaped long nozzle, with its horizontal portion provided so as to pass through the lower side wall of the reaction tube 203, and its vertical portion provided so as to rise toward the other end side from one end side of at least the wafer arrangement region. Gas supply holes 250b for supplying gas are provided on the side face of the second nozzle 249b. The gas supply holes 250b are opened to face the center of the reaction tube 203, so that the gas can be supplied. A plurality of gas supply holes 250b are provided extending from the lower part to the upper part of the reaction tube 203, each of them having the same opening area, and provided at the same opening pitch.

The second gas supply system is mainly constituted of the second gas supply pipe 232b, the mass flow controller 241b, the valve 243b, and the second nozzle 249b. Further, the second inert gas supply system is mainly constituted of the second inert gas supply pipe 232f, the mass flow controller 241f, and the valve 243f.

The third gas supply pipe 232c is provided with a mass flow controller (MFC) 241C being the flow rate control unit (flow rate controller), and a valve 243c being the open/close valve, sequentially from the upstream direction. Further, a third inert gas supply pipe 232g is connected to the downstream side of the valve 243c of the third gas supply pipe 232c. The third inert gas supply pipe 232g is provided with a mass flow controller 241g being the flow rate control unit (flow rate controller), and a valve 243g being the open/close valve, sequentially from the upstream direction. Further, the third nozzle 249c is connected to the tip end part of the third gas supply pipe 232c. The third nozzle 249c is provided in an arc-shaped space between the inner wall of the reaction tube 203 and the wafers 200 so as to rise toward the upper part from the lower part of the inner wall of the reaction tube 203. Namely, the third nozzle 249c is provided in the region horizontally surrounding the wafer arrangement region in the side part of the wafer arrangement region in which the wafers 200 are arranged, along the wafer arrangement region. The first nozzle 249a is formed as the L-shaped long nozzle, with its horizontal portion provided so as to pass through the lower side wall of the reaction tube 203, and its vertical portion provided so as to rise toward the other end side from one end side of at least the wafer arrangement region. Gas supply holes 250c for supplying gas are provided on the side face of the third nozzle 249a. The gas supply holes 250a are opened to face the center of the reaction tube 203, so that the gas can be supplied toward the wafer 200. A plurality of gas supply holes 250c are provided extending from the lower part to the upper part of the reaction tube 203, each of them having the same opening area and provided at the same opening pitch.

The third gas supply system is mainly constituted of the first gas supply pipe 232c, the mass flow controller 241c, the valve 243c, and the third nozzle 249c. Further, the third inert gas supply system is mainly constituted of the third inert gas supply pipe 232g, the mass flow controller 241g, and the valve 243g.

The fourth gas supply pipe 232d is provide with the mass flow controller (MFC) 241d being the flow rate control unit (flow rate controller), and a valve 243d being the open/close valve, sequentially from the upstream direction. Further, a sixth gas supply pipe 232j is connected to the downstream side of the valve 243d of the fourth gas supply pipe 232d. The sixth gas supply pipe 232j is provided with a mass flow controller 241j being the flow rate control unit (flow rate controller), and a valve 243j being the open/close valve sequentially from the upstream direction. Further, a fourth inert gas supply pipe 232h is connected to the downstream side of the connection part to the sixth gas supply pipe 232j in the fourth gas supply pipe 232d. The fourth inert gas supply pipe 232h is provided with a mass flow controller 241h being the flow rate control unit (flow rate controller), and a valve 243h being the open/close valve sequentially from the upstream direction. Further, the fourth nozzle 249d is connected to the tip end part of the fourth gas supply pipe 232d. The fourth nozzle 249d is provided in a buffer chamber 237 being a gas dispersion space.

The buffer chamber 237 is provided along a lamination direction of the wafers 200 extending from the lower part to the upper part of the inner wall of the reaction tube 203 in the arc-shaped space between the inner wall of the reaction tube 203 and the wafers 200. Namely, the buffer chamber 237 is provided in the region horizontally surrounding the wafer arrangement region in the side part of the wafer arrangement region in which the wafers 200 are arranged, along the wafer arrangement region. Gas supply holes 250e for supplying gas, are formed on the end portion of the wall adjacent to the wafer 200 of the buffer chamber 237. The gas supply holes 250e are opened to face the center of the reaction tube 203, so that the gas can be supplied toward the wafer 200. A plurality of gas supply holes 240e are provided extending from the lower part to the upper part of the reaction tube 203, each of them having the same opening area and provided at the same opening pitch.

The fourth nozzle 249d is provided on the end portion of an opposite side to the end portion where the gas supply holes 250e of the buffer chamber 237 are provided, along the lower part to the upper part of the inner wall of the reaction tube 203, so as to rise toward the upper part in the lamination direction of the wafers 200. Namely, the fourth nozzle 249d is provided in the region horizontally surrounding the wafer arrangement region in the side part of the wafer arrangement region in which the wafers 200 are arranged, along the wafer arrangement region. The fourth nozzle 249d is formed as the L-shaped long nozzle, with its horizontal portion provided so as to pass through the lower side wall of the reaction tube 203, and its vertical portion provided so as to rise toward the other end side from one end side of at least the wafer arrangement region. Gas supply holes 250d for supplying gas are provided on the side face of the fourth nozzles 249d. The gas supply holes 250d are opened to face the center of the buffer chamber 237. Similarly to the gas supply holes 250e of the buffer chamber 237, a plurality of gas supply holes 250d are provided extending from the lower part to the upper part of the reaction tube 203. Each opening area of the plurality of gas supply holes 250d may be set to the same opening area and the same opening pitch from the upstream side (lower part) to the downstream side (upper part), when a differential pressure between the buffer chamber 237 and the processing chamber 201 is small. However, when the differential pressure is large, the opening area may be set to be large and the opening pitch may set to be small from the upstream side to the downstream side.

In this embodiment, each opening area and opening pitch of each gas supply hole 250d of the fourth nozzle 249d is adjusted as described above from the downstream side to the upstream side, to thereby eject approximately the same flow rate of gas from each gas supply hole 250d, although there is a difference in flow velocity. Then, the gas ejected from each gas supply hole 250d is introduced to the inside of the buffer chamber 237 once, so that a difference in the flow velocity of the gas is equalized in the buffer chamber 237.

Namely, the gas ejected into the buffer chamber 237 from each of the gas supply holes 250d of the fourth nozzle 249d, is ejected into the processing chamber 201 from the gas supply holes 250e of the buffer chamber 237, after a particle velocity of each gas is relaxed in the buffer chamber 237. Thus, the gas ejected into the buffer chamber 237 from each of the gas supply holes 250d of the fourth nozzle 249d, becomes the gas having uniform flow rate and flow velocity, when it is jet into the processing chamber 201 from each of the gas supply holes 250e of the buffer chamber 237.

A fourth gas supply system is mainly constituted of a mass flow controller 241d, a valve 243d, a fourth nozzle 249d, and a buffer chamber 237. Further, a sixth gas supply system is mainly constituted of a sixth gas supply pipe 232j, a mass flow controller 241j, a valve 243j, a fourth nozzle 249d, and a buffer chamber 237. Further, a fourth inert gas supply system is mainly constituted of a fourth inert gas supply pipe 232h, a mass flow controller 241h, and a valve 243h.

Thus, the method of supplying the gas in this embodiment includes: transferring the gas through the nozzles 249a, 249b, 249c, and 249d provided in the arc-shaped vertically long space defied by the inner wall of the reaction tube 203 and the end portion of the laminated plurality of wafers 200 and through the buffer chamber 237; ejecting the gas into the reaction tube 203 for the first time in the vicinity of the wafer 200 from the gas supply holes 250a, 250b, 250c, 250d, and 250e opened respectively on the nozzles 240a, 249b, 249c, 249d and the buffer chamber 237, wherein the main flow of the gas in the reaction tube 203 is set in parallel to the surface of the wafer 200, namely horizontally to the surface of the wafer 200. With this structure, there is an effect of uniformly supplying the gas to each wafer 200, so that the film thickness of the thin film formed on each wafer 200 can be equalized. Residual gas after reaction flows toward the exhaust port, namely, the exhaust pipe 231 described later. A flowing direction of this residual gas is suitably selected by the position of an exhaust port, and is not limited to a vertical direction.

For example, chlorosilane-based source gas being a first source gas containing at least silicon (Si) element and a chloro-group is supplied into the processing chamber 201 from the first gas supply pipe 232a, through the mass flow controller 241a, the valve 243a, and the first nozzle 249a, as a first source containing the specific element and the halogen-group. Here, the chlorosilane-based source gas means the gas obtained by vaporizing the chlorosilane-based source in a liquid state under normal temperature and pressure. Further, the chlorosilane-based source means a silane-based source having the chloro-group, which is the source containing at least silicon (Si) and chlorine (Cl). The term of the "source" is used in this specification in the following cases, meaning a "liquid source in a liquid state", meaning a "source gas obtained by vaporizing the liquid source", or meaning both cases thereof. Accordingly, the term of the "chlorosilane-based source" is used in this specification in the following cases: meaning the "chlorosilane-based source in the liquid state", meaning the "chlorosilane-based source gas", or meaning both cases thereof. Hexachlorodisilane ($Si_2Cl_6$, abbreviated as HCDS) can be used for example as the chlorosilane-based source gas. Note that when a liquid source is used, which is in a liquid state under normal temperature and pressure like HCDS, the liquid source is vaporized by a vaporization system such as a vaporizer and a bubbler, which is then supplied as the source gas.

The aminosilane-based source gas, being a second source gas containing at least a silicon (Si) element and an amino-group, is supplied into the processing chamber 201 for example as a second source containing the specific element and the amino-group (amine-group), from the second gas supply pipe 232b, through the mass flow controller 241b, the valve 243b, and the second nozzle 249b. Here, the aminosilane-based source gas is the gas obtained by vaporizing the aminosilane-based source in the liquid state under normal temperature and pressure. Further, the aminosilane-based source is a silane source (which is also the silane-based source containing an alkyl-group such as a methyl-group and a butyl-group) having amino-groups, which is a source containing at least silicon (Si), nitrogen (N), and carbon (C). The term of the "aminosilane-based source" is used in the following cases in this specification, meaning the "aminosilane-based source in the liquid state", and meaning the "aminosilane-based source gas", or meaning the both cases thereof. Tris(dimethylamino)silane ($Si[N(CH_3)_2]_3H$, abbreviated as 3DMAS) gas can be used as the aminosilane-based source gas. When the liquid source in the liquid state at a normal temperature under a normal pressure like 3DMAS is used, the liquid source is vaporized by the vaporization system such as a vaporizer and bubbler, which is then supplied as the source gas (3DMAS gas).

Boron (B), namely gas containing boron (boron-containing gas) is supplied into the processing chamber 201 through the mass flow controller 241c, the valve 243c, and the third nozzle 249c. Boron trichloride ($BCl_3$) gas can be used for example, as the boron-containing gas.

Gas containing nitrogen (N) (nitrogen-containing gas), namely, a nitrogen gas for example, is supplied into the processing chamber 201 through the mass flow controller 241d, the valve 243d, the fourth nozzle 249d, and the buffer chamber 237 from the fourth gas supply pipe 232d. Ammonia ($NH_3$) gas for example, can be used as the nitrogen-containing gas.

For example, gas containing carbon (C) (carbon-containing gas) is supplied into the processing chamber 201 from the fifth gas supply pipe 232i through the mass flow controller 241i, the valve 243i, the first gas supply pipe 232a, and the first nozzle 249a. For example, propylene ($C_3H_6$) gas can be used as the carbon-containing gas.

For example, gas containing oxygen (O) (oxygen-containing gas), namely, an oxidizing gas is supplied from the sixth gas supply pipe 232j into the processing chamber 201 through the buffer chamber 237. For example, oxygen ($O_2$) gas can be used as the oxygen-containing gas.

For example, nitrogen ($N_2$) gas is supplied into the processing chamber 201 from inert gas supply pipes 232e, 232f, 232g, 232h, through mass flow controllers 241e, 241f, 241g, 241h, valves 243e, 243f, 243g, 243h, gas supply pipes 232a, 232b, 232c, 232d, gas nozzles 249a, 249b, 249c, 249d, and buffer chamber 237.

Note that when the aforementioned gases are flowed from each gas supply pipe for example, a first source supply system for supplying a first source containing the specific element and the halogen-group, namely, a chlorosilane-based source gas supply system as the first source gas supply system (a first silicon source gas supply system) is formed by the first gas supply system. Further, a second source supply system for supplying a second source containing the specific element and the amino-group, namely, a second source gas supply system (a second silicon source gas supply system), namely an aminosilane-based source gas supply system is formed by the second gas supply system. Further, a boron-containing gas supply system is formed by the third gas supply system. In addition, a nitrogen-containing gas supply system, namely, a nitride gas supply system is formed by the fourth gas supply system. Moreover, a carbon-containing gas supply system is formed by the fifth gas supply system. Further, an oxygen-containing gas supply system, namely, an oxidizing gas supply system is formed by the sixth gas supply system.

When the chlorosilane-based source gas and the aminosilane-based source gas are collectively called a source gas, a source gas supply system is formed by the chlorosilane-based source gas supply system and the aminosilane-based source gas supply system. Note that the chlorosilane-based source gas supply system, the aminosilane-based source gas supply system, and the source gas supply system, are respectively simply called the chlorosilne source supply system, the aminosilane-based source supply system, and the source supply system. Further, when the boron-containing gas, the nitrogen-containing gas, the carbon-containing gas, and the oxygen-containing gas are collectively called a reactive gas, a reactive gas supply system is formed by the boron-containing gas supply system, the nitrogen-containing gas supply system, the carbon-containing gas supply system, and the oxygen-containing gas supply system.

As shown in FIG. 2, a first rod electrode 269 being a first electrode, and a second rod electrode 270 being a second electrode having a long and thin structure respectively, are disposed along the lamination direction of the wafers 200 extending from the lower part to the upper part. Each of the first rod electrode 269 and the second rod electrode 270 is provided in parallel to the fourth nozzle 249d. Each of the first rod electrode 269 and the second rod electrode 270 is protected by being covered with an electrode protective tube 275 being a protective tube for protecting each electrode, extending from the upper part to the lower part. Either the first rod electrode 269 or the second rod electrode 270 is connected to a high frequency power source 273 through a matching box 272, and the other one is connected to earth being a reference electric potential. As a result, plasma is generated in a plasma generation area 224 between the first rod electrode 269 and the second rod electrode 270 by applying high frequency power between a first rod electrode 269 and a second rod electrode 270 from the high frequency power source 273. A plasma source is formed as a plasma generation unit (plasma generator), mainly constituted of the first rod electrode 269, the second rod electrode 270, and the electrode protective tube 275. The matching box 272 and the high frequency power source 273 may be included in the plasma source. Note that as will be described later, the plasma source functions as an activation mechanism for activating the gas by plasma.

The electrode protective tube 275 is configured to insert each of the first rod electrode 269 and the second rod electrode 270 into the buffer chamber 237 in a state of being isolated from atmosphere of the buffer chamber 237. Here, when an oxygen concentration inside of the electrode protective tube 275 is almost the same as an oxygen concentration of outer air (atmosphere), the first rod electrode 269 and the second rod electrode 270 inserted into the electrode protective tube 275 respectively, are oxidized by heat of the heater 207. Therefore, by filling the inside of the electrode protective tube 275 with the inert gas such as nitrogen gas or purging the inside of the electrode protective tube 275 with the inert gas such as the nitrogen gas using an inert gas purge mechanism, the oxygen concentration inside of the electrode protective tube 275 is reduced, to thereby prevent oxidation of the first rod electrode 269 or the second rod electrode 270.

An exhaust pipe 231 for exhausting the atmosphere in the processing chamber 201, is provided in the reaction tube 203. A vacuum pump 246 being a vacuum exhaust device is connected to the exhaust pipe 231 through a pressure sensor 245 being a pressure detection unit (pressure detector) for detecting a pressure in the processing chamber 201 and an APC (Auto Pressure Controller) valve 244 being a pressure adjustment unit (pressure adjuster). Note that the APC valve 244 is a valve capable of performing vacuum-exhaust/stop of vacuum-exhaust of the inside of the processing chamber 201 by opening/closing a valve while operating the vacuum pump 246, and capable of adjusting the pressure in the processing chamber 201 by adjusting a degree of the valve while operating the vacuum pump 246. The exhaust system is mainly constituted of the exhaust pipe 231, the APC valve 244, and the pressure sensor 245. The vacuum pump 246 may be included in the exhaust system. The exhaust system is configured to perform vacuum-exhaust the inside of the processing chamber 201 so as to be a specific pressure (vacuum degree), by adjusting the opening degree of the valve of the APC valve based on pressure information detected by the pressure sensor 245, while operating the vacuum pump 246.

A seal cap 219 being a furnace throat lid member capable of air-tightly closing a lower end opening of the reaction tube 203, is provided in a lower part of the reaction tube 203. The seal cap 219 is configured to be abutted on a lower end of the reaction tube 203 from a vertically lower side. The seal cap 219 is made of metal such as stainless, and is formed into a disc shape. An O-ring 220 being a seal member abutted on the lower end of the reaction tube 203, is provided on an upper surface of the seal cap 219. A rotation mechanism 267 for rotating a boat is installed on an opposite side to the processing chamber 201 of the seal cap 219. A rotary shaft 255 of the rotation mechanism 267 is configured to pass through the seal cap 219 so as to be connected to a boat 217 as a substrate holding tool as will be described later. A rotation mechanism 267 is configured to rotate the wafer 200 by rotating the boat 217. The seal cap 219 is configured to be vertically elevated by a boat elevator 115 being an elevation mechanism vertically installed outside of the reaction tube 203. The boat elevator 115 is capable of loading and unloading the boat 217 into/from the processing chamber 201 by elevating/descending the seal cap 219, and is configured so that the boat 217, namely, the wafer 200 can be loaded and unloaded into/from the processing chamber 201.

The boat 217 being a substrate supporting tool is made of a heat resistant material such as quartz or silicon carbide, and is configured to support a plurality of wafers 200 in a horizontal posture, arranged with centers thereof aligned with each other in multiple stages. Note that a heat resistant member 218 made of a heat resistant material such as quartz and silicon carbide is provided in a lower part of the boat 217, so that heat from the heater 207 is hardly transmitted to the seal cap 219 side. Note that the heat resistant member 218 may be constituted of a plurality of heat insulating plates made of the heat resistant material such as quartz and silicon carbide, and a heat insulation plate holder for supporting them in a horizontal posture in multiple stages.

A temperature sensor 263 being a temperature detection unit is installed in the reaction tube 203, so that a temperature inside of the processing chamber 201 has a desired temperature distribution by adjusting a power supply condition to the heater 207 based on temperature information detected by the temperature sensor 263. The temperature sensor 263 is formed into the L-shape similarly to the nozzles 249*a*, 249*b*, 249*c*, and 249*d*, and is provided along an inner wall of the reaction tube 203.

Figure 22:
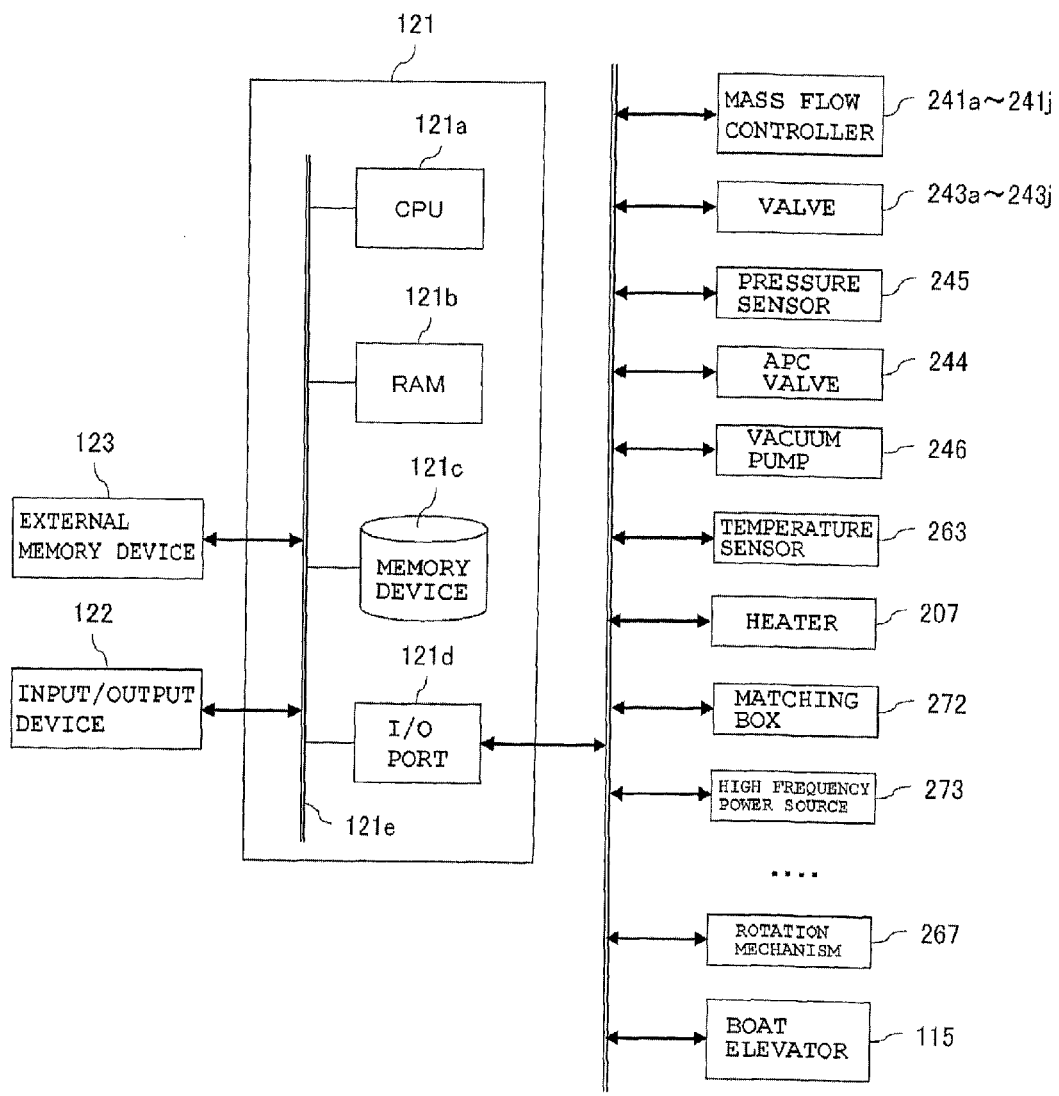
FIG. 22 is a schematic block diagram of a controller of a substrate processing apparatus suitably used in this embodiment.

As shown in FIG. 22, a controller 121 being a control part (control unit) is configured as a computer including CPU (Central Processing Unit) 121*a*, RAM (Random Access Memory) 121*b*, a memory device 121*c*, and an I/O port 121*d*. The RAM 121B, the memory device 121*c*, and the I/O port 121*d* are configured to exchange data with the CPU 121*a* via an internal bus 121*e*. An input/output device 122 configured as a touch panel, etc., for example, is connected to the controller 121.

The memory device 121*c* is configured by a flash memory and HDD (Hard Disk Drive), etc., for example. A control program for controlling an operation of the substrate processing apparatus, and a process recipe, etc., in which a procedure or a condition of substrate processing described later, are readably stored in the memory device 121*c*. The process recipe is a combination of recipes so that each procedure in the substrate processing step described later is executed by the controller 121, and a prescribed result can be obtained, and functions as a program. The program recipe and the control program, etc., are generally and simply called the program hereafter. The term of the program is used in the following cases in this specification, meaning the process recipe alone, meaning the control program alone, or meaning the both cases thereof. Further, the RAM 121*b* is configured as a memory area (work area) in which the program or data, etc., read by the CPU 121*a* is temporarily stored.

The I/O port 121*d* is connected to mass flow controllers 241*a*, 241*b*, 241*c*, 241*d*, 241*e*, 241*f*, 241*g*, 241*h*, 241*i*, 241*j*, valves 243*a*, 243*b*, 243*c*, 243*d*, 243*e*, 243*f*, 243*g*, 243*h*, 243*i*, 243*j*, the pressure sensor 245, the APC valve 244, the vacuum pump 246, the heater 207, the temperature sensor 263, the rotation mechanism 267, the boat elevator 115, the high frequency power source 273, and the matching box 272, etc.

The CPU 121*a* is configured to read and execute the control program from the memory device 121*c*, and read the process recipe from the memory device 121*c* according to an input, etc., of an operation command from the input/output device 122, and is configured to control a flow rate adjustment operation of each kind of gas by the mass flow controllers 241*a*, 241*b*, 241*c*, 241*d*, 241*e*, 241*f*, 241*g*, 241*h*, 241*i*, and 241*j*, a pressure adjustment operation by the APC valve 244 based on the open/close operation of valves 243*a*, 243*b*, 243*c*, 243*d*, 243e, 243f, 243g, 243h, 243i, and 243j, the open/close operation of the APC valve 244 and the pressure sensor 245, a temperature adjustment operation of the heater 207 based on the temperature sensor 263, start and stop of the vacuum pump 246, rotation and a rotation speed adjustment operation of the boat 217 by the rotation mechanism 267, control of an elevating operation, etc., of the boat elevator 115, power supply control of the high frequency power source 273, and an impedance control by the matching box 272.

The controller 121 is not limited to a case of being configured as a dedicated computer, but may be configured as a general-purpose computer. For example, the controller 121 of this embodiment can be configured by preparing an external memory device (for example, a magnetic tape, a magnetic disc such as a flexible disc or a hard disc, etc., an optical disc such as CD or DVD, etc., a magneto-optical disc such as MO, a semiconductor memory such as a USB memory or a memory card, etc.,) 123 in which the above-mentioned program is stored, and installing the program on the general-purpose computer using such an external memory device 123. Means for supplying the program to the computer is not limited to the case of supplying it through the external memory device 123. For example, the program may be supplied using a communication means such as Internet or a dedicated line not through the external memory device 123. The memory device 121c and the external memory device 123 are configured as a computer readable recording medium. They are generally and simply called a recording medium hereafter. The term of the recording medium is used in the following cases in this specification, meaning the memory device 121c alone, meaning the external memory device 123 alone, or meaning the both cases thereof.

Next, explanation will be given for a sequence example in which an insulating film is formed on a substrate, as one step of the manufacturing steps of a semiconductor device, using a processing furnace of the aforementioned substrate processing apparatus. Note that in the explanation given hereafter, the operation of each part constituting the substrate processing apparatus, is controlled by the controller 121.

Note that, in the embodiment of the present invention, the supply condition of a plurality of kinds of gases containing a plurality of elements constituting the film to be formed is controlled so that the composition ratio of the film to be formed is the stoichiometric composition, or is a prescribed composition ratio different from the stoichiometric composition. For example, the supply condition is controlled so that at least one element of the plurality of elements constituting the film to be formed, is excessive to the stoichiometric composition more than other element. Explanation will be given hereafter for the sequence example in which the film formation is performed while controlling the ratio of the plurality of elements constituting the film to be formed, namely the composition ratio of the film.

(First Sequence)

First, a first sequence of this embodiment will be described.

Figure 3A:
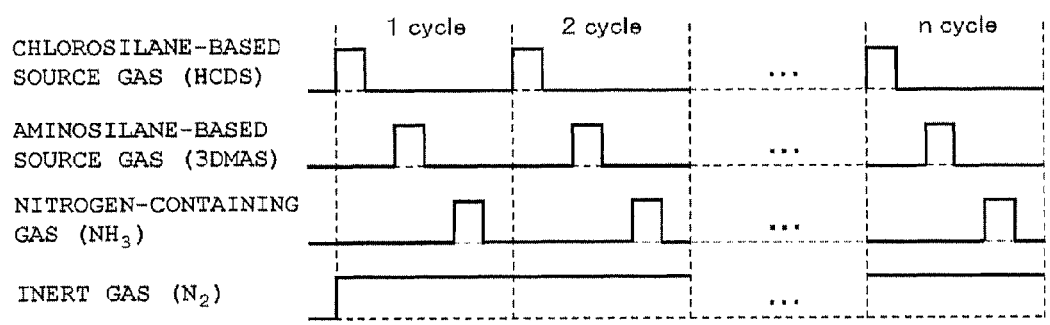
Figure 3B:
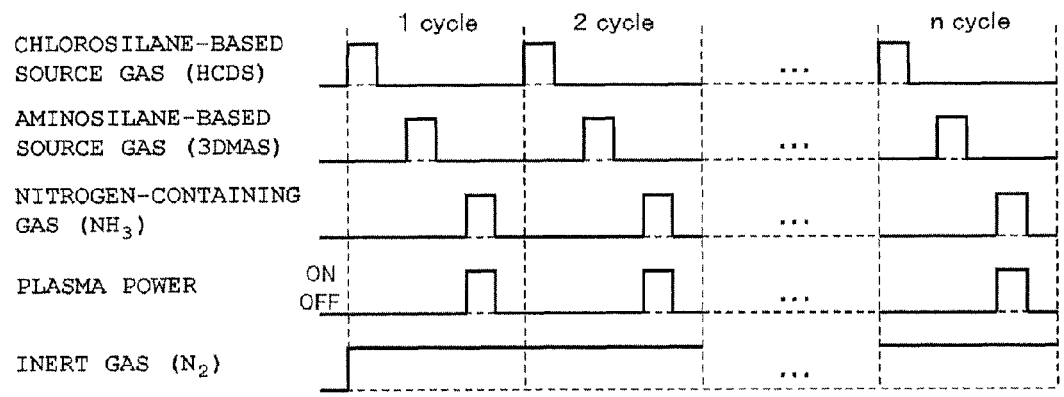
Figure 3C:
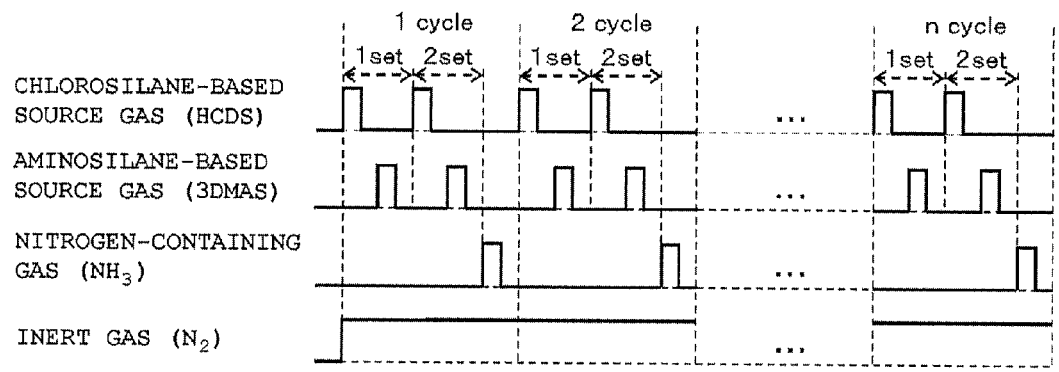
Figure 3D:
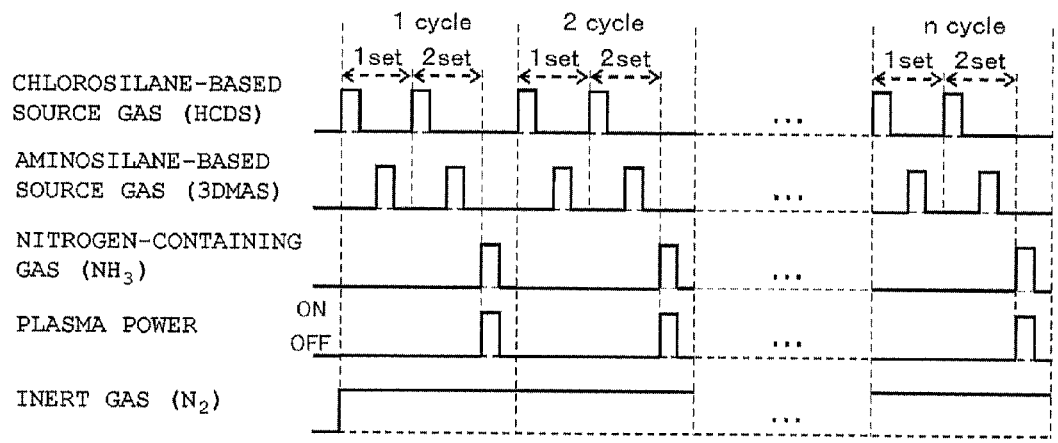

FIGS. 3A-3D are views showing a timing of gas supply and plasma power supply in the first sequence of this embodiment, wherein FIG. 3A shows the sequence example in which film formation is performed by non-plasma (without using plasma), FIG. 3B shows the sequence example in which film formation is performed using plasma, FIG. 3C shows a modified example of the sequence shown in FIG. 3A, and FIG. 3D shows a modified example of the sequence shown in FIG. 3B.

In the first sequence of this embodiment, a silicon carbonitride film or a silicon nitride film having a prescribed composition and a prescribed film thickness, is formed on the wafer 200 by alternately performing the following steps prescribed number of times:

supplying the chlorosilane-based source to the wafer 200 in the processing chamber 201 and thereafter supplying the aminosilane-based source thereto, to form a first layer containing silicon, nitrogen, and carbon on the wafer 200; and supplying thermally activated or plasma activated nitrogen-containing gas thereto as the reactive gas, to modify the first layer and form a silicon carbonitride layer or form a silicon nitride layer as the second layer.

The first sequence of this embodiment will be specifically described hereafter. Here, explanation will be given for an example of forming the silicon carbonitride film (SiCN film) or the silicon nitride film (SiN film) on the substrate as the insulation film by the sequence of FIGS. 3A-3D, using HCDS gas as the chlorosilane-based source gas, and 3DMAS gas as the aminosilane-based source gas, and $NH_3$ gas as the nitrogen-containing gas.

The term of the "wafer" is used in the following cases in this specification: meaning the "wafer itself", meaning "a lamination body (assembly) of the wafer and a specific layer or a film, etc., formed on its surface (namely, in the case of being called the wafer including the specific layer or the film, etc., formed on the surface). Also, the term of the "surface of the wafer" is used in the following cases in this specification: meaning the "surface (exposed surface) of the wafer itself" or meaning the "surface of the specific layer or the film, etc., formed on the wafer, namely, an outermost surface of the wafer as the lamination body".

Accordingly, the description that "a specific gas is supplied to the wafer", is used in the following cases in this specification, meaning the case that "the specific gas is directly supplied to the surface (exposed surface) of the wafer itself", or meaning the case that "the specific gas is supplied to the layer or the film, etc., formed on the wafer, namely, to the outermost surface of the wafer as the lamination body". Also, the description that "the specific layer (or film) is formed on the wafer" is used in the following cases in this specification, meaning the case that "the specific layer (or film) is directly formed on the surface (exposed surface) of the wafer itself" or meaning the case that "the specific layer (or film) is formed on the outermost surface of the wafer as the lamination body".

The term of the "substrate" is also used in the same cases as the cases of using the term of the "wafer" in this specification, and in this case, the "wafer" may be replaced with the "substrate" in the above explanation.

When a plurality of wafers 200 are charged into the boat 217 (wafer charge), as shown in FIG. 1, the boat 217 supporting the plurality of wafers 200, is lifted by the boat elevator 115, and is loaded into the processing chamber 201 (boat load). In this state, the seal cap 219 is set in a state of sealing the lower end of the reaction tube 203 through the O-ring 220.

The inside of the processing chamber 201 is vacuum-exhausted by the vacuum pump 246 so that the inside of the processing chamber 201 is set in a desired pressure (vacuum degree). At this time, the pressure in the processing chamber 201 is measured by the pressure sensor 245, and based on the measured pressure information, the APC valve 244 is feedback-controlled (pressure adjustment). The vacuum pump 246 is maintained to be always operated at least until completion of the processing to the wafer 200. Further, the inside of the processing chamber 201 is heated by the heater 207 so as to be a desired temperature. At this time, the power supply condition to the heater 207 is feedback-controlled based on the temperature information detected by the temperature sensor 263 (temperature adjustment). Heating of the inside of the processing chamber 201 by the heater 207 is continuously performed at least until completion of the processing to the wafer 200. Subsequently, the boat 217 and the wafer 200 are rotated by the rotation mechanism 267 (wafer rotation). The rotation of the boat 217 and the wafer 200 by the rotation mechanism 267 is continuously performed at least until completion of the processing to the wafer 200. Thereafter, three steps as will be described later are sequentially executed.

[Step 1]

The valve 243a of the first gas supply pipe 232a is opened, to flow the HCDS gas through the first gas supply pipe 232a. The flow rate of the HCDS gas flowed through the first gas supply pipe 232a is adjusted by the mass flow controller 241a. The HCDS gas with the flow rate adjusted, is supplied into the processing chamber 201 from the gas supply holes 250a of the first nozzle 249a, and is exhausted from the exhaust pipe 231. At this time, the HCDS gas is supplied to the wafer 200. The valve 243e is simultaneously opened at this time, to flow the inert gas such as $N_2$ gas through the inert gas supply pipe 232e. The flow rate of the $N_2$ gas flowed through the inert gas supply pipe 232e is adjusted by the mass flow controller 241e. The $N_2$ gas with the flow rate adjusted, is supplied into the processing chamber 201 together with the HCDS gas, and is exhausted from the exhaust pipe 231.

At this time, in order to prevent the invasion of the HCDS gas into the second nozzle 249b, the third nozzle 249c, the fourth nozzle 249d, and the buffer chamber 237, the valves 243f, 243g, and 243h are opened, to thereby flow $N_2$ gas into the second inert gas supply pipe 232f, the third inert gas supply pipe 232g, and the fourth inert gas supply pipe 232h. The $N_2$ gas is supplied into the processing chamber 201 through the second gas supply pipe 232b, the third gas supply pipe 232c, the fourth gas supply pipe 232d, the second nozzle 249b, the third nozzle 249c, the fourth nozzle 249d, and the buffer chamber 237, and is exhausted from the exhaust pipe 231.

At this time, the pressure in the processing chamber 201 is set in a range of 1 to 13300 Pa for example, and preferably in a rage of 20 to 1330 Pa, by properly adjusting the APC valve 244. The supply flow rate of the HCDS gas controlled by the mass flow controller 241a is set in a range of 1 to 1000 sccm for example. The supply flow rate of the $N_2$ gas controlled by the mass flow controllers 241e, 241g, and 241h is set in a range of 100 to 10000 sccm respectively for example. The time required for exposing the HCDS gas to the wafer 200, namely the gas supply time (irradiation time) is set in a range of 1 to 120 seconds for example, and preferably set in a range of 1 to 60 seconds. The temperature of the heater 207 at this time, is set so that the temperature of the wafer 200 is in a range of 250 to 700° C. and preferably in a range of 350 to 650° C. for example, and more preferably in a range of 350 to 600° C. Note that when the temperature of the wafer 200 is set to less than 250° C., HCDS is hardly chemically adsorbed on the wafer 200, and a practical film formation speed cannot be obtained in some cases. This can be solved by setting the temperature of the wafer 200 to 250° C. or more. Note that HCDS can be sufficiently adsorbed on the wafer 200 by setting the temperature of the wafer 200 to 350° C. or more, and further sufficient film formation speed can be obtained. Further, when the temperature of the wafer 200 exceeds 700° C., CVD reaction is strongly exhibited (vapor phase reaction is dominant), to thereby easily deteriorate the uniformity of the film thickness, thus making it difficult to control the film thickness. The deterioration of the uniformity in the film thickness can be suppressed by setting the temperature of the wafer in a range of 200 to 700° C. or less, thus making it easy to control the film thickness. Particularly, surface reaction is dominant by setting the temperature of the wafer 200 to 650° C. or less, and further 600° C. or less, thus making it easy to secure the uniformity in the film thickness, thus making it easy to control the film thickness. Therefore, the temperature of the wafer 200 is preferably set in a range of 250 to 700° C., preferably in a range of 350 to 650° C., and more preferably in a range of 350 to 600° C.

The silicon-containing layer having a thickness of about less than 1 atomic layer to several atomic layers, is formed on a ground film on the surface of the wafer 200 by supplying the HCDS gas into the processing chamber 201 under the above-mentioned condition. The silicon-containing layer may be an adsorption layer of HCDS gas, or may be a silicon layer (Si layer), or may include both of them. However, the silicon-containing layer is preferably the layer containing silicon (Si) and chlorine (Cl).

Here, the silicon layer is a general term including not only a continuous layer made of silicon (Si), but also a discontinuous layer or a thin film formed by overlap of them. Note that the discontinuous layer made of Si is sometimes called a silicon thin film. Si constituting the silicon layer also includes the one not completely cut-off from the bond of Si and Cl.

Further, the adsorption layer of the HCDS gas includes not only a continuous chemical adsorption layer of gas molecules of the HCDS gas, but also a discontinuous chemical adsorption layer. Namely, the adsorption layer of the HCDS gas includes the chemical adsorption layer having a thickness of one molecular layer of less than one molecular layer constituted of the HCDS molecules. HCDS ($Si_2Cl_6$) molecules constituting the adsorption layer of the HCDS gas include the one a part of which is cut off from the bond of Si and Cl ($Si_xCl_y$ molecule). Namely, the adsorption layer of HCDS includes a continuous chemical adsorption layer or a discontinuous chemical adsorption layer of the $Si_2Cl_6$ molecule and/or the $Si_xCl_y$ molecule. Note that the layer having the thickness of less than one atomic layer means the atomic layer formed discontinuously, and the layer having the thickness of one atomic layer means the atomic layer formed continuously. Also, the layer having the thickness of less than one molecular layer means the molecular layer formed discontinuously, and the layer having the thickness of one molecular layer means the molecular layer formed continuously.

A silicon layer is formed by deposition of Si on the wafer 200, under a condition of self-decomposition (thermal decomposition) of the HCDS gas, namely under a condition that a thermal decomposition reaction of HCDS occurs. The adsorption layer of the HCDS gas is formed by adsorption of the HCDS gas on the wafer 200 under a condition that the HCDS gas is not self-decomposed (thermally decomposed), namely, under a condition that the thermal decomposition reaction of the HCDS does not occur. It is more preferably to form the silicon layer on the wafer 200, than forming the adsorption layer of the HCDS gas on the wafer 200, because a film formation rate can be increased.

When the thickness of the silicon-containing layer formed on the wafer 200 exceeds several atomic layers, nitriding (modifying) action in step 3 as will be described later does not reach an entire body of the silicon-containing layer. Further, a minimum value of the thickness of the silicon-containing layer that can be formed on the wafer 200 is less than 1 atomic layer. Therefore, the thickness of the silicon-containing layer is preferably set to less than 1 atomic layer to several atomic layers. By setting the thickness of the silicon-containing layer to one atomic layer or less, namely, one atomic layer or less than one atomic layer, the action of a nitriding reaction (modifying reaction) in step 3 described later can be relatively increased, and the time required for the modifying reaction in step 3 can be shortened. The time required for forming the silicon-containing layer in step 1 can also be shortened. As a result, the processing time in total can also be shortened. Namely, the film formation rate can be increased. Further, by setting the thickness of the silicon-containing layer to one atomic layer or less, controllability of the uniformity in the film thickness can be increased.

After the silicon-containing layer is formed on the wafer 200, the valve 243a of the first gas supply pipe 232a is closed, to stop the supply of the HCDS gas. At this time, the inside of the processing chamber 201 is vacuum-exhausted by the vacuum pump 246, with the APC valve 244 of the exhaust pipe 231 opened, to thereby remove the HCDS gas from the processing chamber 201, which is the HCDS gas unreacted or after contributing to the formation of the silicon-containing layer remained in the processing chamber 201. Further, supply of the $N_2$ gas as the inert gas into the processing chamber 201 is maintained, with the valves 243e, 243f, 243g, and 243h opened. The $N_2$ gas actions as the purge gas, and thus, an effect of removing the HCDS gas from the processing chamber 201 is increased, which is the HCDS gas unreacted or after contributing to the formation of the silicon-containing layer remained in the processing chamber 201.

At this time, the gas remained in the processing chamber 201 is not required to be completely removed, and the inside of the processing chamber 201 is not required to be completely purged. Even if a slight amount of the gas is remained in the processing chamber, no adverse influence is generated in step 2 performed thereafter. At this time, the flow rate of the $N_2$ gas supplied into the processing chamber 201 is not required to be large, and for example, by supplying almost the same amount of the $N_2$ gas as the volume of the reaction tube 203 (processing chamber 201), purging can be performed so that no adverse influence is generated in step 2 performed thereafter. Thus, by not completely purging the inside of the processing chamber 201, a purging time can be shortened, and the throughput can be improved. Further, consumption of the $N_2$ gas can be suppressed to necessary minimum.

Not only the HCDS gas, but also an inorganic source such as tetrachlorosilane, namely silicontetrachloride ($SiCl_4$, abbreviated as STC) gas trichlorosilane ($SiHCl_3$, abbreviated as TCS) gas, dichlorosilane ($SiH_2Cl$, abbreviated as DCS) gas, monochlorosilane ($SiH_3Cl$, abbreviated as MCS) gas, etc., may be used as the chlorosilne source gas. Not only $N_2$ gas, but also rare gas such as Ar gas, He gas, Ne gas, and Xe gas, may be used as the inert gas.

[Step 2]

After residual gas in the processing chamber 201 in the end of step 1, the valve 243b of the second gas supply pipe 232b is opened, to flow 3DMAS gas into the second gas supply pipe 232b. The flow rate of the 3DMAS gas flowed into the second gas supply pipe 232b is adjusted by the mass flow controller 241b. The 3DMAS gas with the flow rate adjusted, is supplied into the processing chamber 201 from the gas supply holes 250b of the second nozzle 249b, and is exhausted from the exhaust pipe 231. At this time, the 3DMAS gas is supplied to the wafer 200. The valve 243f is opened simultaneously at this time, to flow the $N_2$ gas into the inert gas supply pipe 232f. The $N_2$ gas is supplied into the processing chamber 201 together with the 3DMAS gas, and is exhausted from the exhaust pipe 231.

At this time, in order to prevent the invasion of the 3DMAS gas into the first nozzle 249a, the third nozzle 249c, the fourth nozzle 249d, and the buffer chamber 237, the valves 243e, 243g, and 243h are opened, to thereby flow the $N_2$ gas into the first inert gas supply pipe 232e, the third inert gas supply pipe 232g, and the fourth inert gas supply pipe 232h. The $N_2$ gas is supplied into processing chamber 201 through the first gas supply pipe 232a, the third gas supply pipe 232c, the fourth gas supply pipe 232d, the first nozzle 249a, the third nozzle 249c, the fourth nozzle 249d, and the buffer chamber 237, and is exhausted from the exhaust pipe 231.

At this time, the APC valve 244 is properly adjusted, and similarly to step 1, the pressure in the processing chamber 201 is set in a range of 1 to 13300 Pa for example, and preferably in a range of 20 to 1330 Pa. The supply flow rate of the 3DMAS gas controlled by the mass flow controller 241b is set in a range of 1 to 1000 sccm for example. The supply flow rate of the $N_2$ gas controlled by the mass flow controllers 241f, 241e, 241g, and 241h is set in a range of 100 to 10000 sccm respectively for example. The time required for supplying the 3DMAS gas to the wafer 200, namely the gas supply time (irradiation time) is set in a range of 1 to 120 seconds, and preferably in a range of 1 to 60 seconds. Similarly to step 1, the temperature of the heater 207 at this time, is set so that the temperature of the wafer 200 is set in a range of 250 to 700° C., and preferably set in a range of 350 to 650° C., and more preferably set in a range of 350 to 600° C.

The silicon-containing layer formed on the wafer 200 in step 1 and the 3DMAS gas, are reacted by supply of the 3DMAS gas. Thus, the silicon-containing layer is modified to the first layer containing silicon (Si), nitrogen (N), and carbon (C). The first layer becomes the layer containing Si, N, and C and having the thickness of about less than 1 atomic layer to several atomic layers. Note that the first layer is the layer with relatively large ratio of Si component and C component, which is namely the Si-rich and C-rich layer.

After the first layer is formed on the wafer 200, the valve 243b of the second gas supply pipe 232b is closed, to stop the supply of the 3DMAS gas. At this time, the inside of the processing chamber 201 is vacuum-exhausted by the vacuum pump 246, with the APC valve 244 of the exhaust pipe 231 closed, so that the 3DMAS gas unreacted or after contributing to the formation of the first layer remained in the processing chamber 201 is removed from the processing chamber 201. Further, the supply of the $N_2$ gas as the inert gas into the processing chamber 201 is maintained, with the valve 243f opened. The $N_2$ gas actions as the purge gas, and thus, the effect of removing the 3DMAS gas from the processing chamber 201 is increased, which is the 3DMAS gas unreacted or after contributing to the formation of the first layer remained in the processing chamber 201.

At this time, the gas remained in the processing chamber 201 is not required to be completely removed, and the inside of the processing chamber 201 is not required to be completely purged. Even if a slight amount of the gas is remained in the processing chamber, no adverse influence is generated in step 2 performed thereafter. At this time, the flow rate of the $N_2$ gas supplied into the processing chamber 201 is not required to be large, and for example, by supplying almost the same amount of the $N_2$ gas as the volume of the reaction tube 203 (processing chamber 201), purging can be performed so that no adverse influence is generated in step 2 performed thereafter. Thus, by not completely purging the inside of the processing chamber 201, a purging time can be shortened, and the throughput can be improved. Further, consumption of the $N_2$ gas can be suppressed to necessary minimum.

Not only the 3DMAS gas, but also an organic source such as tetrakis(dimethylamino)silane ($Si[N(CH_3)_2]_4$, abbreviated as 4DMAS) gas, bis(diethylamino)silane ($Si[N(C_2H_5)_2]_2H_2$, abbreviated as 2DEAS) gas, bis(tertiary butyl aminosilane) ($SiH_2[NH(C_4H_9)]_2$, abbreviated as BTBAS) gas, and hexamethyldisilazane ($(CH_3)_3Si$—NH—$Si(CH_3)_3$, abbreviated as HMDS) gas, etc., may be used as the aminosilane-based source gas. Not only the $N_2$ gas, but also the rare gas such as Ar gas, He gas, Ne gas, and Xe gas may be used as the inert gas.

[Step 3]

After removing the residual gas in the processing chamber 201 in the end of step 2, the valve 243d of the fourth gas supply pipe 232d is opened, to flow the $NH_3$ gas into the fourth gas supply pipe 232d. The flow rate of the $NH_3$ gas flowed into the fourth gas supply pipe 232d is adjusted by the mass flow controller 241d. The $NH_3$ gas with the flow rate adjusted, is supplied into the buffer chamber 237 from the gas supply holes 250d of the fourth nozzle 249d. At this time, the $NH_3$ gas supplied into the buffer chamber 237 is thermally activated by not applying high frequency power between the first rod electrode 269 and the second rod electrode 270, and is supplied into the processing chamber 201 from the gas supply holes 250e, and is exhausted from the exhaust pipe 231 (see FIG. 3A). Further, at this time, the $NH_3$ gas supplied into the buffer chamber 237 is plasma-excited by applying the high frequency power between the first rod electrodes 269 and the second rod electrodes 270 via the matching box 272 from the high frequency power source 273, and is supplied into the processing chamber 201 from the gas supply holes 250e as active species, and is exhausted from the exhaust pipe 231 (see FIG. 3B). At this time, the thermally or plasma activated $NH_3$ gas is supplied to the wafer 200. Simultaneously at this time, the valve 243h is opened simultaneously at this time, to flow the $N_2$ gas into the inert gas supply pipe 232h. The $N_2$ gas is supplied into the processing chamber 201 together with the $NH_3$ gas, and is exhausted from the exhaust pipe 231.

At this time, in order to prevent the invasion of the $NH_3$ gas into the first nozzle 249a, the second nozzle 249b, and the third nozzle 249c, the valves 243e, 243f, and 243g are opened, to thereby flow the $N_2$ gas into the first inert gas supply pipe 232e, the second inert gas supply pipe 232f, and the third inert gas supply pipe 232g. The $N_2$ gas is supplied into the processing chamber 201 through the first gas supply pipe 232a, the second gas supply pipe 232b, the third gas supply pipe 232c, the first nozzle 249a, the second nozzle 249b, and the third nozzle 249c, and is exhausted from the exhaust pipe 231.

When the $NH_3$ gas is activated by heat and flowed under no plasma-excitation, the APC valve 244 is properly adjusted, to set the pressure in the processing chamber 201 in a range of 1 to 3000 Pa for example. By setting the pressure in the processing chamber 201 in a relatively high pressure band, the $NH_3$ gas can be thermally activated by non-plasma. Note that a soft reaction can be caused by thermally activating the $NH_3$ gas and supplying the thermally activated $NH_3$ gas, thus making it possible to softly perform nitriding as will be described later. Further, when the $NH_3$ gas is flowed under plasma-excitation as the active species, the APC valve 244 is properly adjusted, to set the pressure in the processing chamber 201 in a range of 1 to 100 Pa for example. The supply flow rate of the $NH_3$ gas controlled by the mass flow controller 241d is set in a range of 100 to 10000 sccm for example. The supply flow rate of the $N_2$ gas controlled by the mass flow controllers 241h, 241e, 241f, and 241g is set in a range of 100 to 10000 sccm respectively for example. At this time, when the $NH_3$ gas is thermally activated and flowed, a partial pressure of the $NH_3$ gas in the processing chamber 201 is set in a range of 0.01 to 2970 Pa for example. Further, when the $NH_3$ gas is activated by plasma and flowed, the partial pressure of the $NH_3$ gas in the processing chamber 201 is set in a range of 0.01 to 99 Pa for example. The time required for supplying the thermally activated $NH_3$ gas, or the active species obtained by plasma-exiting the $NH_3$ gas, to the wafer 200, namely the gas supply time (irradiation time), is set to 1 to 120 seconds, and preferably set to 1 to 60 seconds for example. Similarly to steps 1 to 2, the temperature of the heater 207 at this time is set so that the temperature of the wafer is set in a range of 250 to 700° C., and is preferably in a range of 350 to 650° C., and more preferably set in a range of 350 to 600° C. When the $NH_3$ gas is plasma-excited, the high frequency power applied between the first rod electrode 269 and the second rod electrode 270 from the high frequency power source 273, is the power in a range of 50 to 1000 W for example.

The gas flowed through the processing chamber 201 at this time, is the $NH_3$ gas thermally activated by increasing the pressure in the processing chamber 201, or the active species obtained by plasma-exciting the $NH_3$ gas, and neither the HCDS gas nor the 3DMAS gas is flowed through the processing chamber 201. Accordingly, the activated $NH_3$ gas or the $NH_3$ gas turned into the active species, is reacted with at least a part of the first layer containing Si, N, and C formed on the wafer 200 in step 2, without causing the vapor phase reaction. Thus, the first layer is nitrided, and is modified to the second layer including the silicon carbonitride layer (SiCN layer), or the silicon nitride layer (SiN layer).

As shown in FIG. 3A, the first layer can be modified (changed) to the SiCN layer by thermally activating the $NH_3$ gas and flowing it into the processing chamber 201. At this time, the first layer is modified to the SiCN layer while increasing the ratio of the N-component in the first layer. Note that at this time, by a thermally nitriding action of the $NH_3$ gas, Si—N bond in the first layer is increased and meanwhile Si—C bond and Si—Si bond are reduced, thus reducing the ratio of C-component and the ratio of Si-component in the first layer. Namely, the first layer can be modified to the SiCN layer while varying the composition ratio in a direction of increasing the nitrogen concentration, and in a direction of reducing the carbon concentration and the silicon concentration. Further, the ratio of N-component in the SiCN layer, namely the nitrogen concentration can be finely adjusted by controlling processing conditions such as the pressure in the processing chamber 201 and the gas supply time.

Further, as shown in FIG. 3B, the first layer can be modified (changed) to the SiCN layer by plasma-nitriding the first layer by flowing the active species obtained by plasma-exciting the $NH_3$ gas. At this time, the first layer can be modified to the SiN layer by making the C-component in the first layer desorbed by energy of the active species, while increasing the ratio of the N-component in the first layer. Note that at this time, by plasma-nitriding action of the $NH_3$ gas, Si—C bond and Si—Si bond are reduced while Si—N bond in the first layer is increased, and the ratio of the C-component and the ratio of the Si-component in the first layer are reduced. Particularly, the C-component is reduced to an impurity level or substantially disappears by desorption of its major part. Namely, the first layer can be modified to the SiN layer while varying a composition ratio in a direction of increasing the nitrogen concentration or in a direction of reducing the carbon concentration and the silicon concentration. Further, at this time, the ratio of the N-component in the SiN layer, namely the nitrogen concentration can be finely adjusted by controlling the processing conditions such as the pressure in the processing chamber 201 and the gas supply time. Thus, the composition ratio of the SiN layer can be further strictly controlled.

Note that at this time, the nitriding reaction of the first layer is preferably not to be saturated. For example, when the first layer having the thickness of 1 atomic layer or less than 1 atomic layer is formed in steps 1, 2, a part of the first layer is preferably not to be nitrided. In this case, nitriding is performed under a condition that the nitriding reaction of the first layer is unsaturated so that an entire body of the first layer having the thickness of 1 atomic layer or less than 1 atomic layer is not nitrided.

Note that in order to set the nitriding reaction of the first layer in an unsaturated state, the aforementioned processing condition is used as the processing condition in step 3, and the nitriding reaction of the first layer is easily set in the unsaturated state by using the following processing condition as the processing condition in step 3.

[When the $NH_3$ Gas is Thermally Activated and Flowed . . . ]
  Wafer temperature: 500 to 650° C.
  Pressure in the processing chamber: 133 to 2666 Pa
  Partial pressure of the $NH_3$ gas: 33 to 2515 Pa
  $NH_3$ gas supply flow rate: 1000 to 5000 sccm
  $N_2$ gas supply flow rate: 300 to 3000 sccm
  $NH_3$ gas supply time: 6 to 60 seconds

[When the $NH_3$ Gas is Activated by Plasma and Flowed . . . ]
  Wafer temperature: 500 to 650° C.
  Pressure in the processing chamber: 33 to 80 Pa
  Partial pressure of the $NH_3$ gas: 8 to 75 Pa
  $NH_3$ gas supply flow rate: 1000 to 5000 sccm
  $N_2$ gas supply flow rate: 300 to 3000 sccm
  $NH_3$ gas supply time: 6 to 60 seconds After the second layer is formed on the wafer 200, the valve 243d of the fourth gas supply pipe 232d is closed, to stop the supply of the $NH_3$ gas. At this time, the inside of the processing chamber 201 is vacuum-exhausted by the vacuum pump 246, with the APC valve 244 of the exhaust pipe 231 opened, so that the $NH_3$ gas unreacted or after contributing to the formation of the second layer remained in the processing chamber 201 is removed from the processing chamber 201. Further, the supply of the $N_2$ gas into the processing chamber 201 is maintained, with the valves 243h, 243e, 243f, and 243g opened. The $N_2$ gas actions as the purge gas, and thus, the effect of removing the $NH_3$ gas from the processing chamber 201 is increased, which is the $NH_3$ gas unreacted or after contributing to the formation of the second layer remained in the processing chamber 201.

At this time, the gas remained in the processing chamber 201 is not required to be completely removed, and the inside of the processing chamber 201 is not required to be completely purged. Even if a slight amount of the gas is remained in the processing chamber, no adverse influence is generated in step 2. At this time, the flow rate of the $N_2$ gas supplied into the processing chamber 201 is not required to be large, and for example, by supplying almost the same amount of the $N_2$ gas as the volume of the reaction tube 203 (processing chamber 201), purging can be performed so that no adverse influence is generated in step 2 performed thereafter. Thus, by not completely purging the inside of the processing chamber 201, a purging time can be shortened, and the throughput can be improved. Further, consumption of the $N_2$ gas can be suppressed to necessary minimum.

Gas obtained by burning and plasma-exciting diazene ($N_2H_2$) gas, hydrazine ($N_2H_4$) gas, and $N_3H_8$ gas, etc., may be used, or the gas obtained by diluting these gases with rare gas such as Ar gas, He gas, Ne gas, and Xe gas, which is then thermally or plasma excited, may be used other than the gas obtained by thermally exciting or plasma-exciting the $NH_3$ gas, or amine-based gas such as ethylamine and methylamine.

The aforementioned steps 1 to 3 are set as one cycle, and by performing this cycle one or more number of times (called prescribe number of times hereafter), a silicon carbonitride film (SiCN film) or a silicon nitride film (SiN film) having a prescribed composition and a prescribed film thickness can be formed on the wafer 200. Note that the aforementioned cycle is preferably repeated multiple number of times as shown in FIG. 3A and FIG. 3B.

Here, in each step after a second cycle of repetition of the above-mentioned cycle, the description that "a specific gas is supplied to the wafer", is used in the following cases in this specification, meaning the case that "the specific gas is supplied to the layer formed on the wafer 200, namely, the specific gas is supplied to the outermost surface of the wafer 200 as the lamination body", and the description that "a specific layer is formed on the wafer 200" is used in the following cases in this specification, meaning the case that "the specific layer is formed on the layer formed on the wafer 200, namely, the specific layer is formed on the outermost surface of the wafer 200 as the lamination body". This point is described above. Further, regarding this point, the same thing can be said for each modified example, each application example, other film formation sequence, and other embodiment described later.

A SiCN film or the SiN film having a prescribed film thickness may be formed on the wafer 200, by setting a first step and a second step as one cycle, and alternately performing a cycle of the first step and the second step prescribed number of times, wherein the first step is the step of alternately performing a set of step 1 and step 2 prescribed number of times with these steps as one set, and the second step is the step of performing step 3.

Namely, the SiCN film or the SiN film having the prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon, and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of forming a SiCN layer or a SiN layer as the second layer, by modifying the first layer by supplying a thermally or plasma-activated nitrogen-containing gas ($NH_3$ gas) to the wafer 200 in the processing chamber 201 as the reactive gas (step 3). In this case as well, the above-mentioned cycle is preferably repeated multiple numbers of times.

FIG. 3C and FIG. 3D show an example of forming the SiCN film or the SiN film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3 thereafter.

FIG. 3C shows an example of finally forming the SiCN film by thermally nitriding the first layer so as to be modified (changed) to the SiCN layer by thermally activating the $NH_3$ gas and flowing it through the processing chamber 201 in step 3. Also, FIG. 3D shows an example of plasma-nitriding the first layer so as to be modified (changed) to the SiCN layer or the SiN layer, to thereby finally form the SiCN film or the SiN film by flowing active species obtained by plasma-exciting the $NH_3$ gas, into the processing chamber 201.

Thus, the ratio of a silicon component and a carbon component to a nitrogen component in the SiCN film or the SiN film can be properly controlled by setting the first step and the second step as one cycle and performing the cycle of these steps prescribed number of times, wherein the first step is the step of performing the set of the steps 1 and 2 with these steps as one set, and the second step is the step of performing step 3, and the controllability of the composition ratio of the SiCN film or the SiN film can be improved.

By increasing the number of sets (m) of the set constituted by step 1 and step 2, absolute amounts of the silicon component, the nitrogen component, and the carbon component in the first layer can be increased, and by nitriding in step 3 the first layer in which the absolute amount of each component is thus increased, the ratio of the nitrogen component to the silicon component and the carbon component in the SiCN layer or the SiN layer can be controlled toward a rich state, and the ratio of the silicon component and the carbon component to the nitrogen component in the finally formed SiCN film or the SiN film can be controlled toward the rich state.

For example, as shown in FIG. 3C, when the first layer is thermally nitrided in step 3, the ratio of the silicon component and the carbon component to the nitrogen component in the finally formed SiCN film can be controlled toward the rich state by increasing the number of sets (m) of the set constituted by step 1 and step 2. Further, as shown in FIG. 3D, when the first layer is plasma-nitrided in step 3, the ratio of the silicon component to the nitrogen component in the finally formed SiN film can be controlled toward the rich state by increasing the number of sets (m) of the set constituted by step 1 and step 2. Further, as shown in FIG. 3D, when the first layer is plasma-nitrided in step 3, not only an absolute amount of the silicon component but also an absolute amount of the carbon component in the first layer can be increased by increasing the number of sets (m) of the set constituted by step 1 and step 2. Therefore, in step 3, the first layer is not modified (changed) to the SiN layer but is modified (changed) to the SiCN layer, and finally the SiCN film can be formed.

Meanwhile, the absolute amount of the silicon component, the nitrogen component, and the carbon component in the first layer can be decreased by decreasing the number of sets (m) of the set constituted by step 1 and step 2, and thus by nitriding the first layer in which the absolute amount of each component is decreased in step 3, the ratio of the silicon component and the carbon component to the nitrogen component in the SiN layer or the SiN layer can be controlled toward a poor state, and the ratio of the silicon component and the carbon component to the nitrogen component in the finally formed SiCN film or the SiN film can be controlled toward the poor state.

Further, by increasing the number of sets (m) of the set constituted by step 1 and step 2, the number of layers of the first layer formed per one cycle, namely, the thickness of the first layer formed per one cycle can be increased by the number of sets (m), and a cycle rate (the thickness of the SiCN layer formed per unit cycle) can be improved. Thus, the film formation rate (the film thickness of the SiCN film formed per unit time) can also be improved.

When film formation processing of forming the SiCN film or the SiN film having a prescribed composition and a prescribed film thickness, is performed, the inert gas such as $N_2$ is supplied into the processing chamber 201, and is exhausted from the exhaust pipe 231, to thereby purge the inside of the processing chamber 201 with the inert gas (gas purge). Thereafter, the atmosphere in the processing chamber 201 is substituted with the inert gas (inert gas substitution), and the pressure in the processing chamber 201 is returned to a normal pressure (returned to the atmosphere).

Thereafter, the seal cap 219 is descended by the boat elevator 115, and the lower end of the reaction tube 203 is opened, so that the processed wafer 200 is unloaded to the outside of the reaction tube 203 from the lower end of the reaction tube 203 in a state of being supported by the boat 217. Thereafter, the processed wafer 200 is discharged by the boat 217 (wafer discharge).

(Second Sequence)

A second sequence of this embodiment will be described next.

Figure 4A:
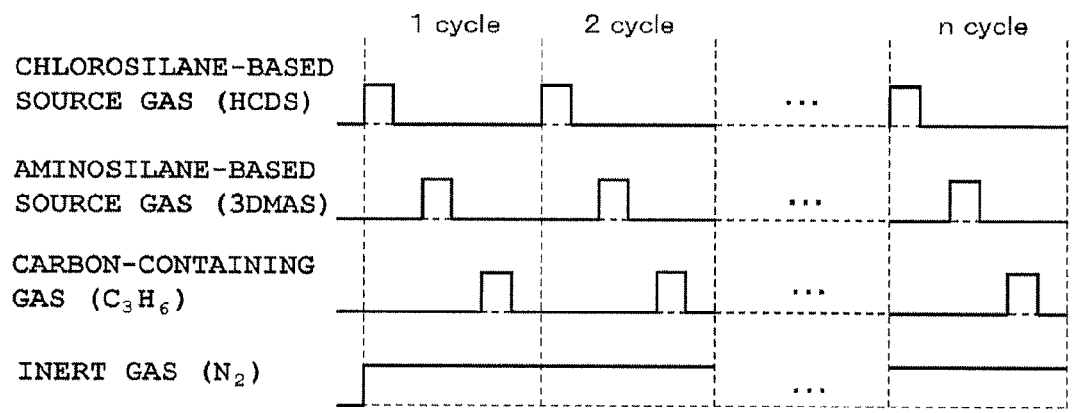
FIG. 4A is a view showing a timing of the gas supply in a second sequence of this embodiment.
Figure 4B:
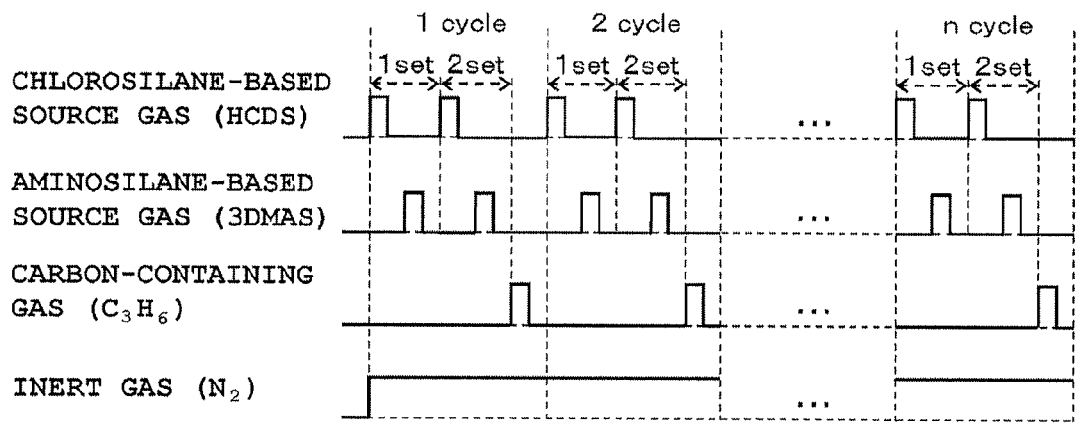
FIG. 4B is a view showing the timing of the gas supply in the modified example of the second sequence of this embodiment.

FIG. 4A is a view showing a timing of the gas supply in the second sequence of this embodiment, and FIG. 4B is a view showing the timing of the gas supply in the modified example of the second sequence of this embodiment.

In the second sequence of this embodiment, the silicon carbonitride film having a prescribed composition and a prescribed film thickness is formed on the wafer 200 by performing the following steps alternately prescribed number of times:

supplying the chlorosilane-based source to the wafer 200 in the processing chamber 201, and thereafter supplying the aminosilane-based source thereto, to thereby form the first layer on the wafer 200 containing silicon, nitrogen, and carbon; and supplying thermally activated carbon-containing gas to the wafer 200 in the processing chamber 201 as the reactive gas, to modify the first layer, and form the silicon carbonitride layer as the second layer.

The second sequence of this embodiment will be specifically described hereafter. Here, explanation will be given for a case that the HCDS gas is used as the chlorosilane-based source gas, and the 3DMAS gas is used as the aminosilane-based source gas, and $C_3H_6$ gas is used as the carbon-containing gas, to thereby form the silicon carbonitride film (SiCN film) on the substrate as the insulating film, by the sequence of FIGS. 4A-4B.

The wafer charge, boat loading, pressure adjustment, temperature adjustment, and wafer rotation are similarly performed as the first sequence. Thereafter, three steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 in the first sequence. Namely, in this step, the silicon-containing layer and the 3DMAS gas are reacted by supplying the 3DMAS gas into the processing chamber 201, to thereby form the first layer containing Si, N, and C.

[Step 3]

After removing the residual gas in the processing chamber 201 in the end of step 2, the valve 243i of the fifth gas supply pipe 232i is opened, to flow the $C_3H_6$ gas into the fifth gas supply pipe 232i. The flow rate of the $C_3H_6$ gas flowed into the fifth gas supply pipe 232i is adjusted by the mass flow controller 241i. The $C_3H_6$ gas with the flow rate adjusted, is supplied into the processing chamber 201 from the gas supply holes 250a of the first nozzle 249a, and is exhausted from the exhaust pipe 231. At this time, the thermally activated $C_3H_6$ gas is supplied to the wafer 200. Simultaneously at this time, the valve 243e is opened at this time, to flow the $N_2$ gas into the inert gas supply pipe 232e. The $N_2$ gas is supplied into the processing chamber 201 together with the $C_3H_6$ gas, and is exhausted from the exhaust pipe 231.

At this time, in order to prevent the invasion of the $C_3H_6$ gas into the second nozzle 249b, the third nozzle 249c, the fourth nozzle 249d, and the buffer chamber 237, the valves 243f, 243g, and 243h are opened, to thereby flow the $N_2$ gas into the second inert gas supply pipe 232f, the third inert gas supply pipe 232g, and the fourth gas inert gas supply pipe 232h. The $N_2$ gas is supplied into the processing chamber 201 through the second gas supply pipe 232b, the third gas supply pipe 232c, the fourth gas supply pipe 232d, the second nozzle 249b, the third nozzle 249c, the fourth nozzle 249d, and the buffer chamber 237, and is exhausted from the exhaust pipe 231.

At this time, the APC valve 244 is properly adjusted, to set the pressure in the processing chamber 201 in a range of 1 to 3000 Pa for example. The supply flow rate of the $C_3H_6$ gas controlled by the mass flow controller 241i is set in a range of 100 to 10000 sccm for example. The supply flow rate of the $N_2$ gas controlled by the mass flow controllers 241e, 241g, and 241h is set in a range of 100 to 10000 sccm respectively for example. The partial pressure of the $C_3H_6$ gas in the processing chamber 201 at this time, is set in a range of 0.01 to 2970 Pa for example. The time required for supplying the thermally activated $C_3H_6$ gas to the wafer 200, namely the gas supply time (irradiation time) is set in a range of 1 to 120 seconds, and preferably set in a range of 1 to 60 seconds. Similarly to the steps 1 to 2, the temperature of the heater 207 at this time is set so that the temperature of the wafer 200 is in a range of 250 to 700° C., and is preferably in a range of 350 to 650° C., and more preferably set in a range of 350 to 600° C. Note that a soft reaction can be caused by thermally activating the $C_3H_6$ gas, so that a carbon-containing layer as will be described later can be easily formed.

The gas flowed into the processing chamber 201 is the thermally activated $C_3H_6$ gas, and neither the HCDS gas nor the 3DMAS gas is flowed into the processing chamber 201. Accordingly, the $C_3H_6$ gas is supplied to the wafer 200 in an activated state without causing the vapor phase reaction, and at this time, the carbon-containing layer having the thickness of less than 1 atomic layer, namely a discontinuous carbon-containing layer is formed on the first layer containing Si, N, and C formed on the wafer 200 in step 2. The carbon-containing layer may be a carbon layer (C-layer), and may be a chemical adsorption layer of $C_3H_6$, namely the chemical adsorption layer made of a substance ($C_xH_y$) which is a decomposition of $C_3H_6$. Note that a part of the first layer and the $C_3H_6$ gas are reacted depending on the condition, so that the first layer is carbonized. Thus, the first layer is modified, to form the second layer including the silicon carbonitride layer (SiCN layer).

Note that the $C_3H_6$ gas is thermally activated and flowed into the processing chamber 201, to thereby modify the first layer, and at this time, the first layer is modified to the SiCN layer while increasing the ratio of the C-component in the first layer. Namely, the first layer can be modified to the SiCN layer while varying the composition ratio in a direction of increasing the carbon concentration. Further, by controlling the processing condition such as the pressure in the processing chamber 201 and the gas supply time, the ratio of the C-component in the SiCN layer, namely the carbon concentration can be finely adjusted. Thus, the composition ratio of the SiCN layer can be more strictly controlled.

After the second layer is formed on the wafer 200, the valve 243i of the fifth gas supply pipe 232i is closed, to stop the supply of the $C_3H_6$ gas. At this time, the inside of the processing chamber 201 is vacuum-exhausted by the vacuum pump 246, with the APC valve 244 of the exhaust pipe 231 opened, and the $C_3H_6$ gas unreacted or after contributing to the formation of the second layer remained in the processing chamber 201, is removed from the processing chamber 201. Further, the supply of the $N_2$ gas as the inert gas into the processing chamber 201 is maintained, with the valves 243e, 243f, 243g, and 243h opened. The $N_2$ gas actions as the purge gas, and thus, the effect of removing the $C_3H_6$ gas from the processing chamber 201 can be further increased, which is the $C_3H_6$ gas unreacted or after contributing to the formation of the second layer remained in the processing chamber 201.

At this time, the gas remained in the processing chamber 201 is not required to be completely removed, and the inside of the processing chamber 201 is not required to be completely purged. Even if the slight amount of the gas is remained in the processing chamber, no adverse influence is generated in step 1. At this time, the flow rate of the $N_2$ gas supplied into the processing chamber 201 is not required to be large, and for example, by supplying almost the same amount of the $N_2$ gas as the volume of the reaction tube 203 (processing chamber 201), purging can be performed so that no adverse influence is generated in step 1 performed thereafter. Thus, by not completely purging the inside of the processing chamber 201, a purging time can be shortened, and the throughput can be improved. Further, consumption of the $N_2$ gas can be suppressed to necessary minimum.

Ethylene ($C_2H_4$) gas and acetylene ($C_2H_2$) gas, etc., may be used as the carbon-containing gas, other than the $C_3H_6$ gas.

The aforementioned steps 1 to 3 are set as one cycle, and by performing this cycle one or more number of times (prescribe number of times), the silicon carbonitride film (SiCN film) having a prescribed composition and a prescribed film thickness can be formed on the wafer 200. Note that the aforementioned cycle is preferably repeated multiple number of times as shown in FIG. 4A.

A SiCN film having a prescribed film thickness may be formed on the wafer 200, by setting a first step and a second step as one cycle, and performing a cycle of the first step and the second step prescribed number of times, wherein the first step is the step of alternately performing a set of step 1 and step 2 prescribed number of times with these steps as one set, and the second step is the step of performing step 3.

Namely, the SiCN film having the prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of forming a SiCN layer as the second layer, by modifying the first layer by supplying a thermally-activated carbon-containing gas ($C_3H_6$ gas) to the wafer 200 in the processing chamber 201 as the reactive gas (step 3). In this case as well, the above-mentioned cycle is preferably repeated multiple numbers of times.

FIG. 4B shows an example of forming a SiCN film having a prescribed composition and a prescribed film thickness on the wafer 200 by setting the first step and the second step as one cycle and performing the cycle of the first step and the second step n-times, wherein the first step is the step of performing the set of the steps 1 and 2 twice with these steps as one set, and the second step is the step of performing step 3 thereafter.

Thus, the ratio of a silicon component and a nitrogen component to a carbon component in the SiCN film can be properly controlled by setting the first step and the second step as one cycle and performing the cycle of these steps prescribed number of times, wherein the first step is the step of performing the set of the steps 1 and 2 with these steps as one set, and the second step is the step of performing step 3, and the controllability of the composition ratio of the SiCN film can be improved.

By increasing the number of sets (m) of the set constituted by step 1 and step 2, absolute amounts of the silicon component, the nitrogen component, and the carbon component in the first layer can be increased, and by modifying in step 3 the first layer in which the absolute amount of each component is thus increased, the ratio of the silicon component and the nitrogen component to the carbon component in the SiCN layer can be controlled toward a rich state, and the ratio of the silicon component and the nitrogen component to the carbon component in the finally formed SiCN film can be controlled toward the rich state.

Meanwhile, by decreasing the number of sets (m) of the set constituted by step 1 and step 2, the absolute amounts of the silicon component, the nitrogen component, and the carbon component in the first layer can be decreased, and thus by modifying the first layer in which the absolute amount of each component is decreased in step 3, the ratio of the silicon component and the nitrogen component to the carbon component in the SiCN layer can be controlled toward a poor state, and the ratio of the silicon component and the nitrogen component to the carbon component in the finally formed SiCN film can be controlled toward the poor state.

By increasing the number of sets (m) of the set constituted by step 1 and step 2, the number of layers of the first layer formed per one cycle, namely, the thickness of the first layer formed per one cycle can be increased by the number of sets (m), and the cycle rate (thickness of the SiCN layer formed per unit cycle) can be improved. Further, thus, the film formation rate (film thickness of the SiCN film formed per unit time) can be improved.

When the film formation processing of forming the SiCN film having a prescribed composition and a prescribed film thickness is performed, gas purge, inert gas substitution, return to the atmosphere, boat unloading, and wafer discharge, are performed similarly to the first sequence.

(Third Sequence)

A third sequence of this embodiment will be described next.

Figure 5A:
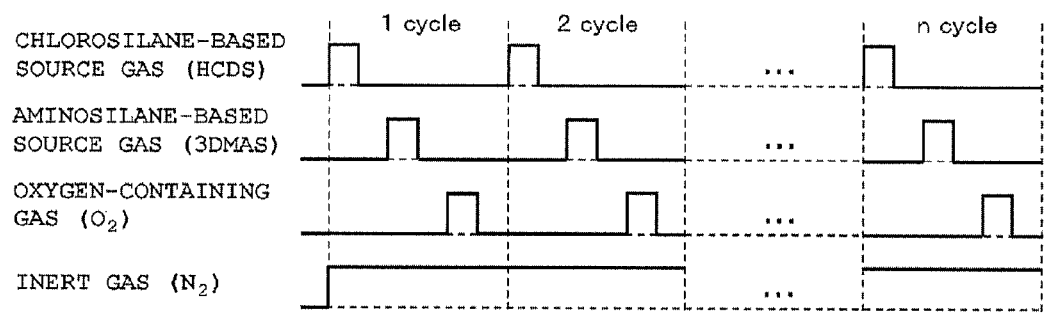
Figure 5B:
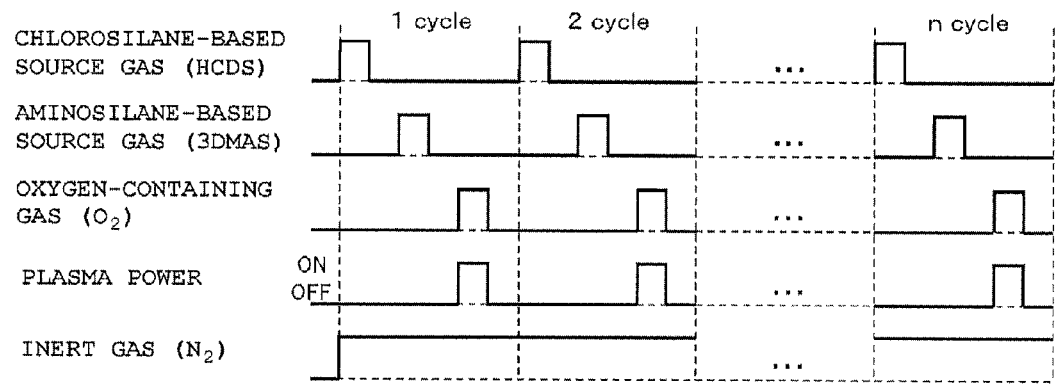
Figure 5C:
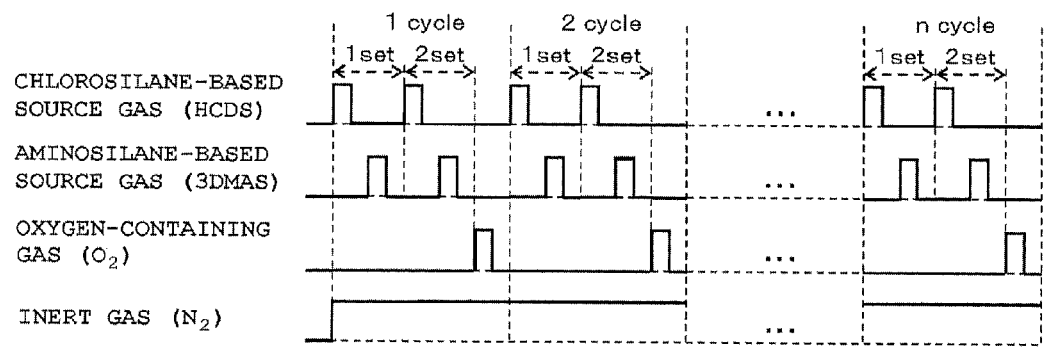
Figure 5D:
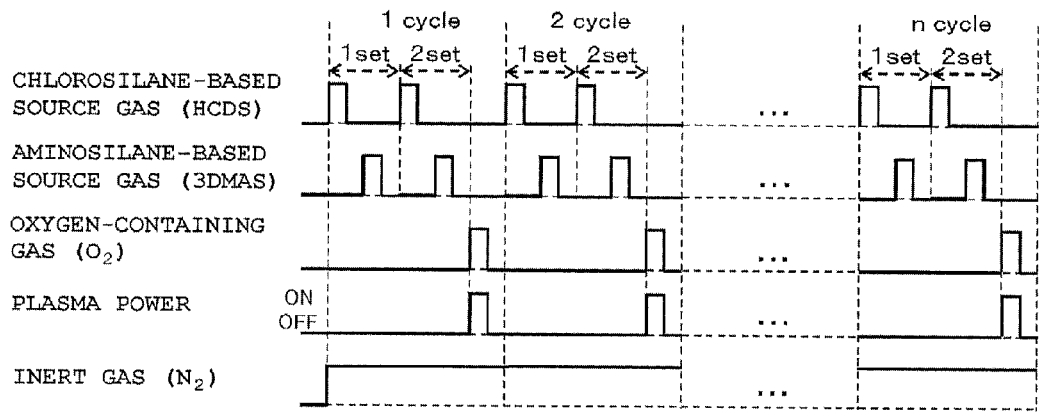

FIGS. 5A-5D are views showing the timing of gas supply and plasma power supply in the third sequence of this embodiment, wherein FIG. 5A shows a sequence example of performing film formation without using plasma (by non-plasma), and FIG. 5B shows a sequence example of performing film formation using plasma, FIG. 5C shows a modified example of the sequence shown in FIG. 5A, and FIG. 5D shows a modified example of the sequence shown in FIG. 5B.

In the third sequence of this embodiment, a silicon oxycarbonitride film, a silicon oxycarbide film, or a silicon oxide film having a prescribed composition and a prescribed film thickness is formed on the wafer 200 by performing the following steps alternately prescribed number of times:

supplying the chlorosilane-based source to the wafer 200 in the processing chamber 201, and thereafter supplying the aminosilane-based source thereto, to form the first layer on the wafer 200 containing silicon, nitrogen, and carbon; and supplying the thermally or plasma activated oxygen-containing gas to the wafer 200 in the processing chamber 201 as the reactive gas, to modify the first layer and form a silicon oxycarbonitride layer, a silicon oxycarbide layer, or a silicon oxide layer as the second layer.

The third sequence of this embodiment will be more specifically described hereafter. Here, explanation is given for a case that the HCDS gas is used as the chlorosilane-based source gas, the 3DMAS gas is used as the aminosilane-based source gas, and $O_2$ gas is used as oxygen-containing gas, to thereby form the silicon oxycarbonitride film (SiOCN film), the silicon oxycarbide film (SiOC film), or the silicon oxide film (SiO film) on the substrate as the insulating film.

Processing is performed similarly to the first sequence, regarding the wafer charge, boat loading, pressure adjustment, temperature adjustment, and wafer rotation. Thereafter, three steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the silicon-containing layer and the 3DMAS gas are reacted by supplying the 3DMAS gas into the processing chamber 201, to form the first layer containing Si, N, and C.

[Step 3]

After the residual gas in the processing chamber 201 is removed in the end of the step 2, the valve 243j of the sixth gas supply pipe 232j is opened, to flow the $O_2$ gas into the sixth gas supply pipe 232j. The flow rate of the $O_2$ gas flowed into the sixth gas supply pipe 232j is adjusted by the mass flow controller 241j. The $O_2$ gas with the flow rate adjusted is supplied into the buffer chamber 237 from the gas supply holes 250d of the fourth nozzle 249d. At this time, the $O_2$ gas supplied into the buffer chamber 237 is thermally activated by not applying high frequency power between the first rod electrode 269 and the second rod electrode 270, and is supplied into the processing chamber 201 from the gas supply holes 250e, and is exhausted from the exhaust pipe 231 (see FIG. 5A). Further, at this time, by applying the high frequency power between the first rod electrode 269 and the second rod electrode 270 from the high frequency power source 273 through the matching box 272, the $O_2$ gas supplied into the buffer chamber 237 is plasma-excited, and is supplied into the processing chamber 201 from the gas supply holes 250e as the active species, and is exhausted from the exhaust pipe 231 (see FIG. 5B). At this time, the thermally or plasma activated $O_2$ gas is supplied to the wafer 200. The valve 243h is simultaneously opened at this time, to flow the $N_2$ gas into the inert gas supply pipe 232h. The $N_2$ gas is supplied into the processing chamber 201 together with the $O_2$ gas, and is exhausted from the exhaust pipe 231.

At this time, in order to prevent the invasion of the $O_2$ gas into the first nozzle 249a, the second nozzle 249b, and the third nozzle 249c, the valves 243e, 243f, and 243g are opened, to thereby flow the $N_2$ gas into the first inert gas supply pipe 232e, the second inert gas supply pipe 232f, and the third inert gas supply pipe 232g. The $N_2$ gas is supplied into the processing chamber 201 through the first gas supply pipe 232a, the second gas supply pipe 232b, the third gas supply pipe 232c, the first nozzle 249a, the second nozzle 249b, and the third nozzle 249d, and is exhausted from the exhaust pipe 231.

When the $O_2$ gas is thermally activated and flowed without being plasma-excited, the APC valve 244 is properly adjusted, to set the pressure in the processing chamber 201 in a range of 1 to 3000 Pa for example. By setting the pressure in the processing chamber 201 in such a relatively high pressure band, the $O_2$ gas can be thermally activated by non-plasma. Note that a soft reaction can be caused by thermally activating the $O_2$ gas and supplying the thermally activated $O_2$ gas, thus causing a soft oxidation to occur as will be described later. Further, when the $O_2$ gas is flowed under plasma-excitation as the active species, the APC valve 244 is properly adjusted, to set the pressure in the processing chamber 201 in a range of 1 to 100 Pa for example. The supply flow rate of the $O_2$ gas controlled by the mass flow controller 241d is set in a range of 100 to 10000 sccm for example. The supply flow rate of the $N_2$ gas controlled by the mass flow controllers 241h, 241e, 241f, and 241g is set in a range of 100 to 10000 sccm respectively for example. At this time, a partial pressure of the $O_2$ gas in the processing chamber 201 is set in a range of 0.01 to 2970 Pa when the $O_2$ gas is thermally activated and flowed. Also, the partial pressure of the $O_2$ gas in the processing chamber 201 is set in a range of 0.01 to 99 Pa for example, when the $O_2$ gas is plasma-activated and flowed.

Further, the time required for supplying to the wafer 200 the thermally activated $O_2$ gas or the active species obtained by plasma-exciting the $O_2$ gas, namely the gas supply time (irradiation time) is set in a range of 1 to 120 seconds, and preferably set in a range of 1 to 60 seconds for example. Similarly to the steps 1 to 2, the temperature of the heater 207 at this time is set so that the temperature of the wafer 200 is in a range of 250 to 700° C. for example and is preferably in a range of 350 to 650° C., and more preferably set in a range of 350 to 600° C. When the $O_2$ gas is plasma-excited, the high frequency power applied between the first rod electrode 269 and the second rod electrode 270 from the high frequency power source 273 is set to be the power in a range of 50 to 1000 W for example.

The gas flowed into the processing chamber 201 at this time, is the $O_2$ gas thermally activated by increasing the pressure in the processing chamber 201, or the active species obtained by plasma-exciting the $O_2$ gas, and neither the HCDS gas nor the 3DMAS gas is flowed into the processing chamber 201. Accordingly, the $O_2$ gas activated or turned into the active species, without causing the vapor phase reaction, is reacted with at least a part of the first layer containing Si, N, and C formed on the wafer 200 in step 2. Thus, the first layer is oxidized and is modified to the second layer including the silicon oxycarbonitride layer (SiOCN layer), the silicon oxycarbide layer (SiOC layer), or the silicon oxide layer (SiO layer).

As shown in FIG. 5A, the first layer can be modified (changed) to the SiOCN layer of the SiOC layer by thermally oxidizing the first layer by flowing the thermally activated $O_2$ gas through the processing chamber 201. At this time, the first layer is modified to the SiOCN layer or the SiOC layer while adding the O-component to the first layer. At this time, by thermally oxidizing action of the $O_2$ gas, Si—N bond, Si—C bond, and Si—Si bond are reduced, while Si—O bond is increased in the first layer, and the ratio of N-component, the ratio of C-component, and the ratio of Si-component in the first layer are reduced. At this time, by prolonging the thermally oxidation time or by increasing an oxidizing power of the thermal oxidation by the $O_2$ gas, a major part of the N-component is desorbed to reduce the N-component to an impurity level, to achieve a substantial disappearance of the N-component. Namely, the first layer can be modified to the SiOCN layer or the SiOC layer while varying the composition ratio in a direction of increasing the oxygen concentration and in a direction of reducing the nitrogen concentration, the carbon concentration, and the silicon concentration. Further, at this time, the processing conditions such as the pressure in the processing chamber 201 and the gas supply time are controlled, so that the ratio of the O-component in the SiOCN layer, namely the oxygen concentration can be finely adjusted. Thus, the composition ratio of the SiOCN layer can be more strictly controlled.

Further, as shown in FIG. 5B, the active species obtained by plasma-exciting the $O_2$ gas is flowed into the processing chamber 201, to plasma-oxidize the first layer and modify (change) the first layer to the SiOC layer or the SiO layer. At this time, the first layer can be modified to the SiO layer by making both components of the C-component and the N-component in the first layer desorbed by the energy of the active species while adding the O-component to the first layer. At this time, owing to the action of the plasma oxidation by the $O_2$ gas, Si—O bond in the first layer is increased and meanwhile Si—N bond, Si—C bond, and Si—Si bond are reduced, and the ratio of the N-component in the first layer, and the ratio of the C-component and the ratio of the Si-component are reduced. Particularly, a major part of the N-component and the C-component is desorbed to be reduced to the impurity level, or substantially disappears. Namely, the first layer can be modified to the SiO layer while varying the composition ratio in a direction of increasing the oxygen concentration or in a direction of reducing the nitrogen concentration, the carbon concentration, and the silicon concentration. Further, at this time, the N-component in the first layer is desorbed by the energy of the active species and a part of the C-component is remained without being desorbed, to thereby modify the first layer to the SiOC layer. At this time, by the action of the plasma oxidation by the $O_2$ gas, Si—O bond is increased, and meanwhile Si—N bond, Si—C bond, and Si—Si bond are reduced in the first layer, and the ratio of the N-component, the ratio of the C-component, and the ratio of the Si-component in the first layer are reduced. Particularly, a major part of the N-component is desorbed to be reduced to the impurity level, or substantially disappears. Namely, the first layer can be modified to the SiOC layer while varying the composition ratio in a direction of increasing the oxygen concentration, or in a direction of reducing the nitrogen concentration, the carbon concentration, and the silicon concentration.

Note that it is found that the C-component in the first layer formed in steps 1 and 2, is in a rich state compared with the N-component. For example, according to a certain experiment, the carbon concentration is sometimes about twice or more of the nitrogen concentration. Namely, when the C-component and the N-component in the first layer are desorbed by the energy of the active species, the C-component remains even in a stage in which the major part of the N-component is desorbed. Then, oxidation is stopped in this state, to modify the first layer to the SiOC layer. Further, the oxidation is continued even after the end of the desorption of the major part of the N-component, and the oxidation is stopped in a stage in which the major part of the C-component is desorbed, to thereby modify the first layer to the SiO layer. Specifically, the ratio of the C-component, namely the carbon concentration can be controlled by controlling the gas supply time (oxidation treatment time), and either SiO layer or SiOC layer can be formed while controlling the composition ratio. Further, at this time, the ratio of the O-component in the SiO layer or the SiOC layer, namely the oxygen concentration can be finely adjusted by controlling the processing conditions such as the pressure and the gas supply time in the processing chamber 201. Thus, the composition ratio of the SiO layer or the SiOC layer can be more strictly controlled.

At this time, an oxidation reaction of the first layer is preferably not to be saturated. For example, when the first layer having the thickness of 1 atomic layer or less than 1 atomic layer is formed in steps 1 and 2, a part of the first layer is preferably oxidized.

In this case, oxidation is performed under a condition that the oxidation reaction of the first layer is unsaturated, so that an entire body of the first layer having the thickness of 1 atomic layer or less than 1 atomic layer is not oxidized.

In order to set the oxidation reaction of the first layer in an unsaturated state, the aforementioned processing condition is used as the processing condition in step 3. In a case of using the following processing condition as the processing condition in step 3, the oxidation reaction of the first layer can be easily unsaturated.

[When the $O_2$ Gas is Thermally Activated and Flowed . . . ]
  Wafer temperature: 500 to 650° C.
  Pressure in the processing chamber: 133 to 2666 Pa
  Partial pressure of 02 gas: 33 to 2515 Pa
  $O_2$ gas supply flow rate: 1000 to 5000 sccm
  $N_2$ gas supply flow rate: 300 to 3000 sccm
  $O_2$ gas supply time: 6 to 60 seconds

[When the $O_2$ Gas is Plasma Activated and Flowed . . . ]
  Wafer temperature: 500 to 650° C.
  Pressure in the processing chamber: 33 to 80 Pa
  Partial pressure of the $O_2$ gas: 8 to 75 Pa
  $O_2$ gas supply flow rate: 1000 to 5000 sccm
  $N_2$ gas supply flow rate: 300 to 3000 sccm
  $O_2$ gas supply time: 6 to 60 seconds After the second layer is formed on the wafer 200, the valve 243j of the sixth gas supply pipe 232j is closed, to stop the supply of the $O_2$ gas. At this time, the inside of the processing chamber 201 is vacuum-exhausted by the vacuum pump 246, with the APC valve 244 of the exhaust pipe 231 opened, and the $O_2$ gas unreacted or after contributing to the formation of the second layer remained in the processing chamber 201 is removed from the processing chamber 201. Further, the supply of the $N_2$ gas into the processing chamber 201 is maintained, with the valves 243h, 243e, 243f, and 243g opened. The $N_2$ gas actions as the purge gas, and thus, the effect of removing the $O_2$ gas from the processing chamber 201 can be further increased, which is the $O_2$ gas unreacted or after contributing to the formation of the second layer remained in the processing chamber 201.

At this time, the gas remained in the processing chamber 201 is not required to be completely removed, and the inside of the processing chamber 201 is not required to be completely purged. Even if a slight amount of the gas is remained in the processing chamber, no adverse influence is generated in step 1 performed thereafter. At this time, the flow rate of the $N_2$ gas supplied into the processing chamber 201 is not required to be large, and for example, by supplying almost the same amount of the $N_2$ gas as the volume of the reaction tube 203 (processing chamber 201), purging can be performed so that no adverse influence is generated in step 2 performed thereafter. Thus, by not completely purging the inside of the processing chamber 201, the purging time can be shortened, and the throughput can be improved. Further, consumption of the $N_2$ gas can be suppressed to necessary minimum.

As the oxygen-containing gas, other than the gas obtained by thermally or plasma-exciting the $O_2$ gas, the gas obtained by thermally or plasma-exciting nitrous oxide ($N_2O$) gas, nitric monoxide (NO) gas, nitrogen dioxide ($NO_2$) gas, ozone ($O_3$) gas, hydrogen ($H_2$) gas+oxygen ($O_2$) gas, $H_2$ gas+$O_3$ gas, steam ($H_2O$) gas, carbon monoxide (CO) gas, carbon dioxide ($CO_2$) gas, etc., may be used, or the gas obtained by diluting these gases with rare gas such as Ar gas, He gas, Ne gas, and Xe gas, may be thermally or plasma-excited and used.

The above-described steps 1 to 3 are set as one cycle, and this cycle is performed one or more times (prescribed number of times), to thereby form the silicon oxycarbonitride film (SiOCN film), the silicon oxycarbide film (SiOC film), or the silicon oxide film (SiO film) having the prescribed composition and the prescribed film thickness on the wafer 200. Note that the aforementioned cycle is preferably repeated multiple numbers of times, as shown in FIG. 5A and FIG. 5B.

A SiOCN film, the SiOC film, or the SiO film having a prescribed film thickness may be formed on the wafer 200, by setting a first step and a second step as one cycle, and performing a cycle of the first step and the second step prescribed number of times, wherein the first step is the step of alternately performing a set of step 1 and step 2 prescribed number of times with these steps as one set, and the second step is the step of performing step 3.

Namely, the SiOCN film, the SiOC film, or the SiO film having the prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of forming a SiOCN layer, a SiOC layer, or a SiO layer as the second layer, by modifying the first layer by supplying the thermally or plasma-activated oxygen-containing gas ($O_2$ gas) to the wafer 200 in the processing chamber 201 as the reactive gas (step 3). In this case as well, the above-mentioned cycle is preferably repeated multiple numbers of times.

FIG. 5C and FIG. 5D show an example of forming the SiOCN film, the SiOC film, or the SiO film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3 thereafter.

FIG. 5C shows an example of finally forming the SiOCN film, SiOC film, or the SiO film by thermally oxidizing the first layer so as to be modified (changed) to the SiOCN layer, or the SiOC layer by thermally activating the $O_2$ gas and flowing it through the processing chamber 201 in step 3. Also, FIG. 5D shows an example of plasma-oxidizing the first layer so as to be modified (changed) to the SiOCN layer, SiOC layer or the SiO layer, to thereby finally form the SiOCN film, the SiOC film, or the SiO film, by flowing the active species obtained by plasma-exciting the first layer, into the processing chamber 201.

Thus, the ratio of a silicon component, a nitrogen component, and a carbon component to an oxygen component in the SiOCN film, the SiOC film, or the SiO film can be properly controlled by setting the first step and the second step as one cycle and performing the cycle of these steps prescribed number of times, wherein the first step is the step of performing the set of the steps 1 and 2 with these steps as one set, and the second step is the step of performing step 3, and the controllability of the composition ratio of the SiOCN film, the SiOC film, or the SiO film can be improved.

By increasing the number of sets (m) of the set constituted by step 1 and step 2, the absolute amounts of the silicon component, the nitrogen component, and the carbon component in the first layer can be increased, and by oxidizing in step 3 the first layer in which the absolute amount of each component is thus increased, the ratio of the silicon component, the nitrogen component, and the carbon component to the oxygen component in the SiOCN layer, the SiOC layer, or the SiO layer can be controlled toward a rich state, and the ratio of the silicon component, the nitrogen component, and the carbon component to the oxygen component in the finally formed SiOCN film, SiOC film, and SiO film can be controlled toward the rich state.

For example, as shown in FIG. 5C, when the first layer is thermally oxidized in step 3, the ratio of the silicon component, the nitrogen component, and the carbon component to the oxygen component in the finally formed SiOCN film or SiOC film can be controlled toward the rich state by increasing the number of sets (m) of the set constituted by step 1 and step 2. Further, as shown in FIG. 5D, when the first layer is plasma-oxidized in step 3, the ratio of the silicon component and the carbon component to the oxygen component in the finally formed SiOCN film or the SiO film can be controlled toward the rich state by increasing the number of sets (m) of the set constituted by step 1 and step 2. Further, as shown in FIG. 5D, when the first layer is plasma-oxidized in step 3, not only the absolute amounts of the silicon component and the carbon component but also the absolute amount of the nitrogen component in the first layer can be increased by increasing the number of sets (m) of the set constituted by step 1 and step 2. Therefore, in step 3, the first layer is not modified (changed) to the SiOC layer or the SiO layer but is modified (changed) to the SiOCN layer, and finally the SiOCN film can be formed.

Meanwhile, by decreasing the number of sets (m) of the set constituted by step 1 and step 2, the absolute amounts of the silicon component, the nitrogen component, and the carbon component in the first layer can be decreased, and thus by oxidizing the first layer in which the absolute amount of each component is decreased in step 3, the ratio of the silicon component, the nitrogen component, and the carbon component to the oxygen component in the SiOCN layer, the SiOC layer, or the SiO layer can be controlled toward a poor state, and the ratio of the silicon component, the nitrogen component, and the carbon component to the oxygen component in the finally formed SiOCN film, SiOC film, or the SiO film can be controlled toward the poor state.

Further, by increasing the number of sets (m) of the set constituted by step 1 and step 2, the number of layers of the first layer formed per one cycle, namely, the thickness of the first layer formed per one cycle can be increased by the number of sets (m), and a cycle rate (the thickness of the SiOCN layer, the SiOC layer, or the SiO layer formed per unit cycle) can be improved. Thus, the film formation rate (the film thickness of the SiOCN film, the SiOC film, or the SiO film formed per unit time) can also be improved.

When the film formation processing is performed, which is the processing of forming the SiOCN film, the SiOC film, or the SiO film having the prescribed composition and the prescribed film thickness, the gas purge, inert gas substitution, return to the atmosphere, boat unloading, and wafer discharge are performed similarly to the first sequence.

(Fourth Sequence)

A fourth sequence of this embodiment will be described next.

Figure 6A:
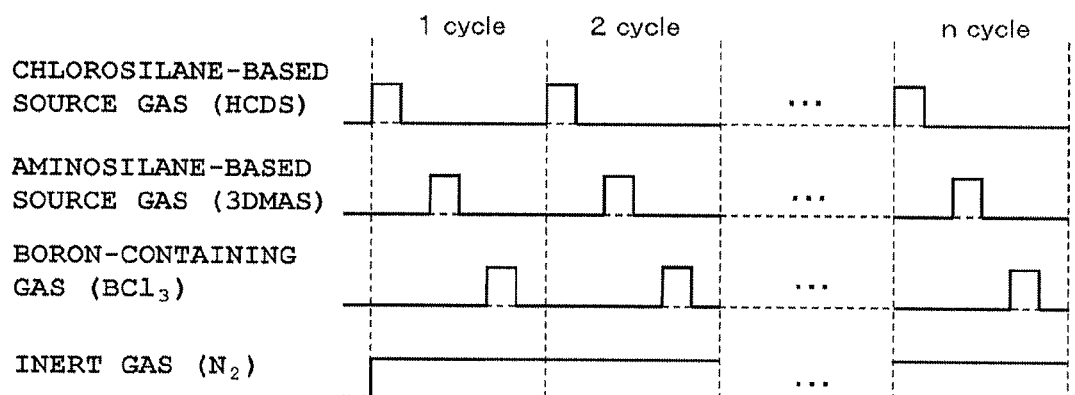
FIG. 6A is a view showing a timing of gas supply in a fourth sequence of this embodiment.
Figure 6B:
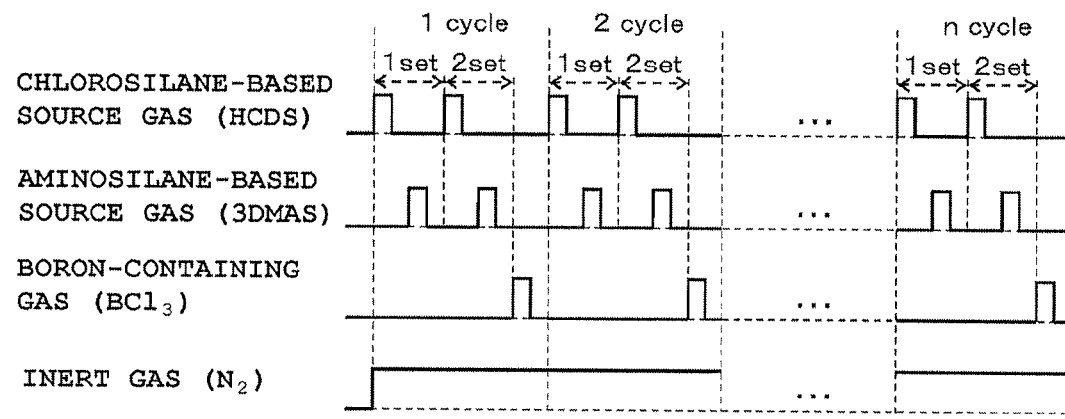
FIG. 6B shows the timing of the gas supply in a modified example of the fourth sequence of this embodiment.

FIG. 6A is a view of the timing of the gas supply in the fourth sequence according to this embodiment, and FIG. 6B is a view showing the timing of the gas supply in a modified example of the fourth sequence of this embodiment.

In the fourth sequence of this embodiment, a silicon boron carbonitride film is formed by performing the following steps alternately prescribed number of times:

supplying chlorosilane-based source to the wafer 1200 in the processing chamber 201 and thereafter supplying the aminosilane-based source thereto as reactive gases, to form a first layer containing silicon, nitrogen, and carbon on the wafer 200; and supplying thermally activated boron-containing gas to the wafer 200 in the processing chamber as the reactive gas, to modify the first layer and form a silicon boron carbonitride layer being a second layer.

The fourth sequence of this embodiment will be more specifically described hereafter. Here, explanation will be given for an example of forming a silicon boron carbonitride film (SiBCN film) being the insulating film on the substrate by the sequence of FIGS. 6A-6B, using the HCDS gas as the chlorosilane-based source gas, and the 3DMAS gas as the aminosilane-based source gas, and $BCl_3$ gas as the boron-containing gas.

The wafer charge, boat loading, pressure adjustment, temperature adjustment, and wafer rotation are similarly performed as the first sequence. Thereafter, three steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is similarly performed as the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 2 to cause a reaction between the silicon-containing layer and the 3DMAS gas, to thereby form the first layer containing Si, N, and C.

[Step 3]

After the residual gas in the processing chamber 201 is removed in the end of the step 2, the valve 243c of the third gas supply pipe 232c is opened, to flow the $BCl_3$ gas into the third gas supply pipe 232c. The flow rate of the $BCl_3$ gas flowed into the third gas supply pipe 232c is adjusted by the mass flow controller 241c. The $BCl_3$ gas with the flow rate adjusted, is supplied into the processing chamber 201 from the gas supply holes 250c of the third nozzle 249c, and is exhausted from the exhaust pipe 231. At this time, the thermally activated $BCl_3$ gas is supplied to the wafer 200. Simultaneously at this time, the valve 243g is simultaneously opened at this time, to flow the $N_2$ gas into the inert gas supply pipe 232g. The $N_2$ gas is supplied into the processing chamber 201 together with the $BCl_3$ gas, and is exhausted from the exhaust pipe 231.

At this time, in order to prevent the invasion of the $BCl_3$ gas into the first nozzle 249a, the second nozzle 249b, the fourth nozzle 249d, and the buffer chamber 237, the valves 243e, 243*f*, and 243*h* are opened, to thereby flow the $N_2$ gas into the first inert gas supply pipe 232*e*, the second inert gas supply pipe 232*f*, and the fourth inert gas supply pipe 232*h*. The $N_2$ gas is supplied into the processing chamber 201 through the first gas supply pipe 232*a*, the second gas supply pipe 232*b*, the fourth gas supply pipe 232*d*, the first nozzle 249*a*, the second nozzle 249*b*, the fourth nozzle 249*d*, and the buffer chamber 237, and is exhausted from the exhaust pipe 231.

At this time, the APC valve 244 is properly adjusted, to set the pressure in the processing chamber 201 in a range of 1 to 3000 Pa for example. The supply flow rate of the $BCl_3$ gas controlled by the mass flow controller 241*c* is set in a range of 100 to 10000 sccm for example. The supply flow rate of the $N_2$ gas controlled by the mass flow controllers 241*g*, 241*e*, 241*f*, and 241*h* is set in a range of 100 to 10000 sccm for example. The partial pressure of the $BCl_3$ gas in the processing chamber 201 at this time, is set to the pressure in a range of 0.01 to 2970 Pa for example. The time required for supplying the $BCl_3$ gas to the wafer 200, namely the gas supply time (irradiation time) is set in a range of 1 to 120 seconds for example, and is preferably set in a range of 1 to 60 seconds. Similarly to the steps 1 to 2, the temperature of the heater 207 at this time is set so that the temperature of the wafer 200 is in a range of 250 to 700° C., and is preferably in a range of 350 to 650° C., and more preferably set in a range of 350 to 600° C. Note that a soft reaction can be caused by supplying the thermally activated $BCl_3$ gas. Thus, the boron-containing layer as will be described later can be easily formed.

At this time, the gas flowed into the processing chamber 201 is the thermally activated $BCl_3$ gas, and neither the HCDS gas nor the 3DMAS gas is flowed into the processing chamber 201. Accordingly, the $BCl_3$ gas is supplied to the wafer 200 in an activated state without causing the vapor phase reaction, and at this time, the boron-containing layer having the thickness of less than 1 atomic layer, namely a discontinuous boron-containing layer is formed on the first layer containing Si, N, and C formed on the wafer 200 in step 2. The boron-containing layer may be a boron layer (B-layer) or a chemical adsorption layer of $BCl_3$, which is the chemical adsorption layer made of a substance ($B_xCl_y$) which is a decomposition of $BCl_3$. Note that a part of the first layer and the $BCl_3$ gas are reacted depending on a condition, to boronize the first layer. Thus, the first layer is modified to form a second layer including the silicon boron carbonitride layer (SiBCN layer).

Note that when the $BCl_3$ gas is thermally activated and is flowed into the processing chamber 201 to modify the first layer, the first layer is modified to the SiBCN layer while adding B-component to the first layer. Namely, the first layer can be modified to the SiBCN layer while varying the composition ratio in a direction of increasing the boron concentration. Further, the processing conditions such as the pressure in the processing chamber 201 and the gas supply time are controlled to thereby finely adjust the ratio of the B-component, namely boron concentration in the SiBCN layer, and the composition ratio of the SiBCN layer can be further strictly controlled.

After the second layer is formed on the wafer 200, the valve 243*c* of the third gas supply pipe 232*c* is closed, to stop the supply of the $BCl_3$ gas. At this time, the inside of the processing chamber 201 is vacuum-exhausted by the vacuum pump 246, with the APC valve 244 of the exhaust pipe 231 opened, to thereby remove the $BCl_3$ gas unreacted or after contributing to the formation of the second layer remained in the processing chamber 201, from the processing chamber 201. Note that the supply of the $N_2$ gas into the processing chamber 201 is maintained, with the valves 243*g*, 243*e*, 243*f*, and 243*h* opened. The $N_2$ gas actions as the purge gas, and thus, the effect of removing the $BCl_3$ gas from the processing chamber 201 can be further increased, which is the $BCl_3$ gas unreacted or after contributing to the formation of the second layer remained in the processing chamber 201.

At this time, the gas remained in the processing chamber 201 is not required to be completely removed, and the inside of the processing chamber 201 is not required to be completely purged. Even if a slight amount of the gas is remained in the processing chamber, no adverse influence is generated in step 1 performed thereafter. At this time, the flow rate of the $N_2$ gas supplied into the processing chamber 201 is not required to be large, and for example, by supplying the same amount of the $N_2$ gas as the volume of the reaction tube 203 (processing chamber 201), purging can be performed so that no adverse influence is generated in step 1 performed thereafter. Thus, by not completely purging the inside of the processing chamber 201, a purging time can be shortened, and the throughput can be improved. Further, consumption of the $N_2$ gas can be suppressed to necessary minimum.

Diborane ($B_2H_6$) gas and a gas containing a borazine compound such as trimethylborazine, etc., (borazine-based gas) may be used as the boron-containing gas, other than the $BCl_3$ gas.

The aforementioned steps 1 to 3 are set as one cycle, and by performing this cycle one or more number of times (prescribe number of times), the silicon boron carbonitride film (SiBCN film) having a prescribed composition and a prescribed film thickness can be formed on the wafer 200. Note that the aforementioned cycle is preferably repeated multiple number of times as shown in FIG. 6A.

A SiBCN film having a prescribed film thickness may be formed on the wafer 200, by setting a first step and a second step as one cycle, and performing a cycle of the first step and the second step prescribed number of times, wherein the first step is the step of alternately performing a set of step 1 and step 2 prescribed number of times with these steps as one set, and the second step is the step of performing step 3.

Namely, the SiBCN film having a prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon, and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of forming a SiBCN layer as the second layer by modifying the first layer by supplying the thermally-activated boron-containing gas ($BCl_3$ gas) to the wafer 200 in the processing chamber 201 as the reactive gas (step 3). In this case as well, the above-mentioned cycle is preferably repeated multiple numbers of times.

FIG. 6B shows an example of forming the SiBCN film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3 thereafter.

Thus, the ratio of a silicon component, a nitrogen component, and a carbon component to a boron component in the SiBCN film can be properly controlled by setting the first step and the second step as one cycle and performing the cycle of these steps prescribed number of times, wherein the first step is the step of performing the set of the steps 1 and 2 with these steps as one set, and the second step is the step of performing step 3, and the controllability of the composition ratio of the SiBCN film can be improved.

By increasing the number of sets (m) of the set constituted by step 1 and step 2, the absolute amounts of the silicon component, the nitrogen component, and the carbon component in the first layer can be increased, and by modifying in step 3 the first layer in which the absolute amount of each component is thus increased, the ratio of the silicon component, the nitrogen component, and the carbon component to the boron component in the SiBCN layer can be controlled toward the rich state, and the ratio of the silicon component, the nitrogen component, and the carbon component to the boron component in the finally formed SiBCN film can be controlled toward the rich state.

Meanwhile, by decreasing the number of sets (m) of the set constituted by step 1 and step 2, the absolute amounts of the silicon component, the nitrogen component, and the carbon component in the first layer can be decreased, and thus by modifying the first layer in which the absolute amount of each component is thus decreased in step 3, the ratio of the silicon component, the nitrogen component, and the carbon component to the boron component in the SiBCN layer can be controlled toward a poor state, and the ratio of the silicon component, the nitrogen component, and the carbon component to the boron component in the finally formed SiCBCN film can be controlled toward the poor state.

Further, by increasing the number of sets (m) of the set constituted by step 1 and step 2, the number of layers of the first layer formed per one cycle, namely, the thickness of the first layer formed per one cycle can be increased by the number of sets (m), and the cycle rate (the thickness of the SiBCN layer formed per unit cycle) can be improved. Thus, the film formation rate (the film thickness of the SiBCN film formed per unit time) can also be improved.

When the film formation processing of forming the SiBCN film having a prescribed composition and a prescribed film thickness is performed, the gas purge, inert gas substitution, return to the atmosphere, boat unloading, and wafer discharge are performed similarly to the first sequence.

(Fifth Sequence)

A fifth sequence of this embodiment will be described next.

Figure 7A:
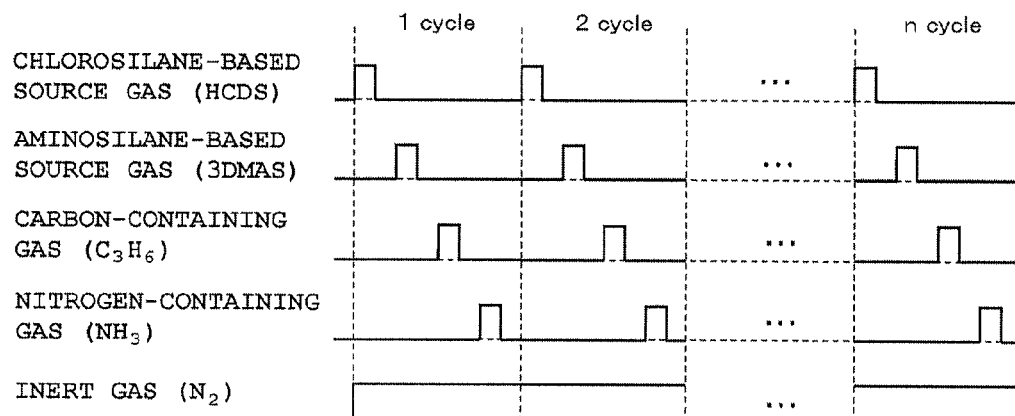
FIG. 7A is a view showing a timing of gas supply in a fifth sequence of this embodiment.
Figure 7B:
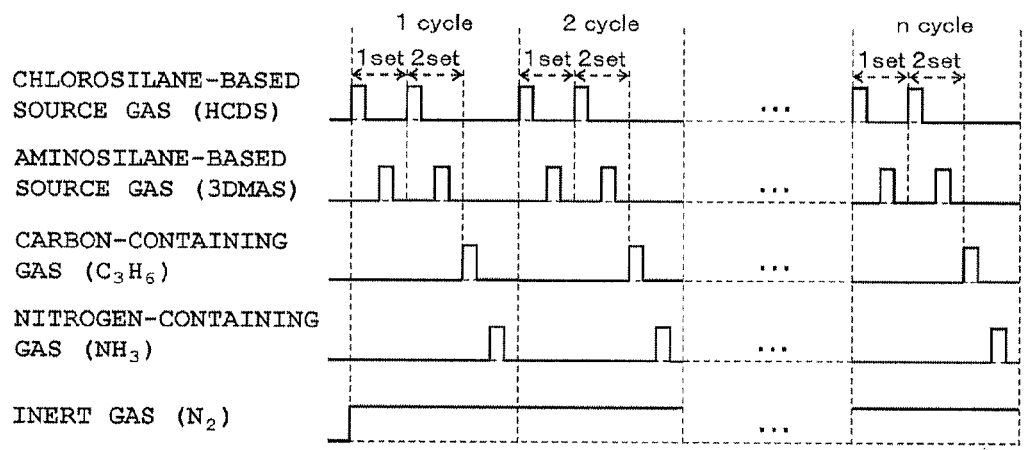
FIG. 7B is a view showing the timing of the gas supply in the fifth sequence of this embodiment.

FIG. 7A is a view showing the timing of the gas supply in the fifth sequence of this embodiment, and FIG. 7B is a view showing the timing of the gas supply in a modified example of the fifth sequence of this embodiment.

In the fifth sequence of this embodiment, a silicon carbonitride film is formed by performing the following steps alternately prescribed number of times:

supplying the chlorosilane-based source to the wafer 200 in the processing chamber 201, and thereafter supplying the aminosilane-based source thereto, to form the first layer containing silicon, nitrogen, and carbon on the wafer 200; and supplying thermally activated carbon-containing gas to the wafer 200 in the processing chamber 201 as the reactive gas, and thereafter supplying thermally activated nitrogen-containing gas thereto as the reactive gas, to modify the first layer and form a silicon carbonitride layer as a second layer.

In forming the second layer, the thermally activated carbon-containing gas is supplied to the wafer 200 in the processing chamber 201, to make the carbon-containing gas adsorbed on the first layer, and thereafter the thermally activated nitrogen-containing gas is supplied to the wafer 200 in the processing chamber 201 to modify the layer with the carbon-containing gas chemically adsorbed on the first layer, and form the silicon carbonitride layer.

The fifth sequence of this embodiment will be more specifically described hereafter. Here, explanation will be given for an example of forming the silicon corbonitride film (SiCN film) being the insulating film on the substrate by the sequence of FIGS. 7A-7B, using the HCDS gas as the chlorosilane-based source gas, and the 3DMAS gas as the aminosilane-based source gas, and $C_3H_6$ gas as the carbon-containing gas.

The wafer charge, boat loading, pressure adjustment, temperature adjustment, and wafer rotation are similarly performed as the first sequence. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is similarly performed as the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 2 to cause a reaction between the silicon-containing layer and the 3DMAS gas, to thereby form the first layer containing Si, N, and C.

[Step 3]

Step 3 is performed similarly to the step 3 of the second sequence. Namely, the processing conditions, the reaction to be caused, and the layer to be formed, etc., in step 3 are the same as those of the step 3 of the second sequence.

In step 3, the chemical adsorption layer of $C_3H_6$, namely the chemical adsorption layer made of a substance ($C_xH_y$) which is a decomposition of $C_3H_6$ is preferably formed on the first layer containing Si, N, and C formed on the wafer 200 in step 2. Here, the chemical adsorption layer of $C_xH_y$ needs to be a discontinuous chemical adsorption layer of $C_xH_y$ molecules. Note that when the chemical adsorption layer of $C_xH_y$ formed on the first layer is the discontinuous layer, for example when the discontinuous chemical adsorption layer of $C_xH_y$ is formed on the first layer, with an adsorption state on the first layer of $C_xH_y$ set in a saturation state, a surface of the first layer is covered with the chemical adsorption layer of $C_xH_y$ entirely. In this case, silicon does not exist on the surface of the layer with $C_xH_y$ chemically adsorbed on the first layer, thus making it difficult to perform nitriding of this layer in step 4 as will be described later. This is because although nitrogen is bonded to silicon, it is not bonded to carbon. In order to cause a desired nitriding reaction in step 4 as will be described later, the adsorption state on the first layer of $C_xH_y$ needs to be set in the unsaturated state, which is a state in which silicon is exposed to the surface of this layer.

In order to set the adsorption state on the first layer of $C_xH_y$ in the unsaturated state, the processing conditions in step 3 may be the same as the processing conditions in the step 3 of the second sequence. However, by using the following processing conditions in step 3, the adsorption state on the first layer of $C_xH_y$ is easily set in the unsaturated state.

Wafer temperature: 500 to 650° C.
Pressure in the processing chamber: 133 to 2666 Pa
Partial pressure of the $C_3H_6$ gas: 33 to 2515 Pa
$C_3H_6$ gas supply flow rate: 1000 to 5000 sccm $N_2$ gas supply flow rate: 300 to 3000 sccm $C_3H_6$ gas supply time: 6 to 60 seconds When the $C_3H_6$ gas is thermally activated and is flowed into the processing chamber 201 to make $C_xH_y$ chemically adsorbed on the first layer, the ratio of the C-component in the entire body of this layer is increased by a chemical adsorption portion of the $C_xH_y$ on the first layer. Namely, the composition ratio can be varied in a direction of increasing the carbon concentration. Further, at this time, the ratio of the C-component in the layer with $C_xH_y$ chemically adsorbed on the first layer, namely the carbon concentration can be controlled (finely adjusted) by controlling the processing conditions such as the pressure in the processing chamber 201 and the gas supply time. Thus, the composition ratio of the SiCN layer formed in step 4 can be more strictly controlled.

[Step 4]

Step 4 is performed similarly to the step 3 of the first sequence. Namely, the processing conditions, the reaction to be caused, and the layer to be formed, etc., in step 4 are the same as those of the step 3 of the first sequence.

Note that in step 4, the $NH_3$ gas is thermally activated without being plasma-excited and is supplied into the processing chamber 201. At this time, the gas flowed into the processing chamber 201 is the thermally activated $NH_3$ gas, and none of the HCDS gas and the 3DMAS gas and the $C_3H_6$ gas is flowed into the processing chamber 201. Accordingly, the $NH_3$ gas does not cause the vapor phase reaction, and the activated $NH_3$ gas is reacted with at least a part of the layer with $C_xH_y$ chemically adsorbed on the first layer, which is formed on the wafer 200 in step 3. Thus, this layer is nitrided and is modified to the second layer including the silicon carbonitride layer (SiCN layer).

Note that when the $NH_3$ gas is thermally activated and is flowed into the processing chamber 201, to modify the layer with $C_xH_y$ chemically adsorbed on the first layer to the SiCN layer, this layer is modified to the SiCN layer while increasing the ratio of the N-component in this layer. At this time, by the thermal nitriding action of the $NH_3$ gas, Si—N bond in this layer is increased and meanwhile Si—C bond and Si—Si bond are reduced, and the ratio of the C-component and the ratio of the Si-component in this layer are reduced. Namely, the layer with $C_xH_y$ chemically adsorbed on the first layer can be modified to the SiCN layer while varying the composition ratio in a direction of increasing the nitrogen concentration and in a direction of reducing the carbon concentration and the silicon concentration. Further, the processing conditions such as the pressure in the processing chamber 201 and the gas supply time are controlled to finely adjust the ratio of the N-component, namely the nitrogen concentration in the SiCN layer. Thus, the composition ratio of the SiCN layer can be more strictly controlled.

At this time, the nitriding reaction of the layer with $C_xH_y$ chemically adsorbed on the first layer is preferably not to be saturated. Namely, a part of the layer is preferably nitrided. In this case, nitriding is performed under a condition that the nitriding reaction of this layer is unsaturated, so that the entire body of this layer is not nitrided. Note that in order to make the unsaturated state of the nitriding reaction of the layer with $C_xH_y$ chemically adsorbed on the first layer, the processing conditions in step 4 may be the same as the processing conditions in the step 3 of the first sequence.

The aforementioned steps 1 to 4 are set as one cycle, and by performing this cycle one or more number of times (prescribe number of times), the silicon carbonitride film (SiCN film) having a prescribed composition and a prescribed film thickness can be formed on the wafer 200. Note that the aforementioned cycle is preferably repeated multiple number of times as shown in FIG. 7A.

A SiCN film having a prescribed film thickness may be formed on the wafer 200, by setting a first step and a second step as one cycle, and performing a cycle of the first step and the second step prescribed number of times, wherein the first step is the step of alternately performing a set of step 1 and step 2 prescribed number of times with these steps as one set, and the second step is the step of performing step 3 and step 4.

Namely, the SiCN film having a prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon, and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of chemically adsorbing a carbon-containing gas on the first layer by supplying a thermally activated carbon-containing gas ($C_3H_6$ gas) to the wafer 200 in the processing chamber 201 as the reactive gas (step 3) and the step of forming a SiCN layer as the second layer by modifying the layer in which the carbon-containing gas is chemically adsorbed on the first layer by supplying the thermally activated nitrogen-containing gas ($NH_3$ gas) to the wafer 200 in the processing chamber 201 as the reactive gas (step 4). In this case as well, the above-mentioned cycle is preferably repeated multiple numbers of times.

FIG. 7B shows an example of forming the SiCN film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3 and step 4 thereafter.

Thus, the ratio of a silicon component and a nitrogen component to a carbon component, and the ratio of the silicon component and the carbon component to the nitrogen component in the SiCN film can be properly controlled by setting a first step and a second step as one cycle and performing the cycle of these steps prescribed number of times, wherein the first step is the step of performing the set of the steps 1 and 2 with these steps as one set, and the second step is the step of performing step 3 and step 4, and the controllability of the composition ratio of the SiCN film can be improved.

By increasing the number of sets (m) of the set constituted by step 1 and step 2, absolute amounts of the silicon component, the nitrogen component, and the carbon component in the first layer can be increased, and by modifying in step 3 and in step 4 the first layer in which the absolute amount of each component is thus increased, the ratio of the silicon component and the nitrogen component to the carbon component, and the ratio of the silicon component and the carbon component to the nitrogen component in the SiCN layer can be controlled toward the rich state, and the ratio of the silicon component and the nitrogen component to the carbon component, and the ratio of the silicon component and the carbon component to the nitrogen component in the finally formed SiCN film can be controlled toward the rich state.

Meanwhile, by decreasing the number of sets (m) of the set constituted by step 1 and step 2, the absolute amounts of the silicon component, the nitrogen component, and the carbon component in the first layer can be decreased, and thus by modifying the first layer in which the absolute amount of each component is decreased in step 3 and step 4, the ratio of the silicon component and the nitrogen component to the carbon component, and the ratio of the silicon component and the carbon component to the nitrogen component in the SiCN layer can be controlled toward a poor state, and the ratio of the silicon component and the nitrogen component to the carbon component, and the ratio of the silicon component and the carbon component to the nitrogen component in the finally formed SiCN film can be controlled toward the poor state.

Further, by increasing the number of sets (m) of the set constituted by step 1 and step 2, the number of layers of the first layer formed per one cycle, namely, the thickness of the first layer formed per one cycle can be increased by the number of sets (m), and a cycle rate (the thickness of the SiCN layer formed per unit cycle) can be improved. Thus, the film formation rate (the film thickness of the SiCN film formed per unit time) can also be improved.

When the film formation processing of forming the SiCN film having a prescribed composition and a prescribed film thickness is performed, the gas purge, inert gas substitution, return to the atmosphere, boat unloading, and wafer discharged are performed similarly to the first sequence.

(Sixth Sequence)

A sixth sequence of this embodiment will be described next.

Figure 8A:
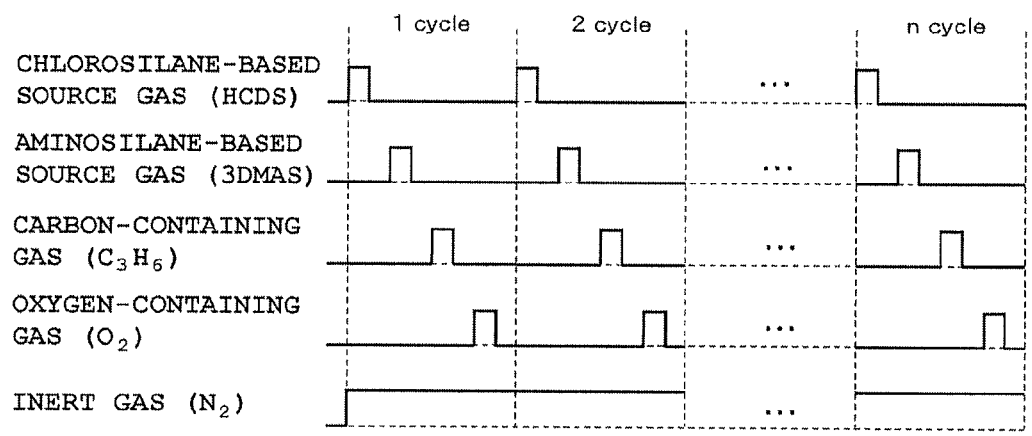
FIG. 8A is a view showing a timing of gas supply in a sixth sequence of this embodiment.
Figure 8B:
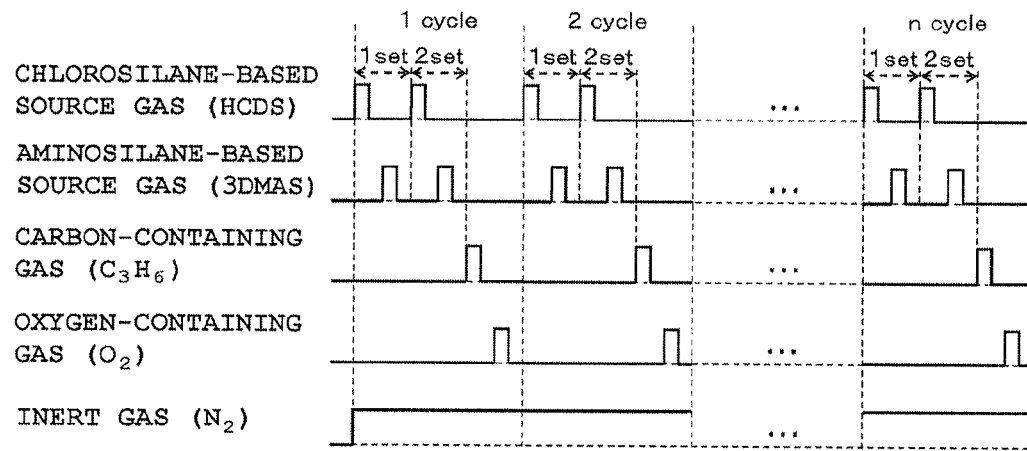
FIG. 8B is a view showing the timing of the gas supply in a modified example of the sixth sequence of this embodiment.

FIG. 8A is a view of the timing of the gas supply in the sixth sequence of this embodiment, and FIG. 8B is a view showing the timing of the gas supply in a modified example of the sixth sequence of this embodiment.

In the sixth sequence of this embodiment, a silicon oxycarbonitride film having a prescribed composition and a prescribed film thickness, is formed on the wafer 200 by alternately performing prescribed number of times, supplying the chlorosilne source to the wafer 200 in the processing chamber, and thereafter supplying the aminosilane-based source thereto, to form the first layer containing silicon, nitrogen, and carbon on the wafer 200; and supplying the thermally activated carbon-containing gas to the wafer 200 in the processing chamber 201 as the reactive gas, and thereafter supplying the thermally activated oxygen-containing gas thereto as the reactive gas, to modify the first layer and form the silicon oxycarbonitride layer as the second layer.

In forming the second layer, the thermally activated carbon-containing gas is supplied to the wafer 200 in the processing chamber 201, to chemically adsorb the carbon-containing gas on the first layer, and thereafter the thermally activated oxygen-containing gas is supplied to the wafer 200 in the processing chamber 201, to modify the layer with the carbon-containing gas chemically adsorbed on the first layer and form the silicon oxycarbonitride layer.

The sixth sequence of this embodiment will be specifically described hereafter. Here, explanation will be given for a case that the HCDS gas is used as the chlorosilane-based source gas, and the 3DMAS gas is used as the aminosilane-based source gas, $C_3H_6$ gas is used as the carbon-containing gas, and the $O_2$ gas is used as the oxygen-containing gas, to thereby form the silicon oxycarbonitride film (SiOCN film) on the substrate as the insulating film, by the sequence of FIGS. 8A-8B.

The wafer charge, boat loading, pressure adjustment, temperature adjustment, and wafer rotation are similarly performed as the first sequence. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 201, to cause the reaction between the silicon-containing layer and the 3DMAS gas, and form the first layer containing Si, N, and C.

[Step 3]

Step 3 is performed similarly to the step 3 of the fifth sequence. Namely, the processing conditions, the reaction to be caused, the layer to be formed, and a method for controlling the carbon concentration, etc., in step 3 are the same as those of the step 3 of the fifth sequence. Namely, in this step, the $C_3H_6$ gas is supplied into the processing chamber 201, to chemically adsorb the $C_xH_y$ on the first layer.

[Step 4]

Step 4 is performed similarly to the step 3 of the third sequence. Namely, the processing conditions, the reaction to be caused, and the layer to be formed, etc., are the same as those of the step 3 of the third sequence.

In step 4, the $O_2$ gas is thermally activated and supplied into the processing chamber 201 without being plasma-excited. At this time, the gas flowed into the processing chamber 201 is the thermally activated $O_2$ gas, and neither the HCDS gas nor the 3DMAS gas is flowed into the processing chamber 201. Accordingly, the $O_2$ gas does not cause the vapor phase reaction, and the activated $O_2$ gas is reacted with at least a part of the layer with $C_xH_y$ chemically adsorbed on the first layer, which is the layer formed on the wafer 200 in step 3. Thus, this layer is oxidized and is modified to the second layer including the silicon oxycarbonitride layer (SiOCN layer).

Note that when the $O_2$ gas is thermally activated and flowed into the processing chamber 201, to thermally oxidize the layer with $C_xH_y$ chemically adsorbed on the first layer and modify this layer to the SiOCN layer, this layer is modified to the SiOCN layer while adding the O-component to this layer. At this time, by the thermal oxidizing action by the $O_2$ gas, Si—O bond is increased and meanwhile Si—N bond, Si—C bond, and Si—Si bond are reduced in this layer, and the ratio of the N-component, the ratio of the C-component and the ratio of the Si component in this layer are reduced. Namely, the layer with CA chemically adsorbed on the first layer can be modified to the SiOCN layer while varying the composition ratio in a direction of increasing the oxygen concentration and in a direction of reducing the nitrogen concentration, the carbon concentration, and the silicon concentration. Further, the processing conditions such as the pressure in the processing chamber 201 and the gas supply time are controlled, to thereby finely adjust the ratio of the O-component, namely the oxygen concentration in the SiOCN layer. Thus, the composition ratio of the SiOCN layer can be more strictly controlled.

At this time, the oxidation reaction of the layer with CA chemically adsorbed on the first layer, is preferably not saturated. Namely, a part of this layer is preferably oxidized. In this case, oxidation is performed under a condition that the oxidation reaction of this layer is unsaturated, so that the entire body of this layer is not oxidized. Note that in order to set the oxidation reaction of the layer with $C_xH_y$ chemically adsorbed on the first layer in the unsaturated state, the processing conditions in step 4 may be the same as the processing conditions in the step 3 of the third sequence.

The aforementioned steps 1 to 4 are set as one cycle, and by performing this cycle one or more number of times (prescribe number of times), a silicon oxycarbonitride film (SiOCN film) having the prescribed composition and the prescribed film thickness can be formed on the wafer 200. Note that the aforementioned cycle is preferably repeated multiple numbers of times as shown in FIG. 8A.

A SiOCN film having a prescribed film thickness may be formed on the wafer 200, by setting a first step and a second step as one cycle, and alternately performing a cycle of the first step and the second step prescribed number of times, wherein the first step is the step of alternately performing a set of step 1 and step 2 prescribed number of times with these steps as one set, and the second step is the step of performing step 3 and step 4.

Namely, the SiOCN film having a prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of chemically adsorbing the carbon-containing gas on the first layer by supplying a thermally activated carbon-containing gas ($C_3H_6$ gas) to the wafer 200 in the processing chamber 201 as the reactive gas (step 3), and the step of forming the SiOCN layer as the second layer by modifying the layer in which a carbon-containing gas is chemically adsorbed on the first layer by supplying a thermally activated oxygen-containing gas ($O_2$ gas) to the wafer 200 in the processing chamber 201 as the reactive gas (step 4). In this case as well, the above-mentioned cycle is preferably repeated multiple numbers of times.

FIG. 8B shows an example of forming the SiOCN film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3 and step 4 thereafter.

Thus, the ratio of a silicon component and a nitrogen component to a carbon component, and the ratio of the silicon component, the nitrogen component, and the carbon component to the oxygen component in the SiOCN film can be properly controlled by setting the first step and the second step as one cycle and performing the cycle of these steps prescribed number of times, wherein the first step is the step of performing the set of the steps 1 and 2 with these steps as one set, and the second step is the step of performing step 3 and step 4, and the controllability of the composition ratio of the SiOCN film can be improved.

By increasing the number of sets (m) of the set constituted by step 1 and step 2, the absolute amounts of the silicon component, the nitrogen component, and the carbon component in the first layer can be increased, and by modifying in step 3 and in step 4 the first layer in which the absolute amount of each component is thus increased, the ratio of the silicon component and the nitrogen component to the carbon component, and the ratio of the silicon component, the nitrogen component, and the carbon component to the oxygen component in the SiOCN layer can be controlled toward a rich state, and the ratio of the silicon component and the nitrogen component to the carbon component, and the ratio of the silicon component, the nitrogen component, and the carbon component to the oxygen component in the finally formed SiOCN film can be controlled toward the rich state.

Meanwhile, by decreasing the number of sets (m) of the set constituted by step 1 and step 2, the absolute amounts of the silicon component, the nitrogen component, and the carbon component in the first layer can be decreased, and thus by modifying the first layer in which the absolute amount of each component is decreased in step 3 and step 4, the ratio of the silicon component and the nitrogen component to the carbon component, and the ratio of the silicon component, the nitrogen component, and the carbon component to the oxygen component in the SiOCN layer can be controlled toward a poor state, and the ratio of the silicon component and the nitrogen component to the carbon component, and the ratio of the silicon component, the nitrogen component, and the carbon component to the oxygen component in the finally formed SiOCN film can be controlled toward the poor state.

Further, by increasing the number of sets (m) of the set constituted by step 1 and step 2, the number of layers of the first layer formed per one cycle, namely, the thickness of the first layer formed per one cycle can be increased by the number of sets (m), and the cycle rate (the thickness of the SiOCN layer formed per unit cycle) can be improved. Thus, the film formation rate (the film thickness of the SiOCN film formed per unit time) can also be improved.

When the film formation processing of forming the SiOCN film having a prescribed composition and a prescribed film thickness is performed, gas purge, inert gas substitution, return to the atmosphere, boat unloading, and wafer discharge, are performed similarly to the first sequence.

(Seventh Sequence)

A seventh sequence of this embodiment will be described next.

Figure 9A:
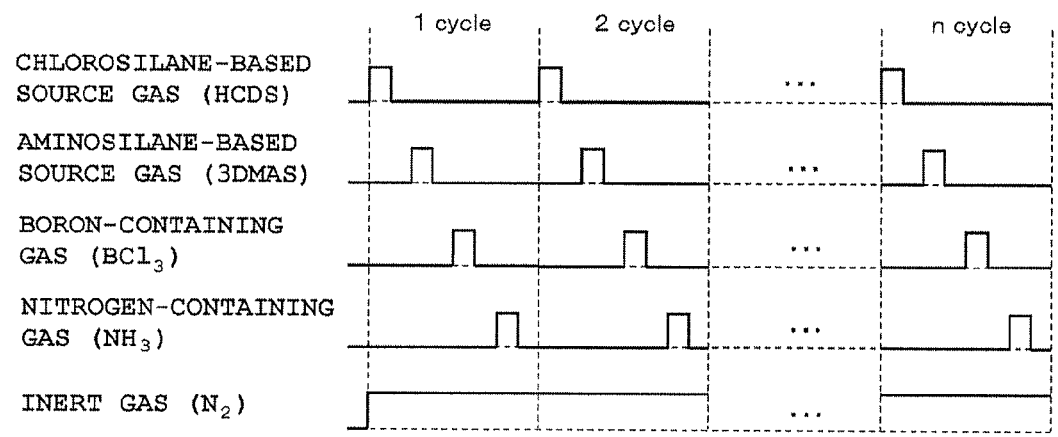
FIG. 9A is a view showing a timing of gas supply in a seventh sequence of this embodiment.
Figure 9B:
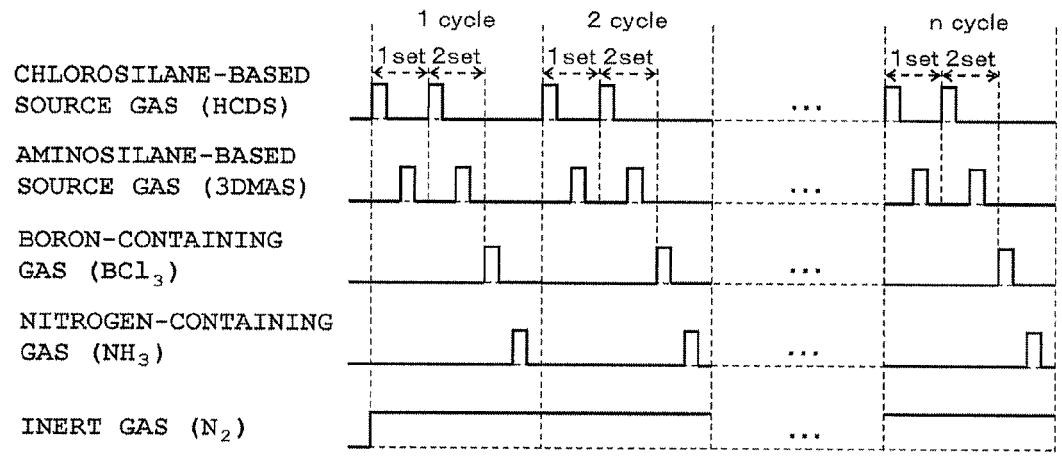
FIG. 9B is a view showing the timing of the gas supply in the seventh sequence of this embodiment.

FIG. 9A is a view of the timing of the gas supply in the seventh sequence of this embodiment, and FIG. 9B is a view showing the timing of the gas supply in a modified example of the seventh sequence of this embodiment.

In the seventh sequence of this embodiment, a silicon boron carbonitride film having a prescribed composition and a prescribed film thickness, is formed on the wafer 200 by alternately performing the following steps prescribed number of times, supplying the chlorosilane-based source to the wafer 200 in the processing chamber 201, and thereafter supplying the aminosilane-based source thereto, to form the first layer containing silicon, nitrogen, and carbon on the wafer 200; and supplying the thermally activated boron-containing gas to the wafer 200 in the processing chamber 201 as the reactive gas, and thereafter supplying the thermally activated nitrogen-containing gas thereto as the reactive gas, to modify the first layer and form the silicon boron carbonitride layer as the second layer.

In forming the second layer, the thermally activated boron-containing gas is supplied to the wafer 200 in the processing chamber 201 to chemically adsorb the boron-containing gas on the first layer, and thereafter the thermally activated nitrogen-containing gas is supplied to the wafer 200 in the processing chamber to modify the layer with boron-containing gas chemically adsorbed on the first layer, and form the silicon boron carbonitride layer.

The seventh sequence of this embodiment will be more specifically described hereafter. Here, explanation is given for a case that the HCDS gas is used as the chlorosilane-based source gas, the 3DMAS gas is used as the aminosilane-based source gas, the $BCl_3$ gas is used as boron-containing gas, and the $NH_3$ gas is used as the nitrogen-containing gas, to form the silicon boron carbonitride film (SiBCN film) on the substrate as the insulating film by the sequence of FIGS. 9A-9B.

The wafer charge, boat loading, pressure adjustment, temperature adjustment, and wafer rotation are similarly performed as the first sequence. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the silicon-containing layer and the 3DMAS gas are reacted by supplying the 3DMAS gas into the processing chamber 201, to form the first layer containing Si, N, and C.

[Step 3]

Step 3 is performed similarly to the step 3 of the fourth sequence. Namely, the processing conditions, the reaction to be caused, and the layer to be formed, etc., in step 3 are the same as those of the step 3 of the fourth sequence.

In step 3, the chemical adsorption layer of $BCl_3$, namely the chemical adsorption layer made of a substance ($B_xCl_y$) which is a decomposition of $BCl_3$ is preferably formed on the first layer containing Si, N, and C formed on the wafer 200 in step 2. Here, boron is bonded to silicon but is not bonded to carbon, and therefore the chemical adsorption layer of $B_xCl_y$ is a discontinuous chemical adsorption layer of $B_xCl_y$ molecules.

Note that when the $BCl_3$ gas is thermally activated and is flowed into the processing chamber 201, to chemically adsorb the $B_xCl_y$ on the first layer, the B-component is added by a chemical adsorption portion of the $B_xCl_y$ on the first layer. Namely, the composition ratio can be varied in a direction of increasing the boron concentration. Further, at this time, the processing conditions such as the pressure in the processing chamber 201 and the gas supply time are controlled to thereby control (finely adjust) the ratio of the B-component in the layer with $B_xCl_y$ chemically adsorbed on the first layer, namely control the boron concentration. Thus, the composition ratio of the SiBCN layer formed in step 4 can be more strictly controlled.

[Step 4]

Step 4 is performed similarly to the step 4 of the fifth sequence. Namely, the processing conditions, etc., in step 4 are the same as those of the step 4 of the fifth sequence. However, step 4 is slightly different from the step 4 of the fifth sequence, in the reaction to be caused and the layer to be formed.

In step 4, the $NH_3$ gas is thermally activated and is supplied into the processing chamber 201 without being plasma-excited. At this time, the gas flowed into the processing chamber 201 is the thermally activated $NH_3$ gas, and none of the HCDS gas, 3DMAS gas, and the $BCl_3$ gas is flowed into the processing chamber 201. Accordingly, the $NH_3$ gas does not cause the vapor phase reaction, and the activated $NH_3$ gas is reacted with at least a part of the layer with $B_xCl_y$ chemically adsorbed on the first layer, which is the layer formed on the wafer 200 in step 3. Thus, this layer is nitrided and is modified to the second layer including the silicon boron carbonitride layer (SiBCN layer).

Note that when the $NH_3$ gas is thermally activated and is flowed into the processing chamber 201, to thermally nitride the layer with $B_xCl_y$ chemically adsorbed on the first layer, and modify it to the SiBCN layer, this layer is modified to the SiBCN layer while increasing the ratio of the N-component in this layer. At this time, by the thermal nitriding action of the $NH_3$ gas, Si—N bond in this layer is increased and meanwhile Si—B bond, Si—C bond, and Si—Si bond are reduced, and the ratio of the B-component, the ratio of the C-component, and the ratio of the Si-component in this layer are reduced. Namely, the layer with $B_xCl_y$ chemically adsorbed on the first layer can be modified to the SiBCN layer while varying the composition ratio in a direction of increasing the nitrogen concentration, and in a direction of reducing the boron concentration, the carbon concentration, and the silicon concentration. Further, at this time, the processing conditions such as the pressure in the processing chamber 201 and the gas supply time are controlled to finely adjust the ratio of the N-component, namely the nitrogen concentration in the SiBCN layer. Thus, the composition ratio of the SiBCN layer can be more strictly controlled.

Note that at this time, the nitriding reaction of the layer with $B_xCl_y$ chemically adsorbed on the first layer, is preferably not to be saturated. Namely, a part of this layer is preferably not to be nitrided. In this case, nitriding is performed under a condition the nitriding reaction of this layer is unsaturated so that the entire body of this layer is not nitrided. Note that in order to unsaturate the nitriding reaction of the layer with $B_xCl_y$ chemically adsorbed on the first layer, the processing conditions in step 4 may be the same as the processing conditions in the step 4 of the fifth sequence (step 3 of the first sequence).

The aforementioned steps 1 to 4 are set as one cycle, and by performing this cycle one or more number of times (prescribe number of times), a silicon boron carbonitride film (SiBCN film) having a prescribed composition and a prescribed film thickness can be formed on the wafer 200. Note that the aforementioned cycle is preferably repeated multiple number of times as shown in FIG. 9A.

A SiBCN film having a prescribed film thickness may be formed on the wafer 200, by setting a first step and a second step as one cycle, and alternately performing a cycle of the first step and the second step prescribed number of times, wherein the first step is the step of alternately performing a set of step 1 and step 2 prescribed number of times with these steps as one set, and the second step is the step of performing step 3 and step 4.

Namely, the SiBCN film having a prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of chemically adsorbing a boron-containing gas on the first layer by supplying a thermally activated boron-containing gas ($BCl_3$ gas) to the wafer 200 in the processing chamber 201 as the reactive gas (step 3) and the step of forming the SiBCN layer as the second layer by modifying the layer in which the boron-containing gas is chemically adsorbed on the first layer by supplying a thermally activated nitrogen-containing gas ($NH_3$ gas) to the wafer 200 in the processing chamber 201 as the reactive gas (step 4). In this case as well, the above-mentioned cycle is preferably repeated multiple numbers of times.

FIG. 9B shows an example of forming the SiBCN film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3 and step 4 thereafter.

Thus, the ratio of a silicon component, a nitrogen component, and a carbon component to the boron component, and the ratio of the silicon component and the carbon component to the nitrogen component in the SiBCN film can be properly controlled by setting the first step and the second step as one cycle and performing the cycle of these steps prescribed number of times, wherein the first step is the step of performing the set of the steps 1 and 2 with these steps as one set, and the second step is the step of performing step 3 and step 4, and the controllability of the composition ratio of the SiBCN film can be improved.

By increasing the number of sets (m) of the set constituted by step 1 and step 2, the absolute amounts of the silicon component, the nitrogen component, and the carbon component in the first layer can be increased, and by modifying in step 3 and in step 4 the first layer in which the absolute amount of each component is thus increased, the ratio of the silicon component, the nitrogen component, and the carbon component to the boron component, and the ratio of the silicon component and the carbon component to the nitrogen component in the SiBCN layer can be controlled toward a rich state, and the ratio of the silicon component, the nitrogen component, and the carbon component to the boron component, and the ratio of the silicon component and the carbon component to the nitrogen component in the finally formed SiBCN film can be controlled toward the rich state.

Meanwhile, by decreasing the number of sets (m) of the set constituted by step 1 and step 2, the absolute amounts of the silicon component, the nitrogen component, and the carbon component in the first layer can be decreased, and thus by modifying the first layer in which the absolute amount of each component is decreased in step 3 and step 4, the ratio of the silicon component, the nitrogen component, and the carbon component to the boron component, and the ratio of the silicon component and the carbon component to the nitrogen component in the SiBCN layer can be controlled toward a poor state, and the ratio of the silicon component, the nitrogen component, and the carbon component to the boron component, and the ratio of the silicon component and the carbon component to the nitrogen component in the finally formed SiBCN film can be controlled toward the poor state.

Further, by increasing the number of sets (m) of the set constituted by step 1 and step 2, the number of layers of the first layer formed per one cycle, namely, the thickness of the first layer formed per one cycle can be increased by the number of sets (m), and the cycle rate (the thickness of the SiBCN layer formed per unit cycle) can be improved. Thus, the film formation rate (the film thickness of the SiBCN film formed per unit time) can also be improved.

When the film formation processing of forming the SiBCN film having a prescribed composition and a prescribed film thickness is performed, the gas purge, inert gas substitution, return to the atmosphere, boat unloading, and wafer discharge, are performed similarly to the first sequence.

(Eighth Sequence)

An eighth sequence of this embodiment will be described next.

Figure 10A:
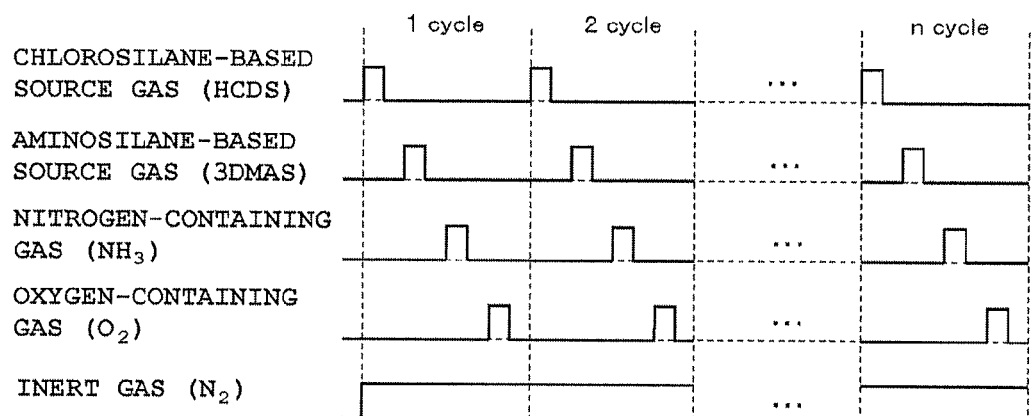
FIG. 10A is a view showing a timing of gas supply in an eighth sequence of this embodiment.
Figure 10B:
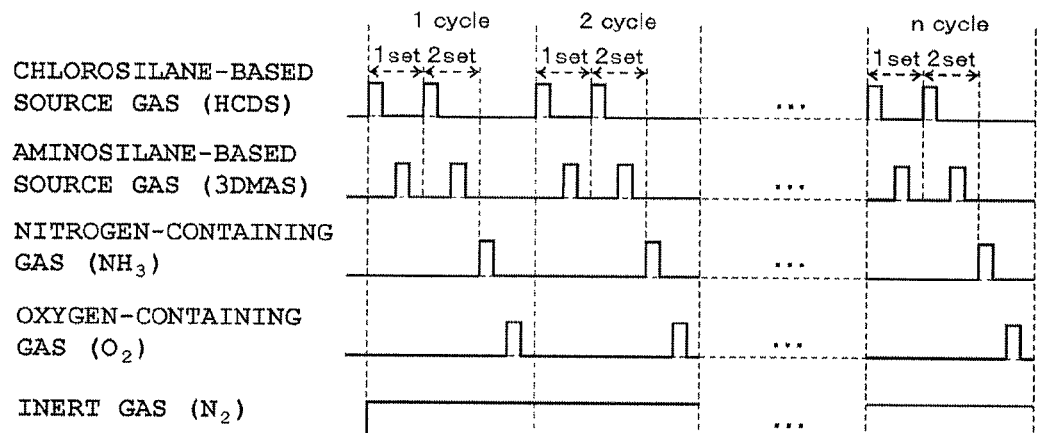
FIG. 10B is a view showing the timing of the gas supply in a modified example of the eighth sequence of this embodiment.

FIG. 10A is a view of the timing of the gas supply in the eighth sequence of this embodiment, and FIG. 10B is a view showing the timing of the gas supply in a modified example of the eighth sequence of this embodiment.

In the eighth sequence of this embodiment, the silicon oxycarbonitride film is formed on the wafer 200 by alternately performing the following steps prescribed number of times:

supplying the chlorosilane-based source to the wafer 200 in the processing chamber 201, and thereafter supplying the aminosilane-based source thereto, to form the first layer containing silicon, nitrogen, and carbon on the wafer 200; and supplying the thermally activated nitrogen-containing gas as the reactive gas, to the wafer 200 in the processing chamber 201, and thereafter supplying thereto the thermally activated oxygen-containing gas as reactive gases, to modify the first layer and form the silicon oxycarbonitride layer.

Note that in forming the second layer, the thermally activated nitrogen-containing gas is supplied to the wafer 200 in the processing chamber 201, to modify the first layer and form the silicon carbonitride layer, and thereafter the thermally activated oxygen-containing gas is supplied to the wafer 200 in the processing chamber 201, to modify the silicon carbonitride layer and form the silicon oxycarbonitride layer.

The eighth sequence of this embodiment will be more specifically described. Here, explanation is given for a case that the HCDS gas is used as the chlorosilane-based source gas, the 3DMAS gas is used as the aminosilane-based source gas, the $NH_3$ gas is used as nitrogen-containing gas, and the $O_2$ gas is used as the oxygen-containing gas, to thereby form the silicon oxycarbonitride film (SiOCN film) on the substrate as the insulating film by the sequence of FIGS. 10A-10B.

The wafer charge, boat loading, pressure adjustment, temperature adjustment, and wafer rotation are similarly performed as the first sequence. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the silicon-containing layer and the 3DMAS gas are reacted by supplying the 3DMAS gas into the processing chamber 201, to form the first layer containing Si, N, and C.

[Step 3]

Step 3 is performed similarly to the step 3 of the first sequence. Namely, the processing conditions, the reaction to be caused, and the layer to be formed, etc., in step 3 are the same as those of the step 3 of the first sequence. Note that in this step, the $NH_3$ gas is thermally activated and is flowed into the processing chamber 201 without being plasma-excited, to modify the first layer to the SiCN layer.

[Step 4]

Step 4 is performed similarly to the step 4 of the sixth sequence. Namely, the processing conditions, the reaction to be caused, and the layer to be formed, etc., in step 4 are the same as those of the step 4 of the sixth sequence.

Note that in step 4, the $O_2$ gas is thermally activated without being plasma-excited and is supplied into the processing chamber 201. At this time, the gas flowed into the processing chamber 201 is the thermally activated $O_2$ gas, and none of the HCDS gas, 3DMAS gas, and the $NH_3$ gas is flowed into the processing chamber 201. Accordingly, the $O_2$ gas does not cause the vapor phase reaction, and the activated $O_2$ gas is reacted with at least a part of the SiCN layer which is formed on the wafer 200 in step 3. Thus, the SiCN layer is oxidized and is modified to the second layer including the silicon oxycarbonitride layer (SiOCN layer).

Note that when the $O_2$ gas is thermally activated and is flowed into the processing chamber 201, to thermally oxidize the SiCN layer and modify it to the SiOCN layer, the SiCN layer is modified to the SiOCN layer while adding the O-component of the SiCN layer. Further, at this time, by the thermal oxidizing action of the $O_2$ gas, the Si—O bond in the SiCN layer is increased and meanwhile Si—N bond, Si—C bond, and Si—Si bond are reduced in the SiCN layer, and the ratio of the N-component, the ratio of the C-component, and the ratio of the Si-component in the SiCN layer are reduced. Namely, the SiCN layer and the SiOCN layer can be modified while varying the composition ratio in a direction of increasing the oxygen concentration, and in a direction of reducing the nitrogen concentration, the carbon concentration, and the silicon concentration. Further, at this time, the ratio of the O-component in the SiOCN layer, namely the oxygen concentration can be finely adjusted by controlling the processing conditions such as the pressure in the processing chamber 201 and the gas supply time. Thus the composition ratio of the SiOCN layer can be more strictly controlled.

In addition, at this time, the oxidizing reaction of the SiCN layer is preferably not to be saturated. Namely, a part of the SiCN layer is preferably not to be oxidized. In this case, oxidation is performed under a condition that the oxidizing reaction of the SiCN layer is unsaturated, so that the entire body of the SiCN layer is not oxidized. Note that in order to set the oxidizing reaction of the SiCN layer in the unsaturated state, the processing conditions in step 4 may be the same as the processing conditions in the step 4 of the sixth sequence (step 3 of the third sequence).

A silicon oxycarbonitride film (SiOCN film) having a prescribed film thickness and a prescribed film composition can be formed on the wafer 200, by setting the steps 1 to 4 as one cycle, and performing this cycle once or more (prescribed number of times). Note that the above-mentioned cycle is preferably repeated multiple numbers of times as shown in FIG. 10A.

A SiOCN film having a prescribed film thickness may be formed on the wafer 200, by setting a first step and a second step as one cycle, and alternately performing a cycle of the first step and the second step prescribed number of times, wherein the first step is the step of alternately performing a set of step 1 and step 2 prescribed number of times with these steps as one set, and the second step is the step of performing step 3 and step 4.

Namely, the SiOCN film having a prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of forming a SiCN layer by modifying the first layer by supplying a thermally activated nitrogen-containing gas ($NH_3$ gas) to the wafer 200 in the processing chamber 201 as the reactive gas (step 3), and the step of forming the SiOCN layer as the second layer by modifying the SiCN layer by supplying a thermally activated oxygen-containing gas ($O_2$ gas) to the wafer 200 in the processing chamber 201 as the reactive gas (step 4). In this case as well, the above-mentioned cycle is preferably repeated multiple numbers of times.

FIG. 10B shows an example of forming the SiOCN film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3 and step 4 thereafter.

Thus, the ratio of a silicon component and a carbon component to a nitrogen component, and the ratio of the silicon component, the nitrogen component, and the carbon component to the oxygen component in the SiOCN film can be properly controlled by setting the first step and the second step as one cycle and performing the cycle of these steps prescribed number of times, wherein the first step is the step of performing the set of the steps 1 and 2 with these steps as one set, and the second step is the step of performing step 3 and step 4, and the controllability of the composition ratio of the SiOCN film can be improved.

By increasing the number of sets (m) of the set constituted by step 1 and step 2, the absolute amounts of the silicon component, the nitrogen component, and the carbon component in the first layer can be increased, and by modifying in step 3 and in step 4 the first layer in which the absolute amount of each component is thus increased, the ratio of the silicon component and the carbon component to the nitrogen component, and the ratio of the silicon component, the nitrogen component, and the carbon component to the oxygen component in the SiOCN layer can be controlled toward a rich state, and the ratio of the silicon component and the carbon component to the nitrogen component, and the ratio of the silicon component, the nitrogen component, and the carbon component to the oxygen component in the finally formed SiOCN film can be controlled toward the rich state.

Meanwhile, by decreasing the number of sets (m) of the set constituted by step 1 and step 2, the absolute amounts of the silicon component, the nitrogen component, and the carbon component in the first layer can be decreased, and thus by modifying the first layer in which the absolute amount of each component is decreased in step 3 and step 4, the ratio of the silicon component and the carbon component to the nitrogen component, and the ratio of the silicon component, the nitrogen component, and the carbon component to the oxygen component in the SiOCN layer can be controlled toward a poor state, and the ratio of the silicon component and the carbon component to the nitrogen component, and the ratio of the silicon component, the nitrogen component, and the carbon component to the oxygen component in the finally formed SiOCN film can be controlled toward the poor side.

Further, by increasing the number of sets (m) of the set constituted by step 1 and step 2, the number of layers of the first layer formed per one cycle, namely, the thickness of the first layer formed per one cycle can be increased by the number of sets (m), and a cycle rate (the thickness of the SiOCN layer formed per unit cycle) can be improved. Thus, the film formation rate (the film thickness of the SiOCN film formed per unit time) can also be improved.

When the film formation processing of forming the SiOCN film having the prescribed composition and the prescribed film thickness is performed, the gas purge, inert gas substitution, return to the atmosphere, boat unloading, and wafer discharge, are performed similarly to the first sequence.

(Ninth Sequence)

A ninth sequence of this embodiment will be described next.

Figure 11A:
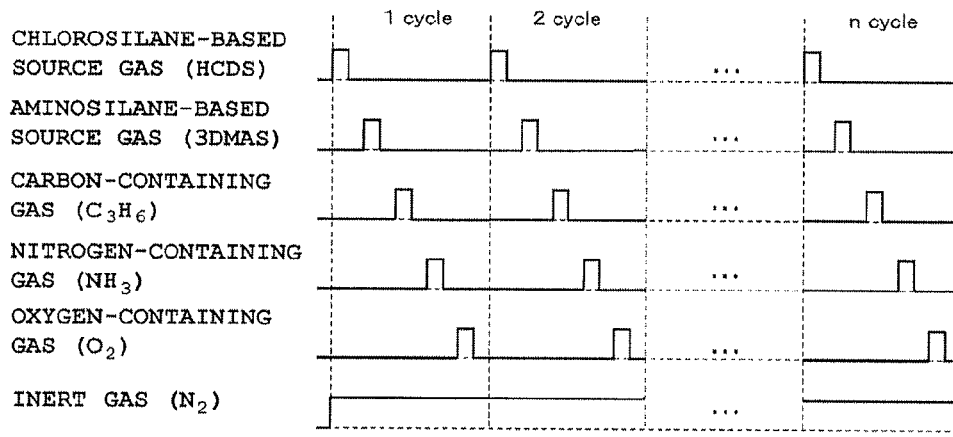
FIG. 11A is a view showing a timing of gas supply in a ninth sequence of this embodiment.
Figure 11B:
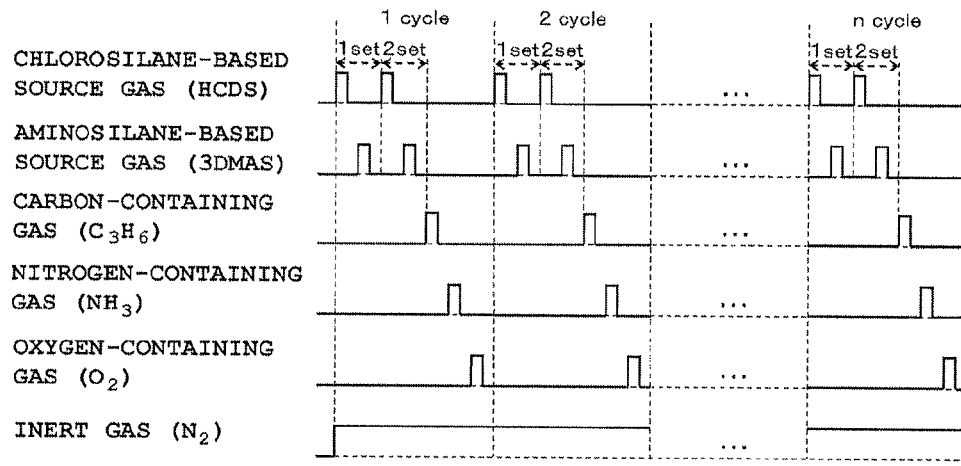
FIG. 11B is a view showing the timing of the gas supply in a modified example of the ninth sequence of this embodiment.

FIG. 11A is a view of the timing of the gas supply in the ninth sequence of this embodiment, and FIG. 11B is a view showing the timing of the gas supply in a modified example of the ninth sequence of this embodiment.

In the ninth sequence of this embodiment, a silicon oxycarbonitride film having a prescribed composition and a prescribed film thickness is formed on the wafer 200 by performing the following steps alternately prescribed number of times:

supplying the chlorosilane-based source to the wafer 200 in the processing chamber 201, and thereafter supplying the aminosilane-based source thereto, to form the first layer containing silicon, nitrogen, and carbon on the wafer 200; and supplying the thermally activated carbon-containing gas to the wafer 200 in the processing chamber 201, and thereafter supplying the thermally activated nitrogen-containing gas thereto as reactive gases, and thereafter supplying the thermally activated oxygen-containing gas as the reactive gas, to modify the first layer and form the silicon oxycarbonitride layer as the second layer.

Note that in forming the second layer, the thermally activated carbon-containing gas is supplied to the wafer 200 in the processing chamber 201, to make the carbon-containing gas chemically adsorbed on the first layer, and thereafter the thermally activated nitrogen-containing gas is supplied to the wafer 200 in the processing chamber 201, to modify the layer with the carbon-containing gas chemically adsorbed on the first layer, and form the silicon carbonitride layer, and thereafter the thermally activated oxygen-containing gas is supplied to the wafer 200 in the processing chamber 201, to modify the silicon carbonitride layer and form the silicon oxycarbonitride layer.

The ninth sequence of this embodiment will be more specifically described hereafter. Here, explanation is given for a case that the HCDS gas is used as the chlorosilane-based source gas, the 3DMAS gas is used as the aminosilane-based source gas, and $O_2$ gas is used as oxygen-containing gas, to form the silicon oxycarbonitride film (SiOCN film) on the substrate as the insulating film.

Processing is performed similarly to the first sequence, regarding the wafer charge, boat loading, pressure adjustment, temperature adjustment, and wafer rotation. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is similarly performed as the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 2 to cause a reaction between the silicon-containing layer and the 3DMAS gas, to form the first layer containing Si, N, and C.

[Step 3]

Step 3 is similarly performed as the step 3 of the fifth sequence. Namely, the processing conditions, the reaction to be caused, and the layer to be formed, etc., in step 3 are the same as those of the step 3 of the fifth sequence. Namely, in this step, $C_3H_6$ gas is supplied into the processing chamber 201, to make $C_xH_y$ chemically adsorbed on the first layer.

[Step 4]

Step 4 is similarly performed as the step 4 of the fifth sequence. Namely, the processing conditions, the reaction to be caused, and the layer to be formed, etc., in step 4 are the same as those of the step 4 of the fifth sequence. Namely, in this step, the $NH_3$ gas is supplied into the processing chamber 201, so that the layer with $C_xH_y$ chemically adsorbed on the first layer, is modified to the SiCN layer.

[Step 5]

Step 5 is similarly performed as the step 4 of the eighth sequence. Namely, the processing conditions, the reaction to be caused, and the layer to be formed, etc., in step 5 are the same as those of the step 4 of the eighth sequence. Namely, in this step, the $O_2$ gas is supplied into the processing chamber 201, to modify the SiCN layer and form the second layer including the SiOCN layer.

The aforementioned steps 1 to 5 are set as one cycle, and by performing this cycle one or more number of times (prescribe number of times), the silicon oxycarbonitride film (SiOCN film) having a prescribed composition and a prescribed film thickness can be formed on the wafer 200. Note that the aforementioned cycle is preferably repeated multiple number of times as shown in FIG. 11A.

A SiOCN film having a prescribed film thickness may be formed on the wafer 200, by setting a first step and a second step as one cycle, and alternately performing a cycle of the first step and the second step prescribed number of times, wherein the first step is the step of alternately performing a set of step 1 and step 2 prescribed number of times with these steps as one set, and the second step is the step of performing step 3, step 4, and step 5.

Namely, the SiOCN film having a prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of chemically adsorbing a carbon-containing gas on the first layer by supplying a thermally activated carbon-containing gas ($C_3H_6$ gas) to the wafer 200 in the processing chamber 201 as the reactive gas (step 3) and the step of forming a SiCN layer by modifying the layer in which the carbon-containing gas is chemically adsorbed on the first layer by supplying the thermally activated nitrogen-containing gas ($NH_3$ gas) to the wafer 200 in the processing chamber 201 as the reactive gas (step 4), and the step of forming a SiOCN layer as a second layer by modifying the SiCN layer by supplying a thermally activated oxygen-containing gas ($O_2$) gas to the wafer 200 in the processing chamber 201 as the reactive gas (step 5). In this case as well, the above-mentioned cycle is preferably repeated multiple numbers of times.

FIG. 11B shows an example of forming the SiOCN film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3, step 4, and step 5 thereafter.

Thus, the ratio of a silicon component and a nitrogen component to a carbon component, and the ratio of the silicon component and the carbon component to the nitrogen component in the SiOCN film can be properly controlled by setting the first step and the second step as one cycle and performing the cycle of these steps prescribed number of times, wherein the first step is the step of performing the set of the steps 1 and 2 with these steps as one set, and the second step is the step of performing step 3, step 4, and step 5, and the controllability of the composition ratio of the SiOCN film can be improved.

By increasing the number of sets (m) of the set constituted by step 1 and step 2, absolute amounts of the silicon component, the nitrogen component, and the carbon component in the first layer can be increased, and by modifying in step 3, step 4, and step 5 the first layer in which the absolute amount of each component is thus increased, the ratio of the silicon component and the nitrogen component to the carbon component, and the ratio of the silicon component and the carbon component to the nitrogen component in the SiOCN layer can be controlled toward a rich state, and the ratio of the silicon component and the nitrogen component to the carbon component, and the ratio of the silicon component and the carbon component to the nitrogen component in the finally formed SiOCN film can be controlled toward the rich state.

Meanwhile, by decreasing the number of sets (m) of the set constituted by step 1 and step 2, the absolute amounts of the silicon component, the nitrogen component, and the carbon component in the first layer can be decreased, and thus by modifying the first layer in which the absolute amount of each component is decreased in step 3, step 4, and step 5, the ratio of the silicon component and the nitrogen component to the carbon component, and the ratio of the silicon component and the carbon component to the nitrogen component in the SiOCN layer can be controlled toward a poor state, and the ratio of the silicon component and the nitrogen component to the carbon component, and the ratio of the silicon component and the carbon component to the nitrogen component in the finally formed SiOCN film can be controlled toward the poor state.

Further, by increasing the number of sets (m) of the set constituted by step 1 and step 2, the number of layers of the first layer formed per one cycle, namely, the thickness of the first layer formed per one cycle can be increased by the number of sets (m), and a cycle rate (the thickness of the SiOCN layer formed per unit cycle) can be improved. Thus, the film formation rate (the film thickness of the SiOCN film formed per unit time) can also be improved.

When the film formation processing of forming the SiOCN film having a prescribed composition and a prescribed film thickness is performed, gas purge, inert gas substitution, return to the atmosphere, boat unloading, and wafer discharge, are performed similarly to the first sequence.

(Tenth Sequence)

A tenth sequence of this embodiment will be described next.

Figure 12A:
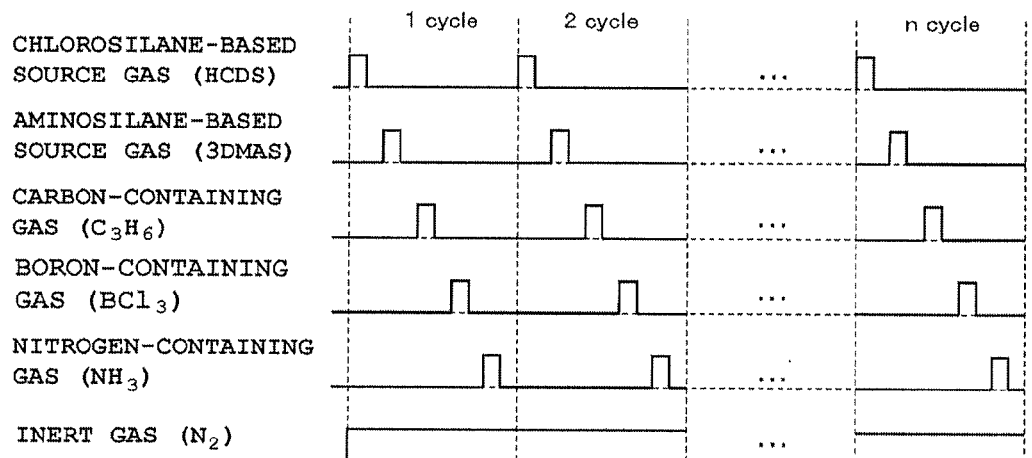
FIG. 12A is a view showing a timing of gas supply in a tenth sequence of this embodiment.
Figure 12B:
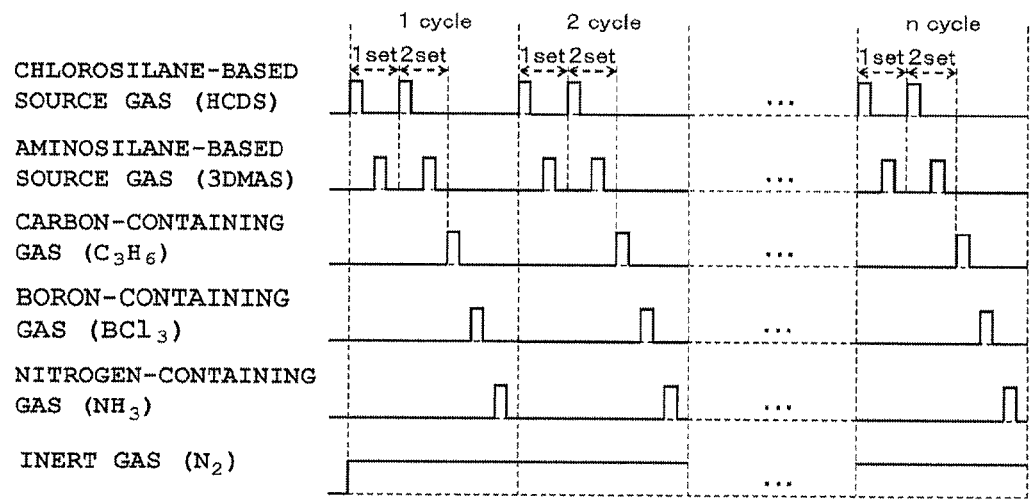
FIG. 12B is a view showing the timing of the gas supply in a modified example of the tenth sequence of this embodiment.

FIG. 12A is a view of the timing of the gas supply in the tenth sequence of this embodiment, and FIG. 12B is a view showing the timing of the gas supply in a modified example of the tenth sequence of this embodiment.

In the tenth sequence of this embodiment, the silicon boron carbonitride film having a prescribed composition and a prescribed film thickness, is formed on the wafer 200 by alternately performing the following steps prescribed number of times:

supplying the chlorosilane-based source to the wafer 200 in the processing chamber 201, and thereafter supplying the aminosilane-based source thereto, to form the first layer containing silicon, nitrogen, and carbon on the wafer 200; and supplying the thermally activated carbon-containing gas to the wafer 200 in the processing chamber 201 as the reactive gas, and thereafter supplying the boron-containing gas thereto as the reactive gas, and thereafter supplying the thermally activated nitrogen-containing gas thereto as the reactive gas, to modify the first layer and form the silicon boron carbonitride layer.

Note that in forming the second layer, the thermally activated carbon-containing gas is supplied to the wafer 200 in the processing chamber 201, to make the carbon-containing gas chemically adsorbed on the first layer, and thereafter the thermally activated boron-containing gas is supplied to the wafer 200 in the processing chamber 201, to make the boron-containing gas further chemically adsorbed on the layer with the carbon-containing gas chemically adsorbed on the first layer, and thereafter the thermally activated nitrogen-containing gas is supplied to the wafer 200 in the processing chamber 201, to modify the layer with the carbon-containing gas and the boron-containing gas chemically adsorbed on the first layer, and form the silicon boron carbonitride layer.

The tenth sequence of this embodiment will be more specifically described hereafter. Here, explanation is given for a case that the HCDS gas is used as the chlorosilane-based source gas, the 3DMAS gas is used as the aminosilane-based source gas, the $C_3H_6$ gas is used as carbon-containing gas, the $BCl_3$ gas is used as the boron-containing gas, and the $NH_3$ gas is used as the nitrogen-containing gas, to form the silicon boron carbonitride film (SiBCN film) on the substrate as the insulating film.

The wafer charge, boat loading, pressure adjustment, temperature adjustment, and wafer rotation are similarly performed as the first sequence. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCDS gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 201, to cause a reaction between the silicon-containing layer and the 3DMAS gas, and form the first layer containing Si, N, and C.
[Step 3]
Step 3 is performed similarly to the step 3 of the fifth sequence. Namely, the processing conditions, the reaction to be caused, and the layer to be formed, etc., in step 3 are the same as those of the step 3 of the fifth sequence. Namely, in this step, the $C_3H_6$ gas is supplied into the processing chamber 201, to make the $C_xH_y$ chemically adsorbed on the first layer.
[Step 4]
Step 4 is performed similarly to the step 3 of the seventh sequence. Namely, the processing conditions, the reaction to be caused, and the layer to be formed, etc., in step 4 are the same as those of the step 3 of the seventh sequence. Namely, in this step, the $BCl_3$ gas is supplied into the processing chamber 201, to make the $B_xCl_y$ chemically adsorbed on the layer with $C_xH_y$ chemically adsorbed on the first layer.
[Step 5]
Step 5 is performed similarly to the step 4 of the seventh sequence. Namely, the processing conditions, the reaction to be caused, and the layer to be formed, etc., in step 4 are the same as those of the step 4 of the seventh sequence. Namely, in this step, the $NH_3$ gas is supplied into the processing chamber 201, to modify the layer with $C_xH_y$ and $B_xCl_y$ chemically adsorbed on the first layer, and form the second layer including the SiBCN layer.

The aforementioned steps 1 to 5 are set as one cycle, and by performing this cycle one or more number of times (prescribe number of times), the silicon boron carbonitride film (SiBCN film) having a prescribed composition and a prescribed film thickness can be formed on the wafer 200. Note that the aforementioned cycle is preferably repeated multiple number of times as shown in FIG. 12A.

A SiBCN film having a prescribed film thickness may be formed on the wafer 200, by setting a first step and a second step as one cycle, and alternately performing a cycle of the first step and the second step prescribed number of times, wherein the first step is the step of alternately performing a set of step 1 and step 2 prescribed number of times with these steps as one set, and the second step is the step of performing step 3, step 4, and step 5.

Namely, the SiBCN film having a prescribed composition and the prescribed film thickness may be formed on the wafer 200 by setting the first step and the second step as one cycle, and performing the cycle of the first step and the second step prescribed number of times (n-times), wherein the first step is the step of forming a first layer containing silicon, nitrogen, and carbon, and having a prescribed thickness on the wafer 200 by performing prescribed number of times (m-times) a set of supplying the chlorosilane-based source (HCDS) to the wafer 200 in the processing chamber 201 (step 1) and thereafter the step of supplying the aminosilane-based source (3DMAS) thereto (step 2) with these steps as one set, and the second step is the step of chemically adsorbing a boron-containing gas on the first layer by supplying a thermally activated boron-containing gas ($BCl_3$ gas) to the wafer 200 in the processing chamber 201 as the reactive gas (step 3) and the step of further chemically adsorbing the boron-containing gas on the layer in which the carbon-containing gas is chemically adsorbed on the first layer (step 4), and the step of forming the SiBCN layer as a second layer by modifying the layer in which the carbon-containing gas and the boron-containing gas are chemically adsorbed on the first layer by supplying a thermally activated nitrogen-containing gas ($NH_3$ gas) to the wafer 200 in the processing chamber 201 as the reactive gas (step 5). In this case as well, the above-mentioned cycle is preferably repeated multiple numbers of times.

FIG. 12B shows an example of forming the SiBCN film having the prescribed composition and the prescribed film thickness on the wafer 200, by setting the first step and the second step as one cycle and performing the cycle of the first step and the second step n-times, wherein the first step is the step of performing the set of the steps 1 and 2 twice with these steps as one set, and the second step is the step of performing step 3, step 4, and step 5 thereafter.

Thus, the ratio of a silicon component and a nitrogen component to a carbon component, and the ratio of the silicon component, the nitrogen component, and the carbon component to a boron component in the SiBCN film can be properly controlled by setting the first step and the second step as one cycle and performing the cycle of these steps prescribed number of times, wherein the first step is the step of performing the set of the steps 1 and 2 with these steps as one set, and the second step is the step of performing step 3, step 4, and step 5, and the controllability of the composition ratio of the SiBCN film can be improved.

By increasing the number of sets (m) of the set constituted by step 1 and step 2, absolute amounts of the silicon component, the nitrogen component, and the carbon component in the first layer can be increased, and by modifying in step 3, step 4, and step 5 the first layer in which the absolute amount of each component is thus increased, the ratio of the silicon component and the nitrogen component to the carbon component, and the ratio of the silicon component, the nitrogen component, and the carbon component to the boron component in the SiBCN layer can be controlled toward a rich state, and the ratio of the silicon component and the nitrogen component to the carbon component, and the ratio of the silicon component, the nitrogen component, and the carbon component to the boron component in the finally formed SiBCN film can be controlled toward the rich state.

Meanwhile, by decreasing the number of sets (m) of the set constituted by step 1 and step 2, the absolute amounts of the silicon component, the nitrogen component, and the carbon component in the first layer can be decreased, and thus by modifying the first layer in which the absolute amount of each component is decreased in step 3, step 4, and step 5, the ratio of the silicon component and the nitrogen component to the carbon component, and the ratio of the silicon component, the nitrogen component, and the carbon component to the boron component in the SiBCN layer can be controlled toward a poor state, and the ratio of the silicon component and the nitrogen component to the carbon component, and the ratio of the silicon component, the nitrogen component, and the carbon component to the boron component in the finally formed SiBCN film can be controlled toward the poor state.

Further, by increasing the number of sets (m) of the set constituted by step 1 and step 2, the number of layers of the first layer formed per one cycle, namely, the thickness of the first layer formed per one cycle can be increased by the number of sets (m), and a cycle rate (the thickness of the SiBCN layer formed per unit cycle) can be improved. Thus, the film formation rate (the film thickness of the SiBCN film formed per unit time) can also be improved.

When the film formation processing of forming the SiBCN film having a prescribed composition and a prescribed film thickness is performed, the gas purge, inert gas substitution, return to the atmosphere, boat unloading, and wafer discharge, are performed similarly to the first sequence.

According to this embodiment, when the insulating film is formed using the chlorosilane-based source and the aminosilane-based source, the silicon insulating film having a desired composition with high silicon density can be formed in a low temperature region. Further, an ideal stoichiometric silicon insulating film can be formed. Note that according to the inventors of the present invention, it is difficult to deposit silicon on the wafer at a film formation rate of satisfying a production efficiency in a temperature zone of 500° C. or less. Moreover, when the aminosilane-based source is used alone, deposition of the silicon on the wafer cannot be confirmed in the temperature zone of 500° C. or less. However, according to the technique of this embodiment, an excellent silicon insulating film can be formed at the film formation rate of satisfying the production efficiency, even in the low temperature zone of 500° C. or less.

Note that when the film formation temperature is lowered, usually, kinetic energy of a molecule is also lowered, thus hardly causing the reaction and desorption of chlorine included in the chlorosilane-based source and amino-group (amine-group) included in the aminosilane-based source, and ligands of them are remained on the surface of the wafer. Then, such residual ligands inhibit the adsorption of the silicon on the surface of the wafer as a steric hindrance, thus lowering the silicon density and causing deterioration of the film. However, even under a condition that hardly allowing such a reaction/desorption to occur, the residual ligands can be desorbed by properly causing the reaction between two silane sources, namely between the chlorosilane-based source and the aminosilane-based source. Then, the steric hindrance is resolved by the desorption of the residual ligands, and the silicon can be adsorbed on a site which is opened by the resolution of the steric hindrance, and the silicon density can be increased. Thus, it can be considered that the film with high silicon density can be formed even in the low temperature zone of 500° C. or less.

Further, according to this embodiment, the chlorosilane-based source is supplied, and thereafter the aminosilane-based source is supplied, to form the first layer containing Si, N, and C, namely the silicon insulating layer on the wafer, and thereafter the thermally activated or plasma activated nitrogen-containing gas, carbon-containing gas, oxygen-containing gas, or boron-containing gas is supplied to the substrate. Therefore, the nitrogen concentration, carbon concentration, oxygen concentration, or boron concentration of the silicon insulating layer can be adjusted. Thus, the silicon insulating film having a desired characteristic can be formed by controlling the composition ratio.

Further, according to this embodiment, the first layer containing Si, N, and C having the prescribed thickness, namely the silicon insulating layer is formed on the wafer by performing the prescribed number of times (m-times) the set of the step of supplying the chlorosilane-based source and thereafter the step of supplying the aminosilane-based source, with these steps as one set, and thereafter the thermally or plasma-activated nitrogen-containing gas, carbon-containing gas, oxygen-containing gas, or boron-containing gas are further supplied. Therefore, the nitrogen concentration, the carbon concentration, the oxygen concentration or the boron concentration in the silicon insulating layer can be properly adjusted, and the controllability of the composition ratio in the silicon insulating layer can be improved. Further, the cycle rate can be improved, and the film formation rate can also be improved. In addition, by varying the number of sets (m) in each cycle, the silicon insulating film with different composition ratio in the film thickness direction, can be formed. For example, the silicon insulating film having the composition in which the nitrogen concentration, the carbon concentration, the oxygen concentration or the boron concentration is gradually increased in the film thickness direction, and the silicon insulating film having the composition in which the nitrogen concentration, the carbon concentration, the oxygen concentration, or the boron concentration is gradually decreased in the film thickness direction, can be formed.

Further, in this embodiment, in any one of the sequences, the composition ratio of the thin film is controlled (finely adjusted) by controlling the pressure in the processing chamber and the gas supply time in each step. More preferably, the composition ratio of the thin film is controlled by controlling the pressure in the processing chamber, or controlling the pressure and the gas supply time.

When the composition ratio of the thin film is controlled by controlling the pressure in the processing chamber in each step, an influence of a difference in machines in different substrate processing apparatuses can be reduced. Namely, the composition ratio of the thin film can be similarly controlled by similar control even in different substrate processing apparatuses. In this case, by controlling the gas supply time in each step, the composition ratio of the thin film can be finely adjusted, and the controllability of controlling the gas supply time can be improved. In addition, by controlling the pressure in the processing chamber, the composition ratio can be controlled while increasing the film formation rate. Namely, by controlling the pressure in the processing chamber, the composition ratio of the thin film can be controlled while increasing the growth rate of the silicon-containing layer formed in step 1 of each sequence for example. Thus, according to this embodiment, the composition ratio of the thin film can be similarly controlled by similar control, and also the controllability of controlling the composition ratio of the thin film can be improved, and further the film formation rate, namely productivity can be improved.

Further, by using the silicon insulating film formed by the technique of this embodiment as a side wall spacer, a device formation technique with low leak current and having excellent processability can be provided.

Further, by using the silicon insulating film formed by the technique of this embodiment as an etch stopper, the device formation technique with excellent processability can be provided.

According to this embodiment, an ideal stoichiometric silicon insulating film can be formed without using plasma even in the low temperature zone. Further, since the silicon insulating film can be formed without using plasma, this embodiment can be applied to a process in which there is a risk of plasma damage, such as a SADP film of DPT.

Note that in the above-described embodiment, explanation is given for a case that when the first layer containing Si, N, and C is formed in each sequence, the chlorosilane-based source is supplied to the wafer 200 in the processing chamber 201, and thereafter the aminosilane-based source is supplied to the substrate or a case that the step of supplying the chlorosilane-based source and thereafter the step of supplying the aminosilane-based source are alternately performed prescribed number of times. However, the sources may be reversely flowed. Namely, the aminosilane-based source is supplied and thereafter the chlorosilane-based source may be supplied. Further, the step of supplying the aminosilane-based source and thereafter the step of supplying the chlorosilane-based source may be alternately performed prescribed number of times. Specifically, one of the chlorosilane-based source and the aminosilane-based source is supplied, and thereafter the other source may be supplied. Further, the step of supplying one of the sources of the chlorosilane-based source and the aminosilane-based source, and the step of supplying the other source thereafter may be alternately performed prescribed number of times. Thus, by changing an order of flowing the sources, the film quality and the composition ratio of the thin film formed in each sequence can be changed.

Further, by changing not only the order of flowing the chlorosilane-based source and the aminosilane-based source, but also the order in the flow of all gases including the chlorosilane-based source and the aminosilane-based source, the film quality and the composition ratio of the thin film formed in each sequence can be changed.

Further, in the aforementioned embodiment, explanation is given for a case that when the first layer containing Si, N, and C is formed in each sequence, the chlorosilane-based source and the aminosilane-based source are used. However, the silane source having a halogen-based ligand other than the chlorosilane-based source may also be used. For example, a fluorosilane source can also be used instead of the chlorosilane-based source. Here, the fluorosilane source is the silane source having a fluoro group, which is a source containing at least silicon (Si) and fluorine (F). Silicon fluoride gas such as silicon tetrafluoride ($SiF_4$) gas and disilicon hexafluoride ($Si_2F_6$) gas can be used as the fluorosilane source. In this case, when the first layer containing Si, N, and C is formed in each sequence, the fluorosilane source is supplied to the wafer 200 in the processing chamber 201, and thereafter the aminosilane-based source is supplied, or the aminosilane-based source is supplied and thereafter the fluorosilane source is supplied.

Further, in the above-described embodiment, explanation is given for a case that plasma is used in step 3 of the first sequence and in step 3 of the third sequence. However, plasma may also be used in each step of other sequence. For example, in each step of each sequence, it is also acceptable that the nitrogen-containing gas, the carbon-containing gas, the oxygen-containing gas, and the boron-containing gas are plasma-activated, to modify each layer by plasma-nitriding (nitrogen dope), plasma carbonization (carbon dope), plasma oxidation (oxygen dope), and plasma boronizing (boron dope). However, use of plasma is not suitable for the process in which there is a risk of plasma damage, and is preferably applied to other process in which there is no risk of plasma damage.

Further, in the step of supplying the oxygen-containing gas, the hydrogen-containing gas may be supplied together with the oxygen-containing gas. When the oxygen-containing gas and the hydrogen-containing gas are supplied into the processing chamber 201 which is under atmosphere of a pressure of less than the air atmosphere (reduced pressure), the oxygen-containing gas and the hydrogen-containing gas are reacted in the processing chamber 201, to thereby generate water ($H_2O$)-free oxidizing species containing oxygen such as atomic oxygen, etc., and each layer can be oxidized by this oxidizing species. In this case, each layer can be oxidized by a higher oxidizing power than that of a case that the oxygen-containing gas alone is used for oxidation. The oxidation treatment is performed under a reduced atmosphere by non-plasma. Hydrogen ($H_2$) can be used for example, as the hydrogen-containing gas.

Further, in the above-described embodiment, explanation is given for a case that when the first layer containing Si, N, and C is formed in each sequence, the chlorosilane-based source is supplied to the wafer 200 in the processing chamber 201, and thereafter the aminosilane-based source is supplied. However, as shown in FIGS. 13A-13B and FIGS. 14A-14B, it is also acceptable that the chlorosilane-based source and the aminosilane-based source are simultaneously supplied to the wafer 200 in the processing chamber 201, to cause the CVD reaction.

FIGS. 13A-13B and FIGS. 14A-14B are views of the timing of the gas supply according to other embodiment of the present invention, in which the chlorosilane-based source and the aminosilane-based source are simultaneously supplied. Note that the processing conditions in this case may be similar processing conditions as those of each sequence of the aforementioned embodiment.

Figure 13A:
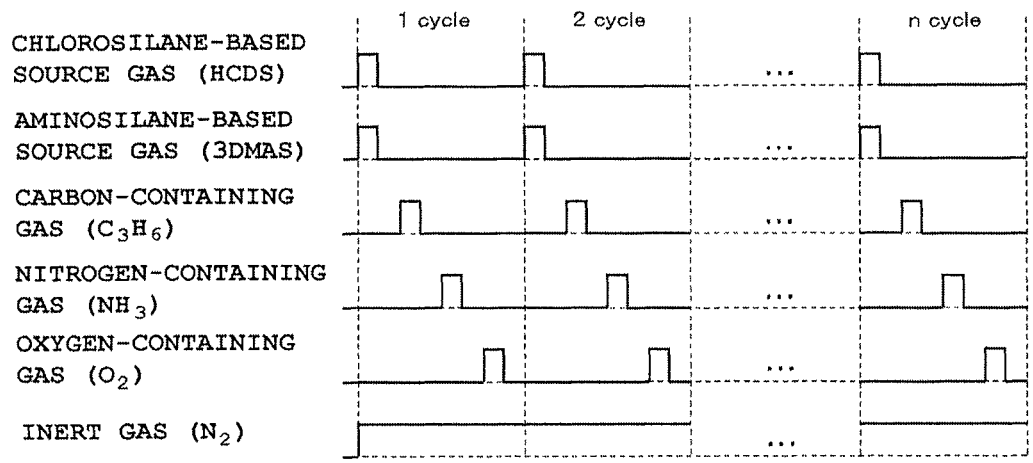
FIG. 13A is a view showing a timing of gas supply in other embodiment.
Figure 13B:
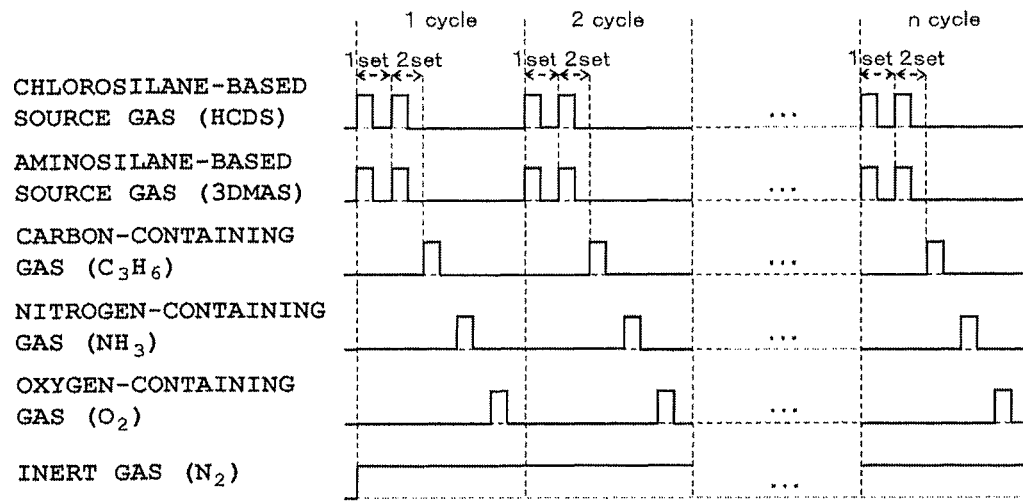
FIG. 13B is a view showing a modified example of the timing of the gas supply shown in FIG. 13A.

The sequence of FIGS. 13A-13B shows an example of forming the silicon oxycarbonitride film (SiOCN film) having a prescribed composition and a prescribed film thickness by alternately performing the following steps prescribed number of times:

the step of simultaneously supplying the chlorosilane-based source (HCDS) and the aminosilane-based source (3DMAS) to the wafer 200 in the processing chamber 201, to Ram the first layer containing silicon, nitrogen, and carbon on the wafer 200; and the step of supplying the thermally activated carbon-containing gas ($C_3H_6$) to the wafer 200 in the processing chamber 201 as the reactive gas, and thereafter supplying the thermally activated nitrogen-containing gas ($NH_3$) as the reactive gas, and thereafter the thermally activated oxygen-containing gas ($O_2$) as the reactive gas, to modify the first layer and form the silicon oxycarbonitride layer (SiOCN layer) as the second layer. FIG. 13A shows a case that the step of simultaneously supplying the HCDS and 3DMAS is performed once in the step of forming the first layer, and FIG. 13B shows a case that the step of simultaneously supplying the HCDS and 3DMAS is performed multiple numbers of times (twice) in the step of forming the first layer.

Note that in forming the second layer, the thermally activated carbon-containing gas is supplied to the wafer 200 in the processing chamber 201, to make the carbon-containing gas chemically adsorbed on the first layer, and thereafter the thermally activated nitrogen-containing gas is supplied to the wafer 200 in the processing chamber 201, to modify the layer with the carbon-containing gas chemically adsorbed on the first layer, and thereafter the thermally activated oxygen-containing gas is supplied to the wafer 200 in the processing chamber 201, to modify the silicon carbonitride layer and form the silicon oxycarbonitride layer.

Figure 14A:
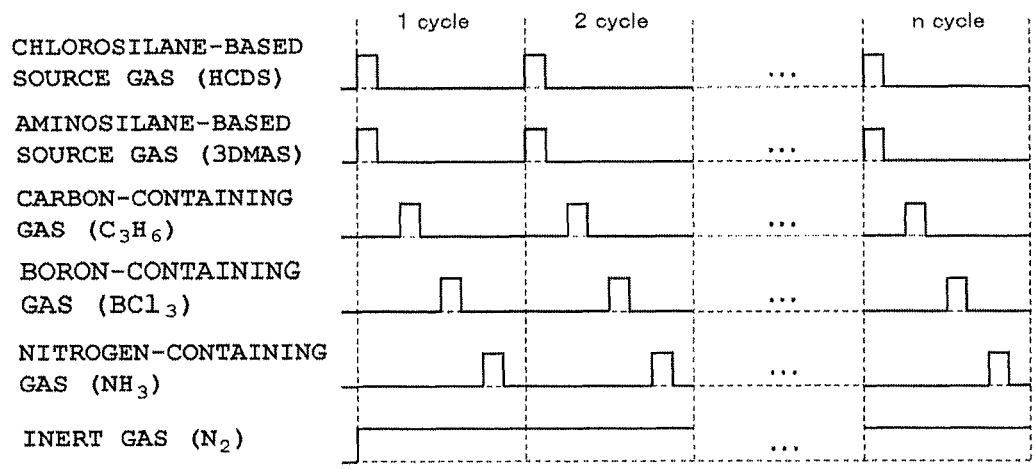
FIG. 14A is a view showing a timing of gas supply in other embodiment.
Figure 14B:
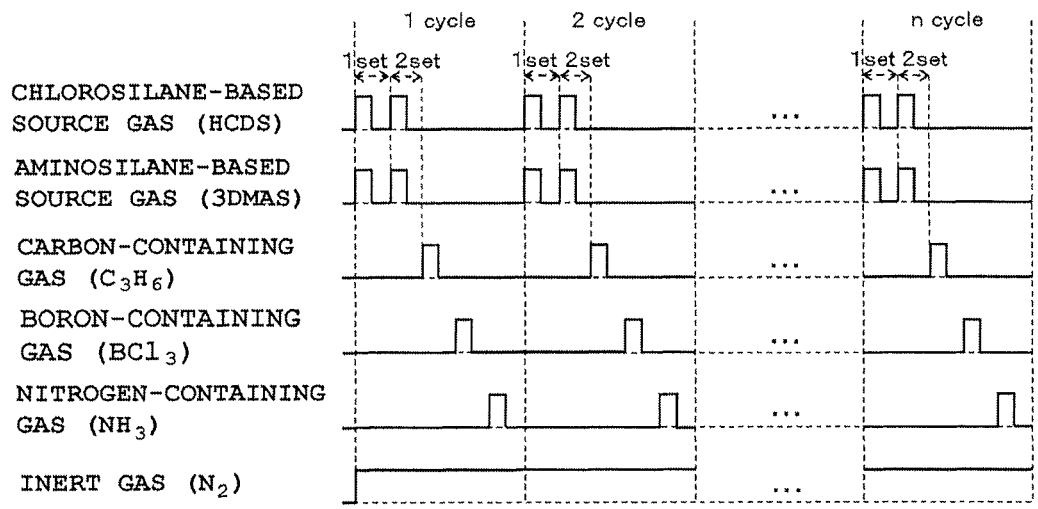
FIG. 14B is a view showing a modified example of the timing of the gas supply shown in FIG. 14A.

The sequence of FIGS. 14A-14B shows an example of forming the silicon boron carbonitride film (SiBCN) film having a prescribed composition and a prescribed film thickness by performing the following steps prescribed number of times:

the step of simultaneously supplying the chlorosilane-based source (HCDS) and the aminosilane-based source (3DMAS) to the wafer 200 in the processing chamber 201, to form the first layer containing silicon, nitrogen, and carbon on the wafer 200; and the step of supplying the thermally activated carbon-containing gas ($C_3H_6$) to the wafer 200 in the processing chamber 201 as the reactive gas, and thereafter supplying the thermally activated boron-containing gas ($BCl_3$) as the reactive gas, and thereafter supplying the thermally activated nitrogen-containing gas ($NH_3$) as the reactive gas, to modify the first layer and form the silicon boron carbonitride layer (SiBCN layer) as the second layer. FIG. 14A shows a case that the step of simultaneously supplying the HCDS and 3DMAS is performed once in the step of forming the first layer, and FIG. 14B shows a case that the step of simultaneously supplying the HCDS and 3DMAS is performed multiple numbers of times (twice) in the step of forming the first layer.

In forming the second layer, the thermally activated carbon-containing gas is supplied to the wafer 200 in the processing chamber 201 to make the carbon-containing gas chemically adsorbed on the first layer, and thereafter the thermally activated boron-containing gas is supplied to the wafer 200 in the processing chamber 201, to make the boron-containing gas further chemically adsorbed on the layer with the carbon-containing gas chemically adsorbed on the first layer, and thereafter the thermally activated nitrogen-containing gas is supplied to the wafer 200 in the processing chamber 201, to modify the layer with the carbon-containing gas and the boron-containing gas chemically adsorbed on the first layer, to form the silicon boron carbonitride layer.

Thus, the chlorosilane-based source and the aminosilane-based source are not sequentially supplied to the wafer 200 in the processing chamber 201, but simultaneously supplied thereto. Even in such a case, a similar operation and effect as that of the aforementioned embodiment can be obtained. However, as is shown in the aforementioned embodiment, in a case of a sequential supply of each source, namely in a case of alternately supplying the chlorosilane-based source and the aminosilane-based source, with purging in the processing chamber 201 interposed between them, the chlorosilane-based source and the aminosilane-based source can be properly reacted under a condition of a predominant surface reaction, and controllability of controlling the film thickness can be increased.

Further, in the above-mentioned embodiment, explanation is given for a case that one kind of thin film (single film) is formed simultaneously on the wafer in the processing chamber in each sequence. However, a lamination film of two kinds or more thin films can also be formed simultaneously on the wafer in the processing chamber by suitably combining each of the above-mentioned sequences. For example, a lamination film formed by alternately laminating the SiCN film and the SiN film, can be formed by alternately performing the first sequence of FIG. 3A and the first sequence of FIG. 3B in-situ in the processing chamber. Further for example, a lamination film formed by alternately laminating the SiO film and the SiOCN film, a lamination film formed by alternately laminating the SiO film and the SiOC film, and a lamination film formed by alternately laminating the SiOC film and the SiOCN film can be formed by alternately performing the third sequence of FIG. 5B and the third sequence of FIG. 5A in-situ in the processing chamber. Further, a lamination film formed by laminating the SiO film, the SiOC film, and the SiOCN film can be formed. For example, by alternately performing the third sequence of FIG. 5B and the first sequence of FIG. 3B in-situ in the processing chamber, a lamination film formed by alternately laminating the SiO film and the SiN film, for example a lamination having ONO structure can be formed.

Thus, the present invention can be suitably applied not only to a case of forming the singled film but also to a case of forming the lamination film, and in this case as well, the effect similar to the effect of the above-mentioned embodiment can be obtained.

Further, in the above-mentioned embodiment, explanation is given for an example of forming the silicon-based insulating film containing silicon being a semiconductor element, as the thin film. However, the present invention can also be applied to a case of forming a metal thin film containing a metal element such as titanium (Ti), zirconium (Zr), hafnium (Hf), tantalum (Ta), aluminum (Al), and molybdenum (Mo), etc.

For example, the present invention can be applied to a case of forming a titanium nitride film (TiN film), a titanium carbonitride film (TiCN film), a titanium oxycarbonitride film (TiOCN film), a titanium oxycarbide film (TiOC film), a titanium oxide film (TiO film), a titanium boron carbonitride film (TiBCN film), or a Ti-based thin film formed by combining or mixing them, or a case of forming a lamination film of them.

Further, for example, the present invention can also be applied to a case of forming a zirconium nitride film (ZrN film), a zirconium carbonitride film (ZrCN film), a zirconium oxycarbonitride film (ZrOCN film), a zirconium oxycarbide film (ZrOC film), a zirconium oxide film (ZrO film), a zirconium boron carbonitride film (ZrBCN film), or a Zr-based thin film formed by combining or mixing them, or a case of forming a lamination film of them.

Further for example, the present invention can also be applied to a case of forming a hafnium nitride film (HfN film), a hafnium carbonitride film (HfCN film), a hafnium oxycarbonitride film (HfOCN film), a hafnium oxycarbide film (HfOC film), a hafnium oxide film (HfO film), a hafnium boron carbonitride film (HfBCN film), or a Hf-based thin film formed by combining or mixing them, or a case of forming a lamination film of them.

Further for example, the present invention can also be applied to a case of forming a tantalum nitride film (TaN film), a tantalum carbonitride film (TaCN film), a tantalum oxycarbonitride film (TaOCN film), a tantalum oxycarbide film (TaOC film), a tantalum oxide film (TaO film), a tantalum boron carbonitride film (TaBCN film), or a Ta-based thin film formed by combining or mixing them, or a case of forming a lamination film of them.

Further for example, the present invention can also be applied to a case of forming an aluminum nitride film (AlN film), an aluminum carbonitride film (AlCN film), an aluminum oxycarbonitride film (AlOCN film), an aluminum oxycarbide film (AlOC film), an aluminum oxide film (AlO film), an aluminum boron carbonitride film (AlBCN film), or an Al-based thin film formed by combining or mixing them, or a case of forming a lamination film of them.

Further for example, the present invention can also be applied to a case of forming a molybdenum nitride film (MoN film), a molybdenum carbonitride film (MoCN film), a molybdenum oxycarbonitride film (MoOCN film), a molybdenum oxycarbide film (MoOC film), a molybdenum oxide film (MoO film), a molybdenum boron carbonitride film (MoBCN film), or a Mo-based thin film formed by combining or mixing them, or a case of forming a lamination film of them.

In this case, film formation can be performed by a sequence similar to the above-mentioned embodiment, using a source containing a metal element and a chloro-group (first source) instead of the chlorosilane-based source in the above-mentioned embodiment, and using a source containing a metal element and an amino-group (second source) instead of the aminosilane-based source in the above-mentioned embodiment.

Namely, in this case, a metal thin film containing a metal element and having a prescribed composition and a prescribed film thickness is formed on the wafer 200 by alternately performing prescribed number of times (n-times) the step of forming a first layer containing a metal element, nitrogen, and carbon on the wafer 200 by supplying one of the sources of the first source containing the metal element and the chloro-group, and the second source containing the metal element and the amino-group, to the wafer 200 in the processing chamber 201; and the step of forming the second layer by modifying the first layer by supplying a reactive gas different from the first source and the second source, to the wafer 200 in the processing chamber 201.

Otherwise, a metal thin film containing a metal element and having a prescribed composition and a prescribed film thickness is formed on the wafer 200 by alternately performing prescribed number of times (n-times) the step of forming a first layer containing a metal element, nitrogen, and carbon on the wafer 200 by alternately performing prescribed number of times (m-times) the step of supplying one of the sources of a first source containing a metal element and a chloro-group, and a second source containing a metal element and an amino-group, to the wafer 200 in the processing chamber 201, and the step of supplying the other source different from one of the sources of the first source and the second source to the wafer 200 in the processing chamber 201.

For example, when the Ti-based thin film is formed as the metal thin film, a source containing Ti and the chloro-group such as titanium tetra chloride ($TiCl_4$), etc., can be used as the first source, and a source containing Ti and the amino-group such as tetrakisethylmethylaminotitanium ($Ti[N(C_2H_5)(CH_3)]_4$, abbreviated as TEMAT), tetrakisdimethylaminotitanium ($Ti[N(CH_3)_2]_4$, abbreviated as TDMAT), and tetrakisdiethylaminotitanium ($Ti[N(C_2H_5)_2]_4$, abbreviated as TDEMAT) can be used as the second source. A gas similar to the gas of the above-mentioned embodiment can be used as the nitrogen-containing gas, the oxygen-containing gas, the carbon-containing gas, and the boron-containing gas. A processing condition similar to the processing condition of the above-mentioned embodiment for example can be used as the processing condition in this case.

Further for example, when the Zr-based thin film is formed as the metal thin film, a source containing Zr and the chloro-group such as zirconium tetra chloride ($ZrCl_4$), etc., can be used as the first source, and a source containing Zr and the amino-group such as tetrakisethylmethylaminozirconium ($Zr[N(C_2H_5)(CH_3)]_4$, abbreviated as TEMAZ), tetrakisdimethylaminozirconium ($Zr[N(CH_3)_2]_4$, abbreviated as TDMAZ), and tetrakisdiethylaminozirconium ($Zr[N(C_2H_5)_2]_4$, abbreviated as TDEAZ) can be used as the second source. A gas similar to the gas of the above-mentioned embodiment can be used as the nitrogen-containing gas, the oxygen-containing gas, the carbon-containing gas, and the boron-containing gas. A processing condition similar to the processing condition of the above-mentioned embodiment for example can be used as the processing condition in this case.

Further for example, when the Hf-based thin film is formed as the metal thin film, a source containing Hf and the chloro-group such as hafnium tetra chloride ($HfCl_4$), etc., can be used as the first source, and a source containing Hf and the amino-group such as tetrakisethylmethylaminohafnium ($Hf[N(C_2H_5)(CH_3)]_4$, abbreviated as TEMAH), tetrakisdimethylaminozirconium ($Hf[N(CH_3)_2]_4$, abbreviated as TDMAH), and tetrakisdiethylaminozirconium ($Hf[N(C_2H_5)_2]_4$, abbreviated as TDEAH) can be used as the second source. A gas similar to the gas of the above-mentioned embodiment can be used as the nitrogen-containing gas, the oxygen-containing gas, the carbon-containing gas, and the boron-containing gas. A processing condition similar to the processing condition of the above-mentioned embodiment for example can be used as the processing condition in this case.

Thus, the present invention can be applied not only to the silicon-based thin film, but also to the film formation of the metal thin film, and in this case as well, the effect similar to the effect of the above-mentioned embodiment can be obtained.

Namely, the present invention can be applied to a case of forming the thin film containing the prescribed element such as the semiconductor element and the metal element, etc.

Further, in the above-mentioned embodiment, explanation is given for an example of forming the thin film using a butch-type substrate processing apparatus for processing a plurality of substrates at once. However, the present invention is not limited thereto, and can be suitably used in a case of forming the thin film using a non-batch type substrate processing apparatus for processing one or several substrates at once.

Further, the above-mentioned each embodiment, each film formation sequence, each modified example, and each application example, etc., can be suitably combined and used.

Further, for example, the present invention can also be realized by changing the process recipe of the existing substrate processing apparatus. When the process recipe is changed, the process recipe can be installed on the existing substrate processing apparatus via the electric communication line or the recording medium in which the process recipe is recorded, or the process recipe itself can be changed to the process recipe of the present invention by operating an input/output device of the existing substrate processing apparatus.

EXAMPLES

Example 1

By the first sequence in the above-described embodiment, the SiCN film was formed on the wafer, and the film formation rate and a refractive index of the film (R.I.) were measured. Note that in this embodiment, the HCDS gas was used as the chlorosilane-based source gas, and the 3DMAS gas was used as the aminosilane-based source gas, and the $NH_3$ gas was used as the nitrogen-containing gas, and the SiCN film was formed by non-plasma by the sequence of FIG. 3A. The processing conditions in each step at this time were set as follows.

(Step 1)
Temperature in the processing chamber: 550° C.
Pressure in the processing chamber: 266 Pa (2 Torr)
HCDS gas supply flow rate: 200 sccm
HCDS gas irradiation time: 12 seconds (Step 2)
Temperature in the processing chamber: 550° C.
Pressure in the processing chamber: 266 Pa (2 Torr)
3DMAS gas supply flow rate: 200 sccm
3DMAS gas irradiation time: 12 seconds (Step 3)
Temperature in the processing chamber: 550° C.
Pressure in the processing chamber: 831 Pa (6.5 Torr)
$NH_3$ gas supply flow rate: 5000 sccm
$NH_3$ gas irradiation time: 12 seconds As a result, the film formation rate of the SiCN film formed in this example was 1.8 Å/cycle, and the refractive index of the film (R.I.) was 2.10. Namely, it was found that an excellent silicon insulating film could be formed at a film formation rate satisfying the production efficiency in the low temperature zone of 550° C.

Example 2

The SiCN film was formed on the wafer by the first sequence in the above-described embodiment, and the film formation rate and uniformity of the film thickness in-plane of the wafer, and the refractive index (R.I.) were measured. Further, XPS spectrum of the SiCN film was measured, and C—Si ratio of the C-component with respect to Si-component) and N/Si ratio (ratio of the N-component with respect to the Si-component) were measured. Moreover, step 1 and step 2 of the first sequence were alternately repeated, to form a substance containing Si, C, and N (called simply SiCN). Then, the XPS spectrum was measured, and the C/Si ratio and the N/Si ratio were calculated. Note that in this example, the HCDS gas was used as the chlorosilane-based source gas, and the 3DMAS gas was used as the aminosilane-based source gas, and the $NH_3$ gas was used as the nitrogen-containing gas. Then, by the sequence of FIG. 3A, the SiCN film was formed by non-plasma. Further, in a comparative example, the HCDS gas was used as the chlorosilane-based source gas, and the 3DMAS gas was used as the aminosilane-based source gas, to form SiCN by the sequence in which step 1 and step 2 of the sequence of FIG. 3A are alternately repeated. The processing conditions in each step at this time were set as follows.

(Step 1)
Temperature in the processing chamber: 550° C.
Pressure in the processing chamber: 399 Pa (3 Torr)
HCDS gas supply flow rate: 100 sccm
HCDS gas irradiation time: 12 seconds (Step 2)
Temperature in the processing chamber: 550° C.
Pressure in the processing chamber: 10 Pa (0.075 Torr)
3DMAS gas supply flow rate: 100 sccm
3DMAS gas irradiation time: 6 seconds (Step 3)
Temperature in the processing chamber: 550° C.
Pressure in the processing chamber: 865 Pa (6.5 Torr)
$NH_3$ gas supply flow rate: 4500 sccm
$NH_3$ gas irradiation time: 24 seconds As a result, the film formation rate of the SiCN film formed in this example was 4.15 Å/cycle, the uniformity in the film thickness in-plane of the wafer was 0.3%, and the refractive index (R.I.) was 2.40. Namely, it was found that an excellent silicon insulating film could be formed at a film formation rate satisfying the production efficiency in the low temperature zone of 550° C.

Figure 15A:
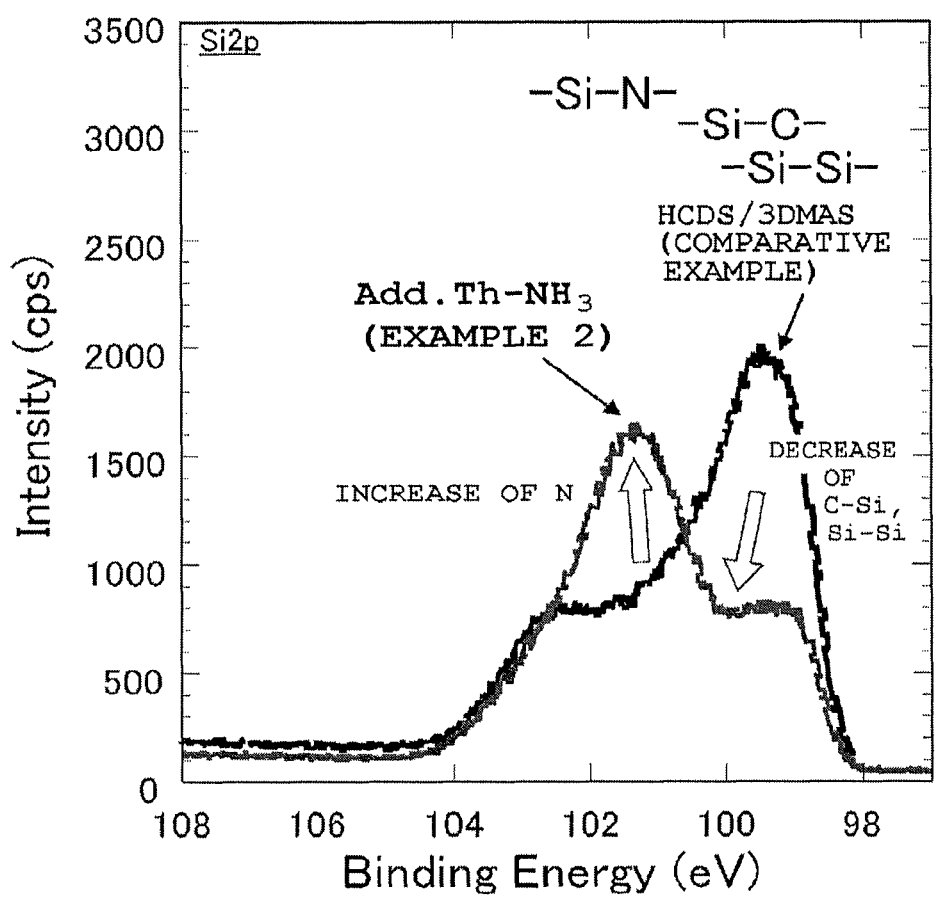
FIG. 15A is a graph chart showing a measurement result of XPS spectrum according to example 2 of the present invention.
Figure 15B:
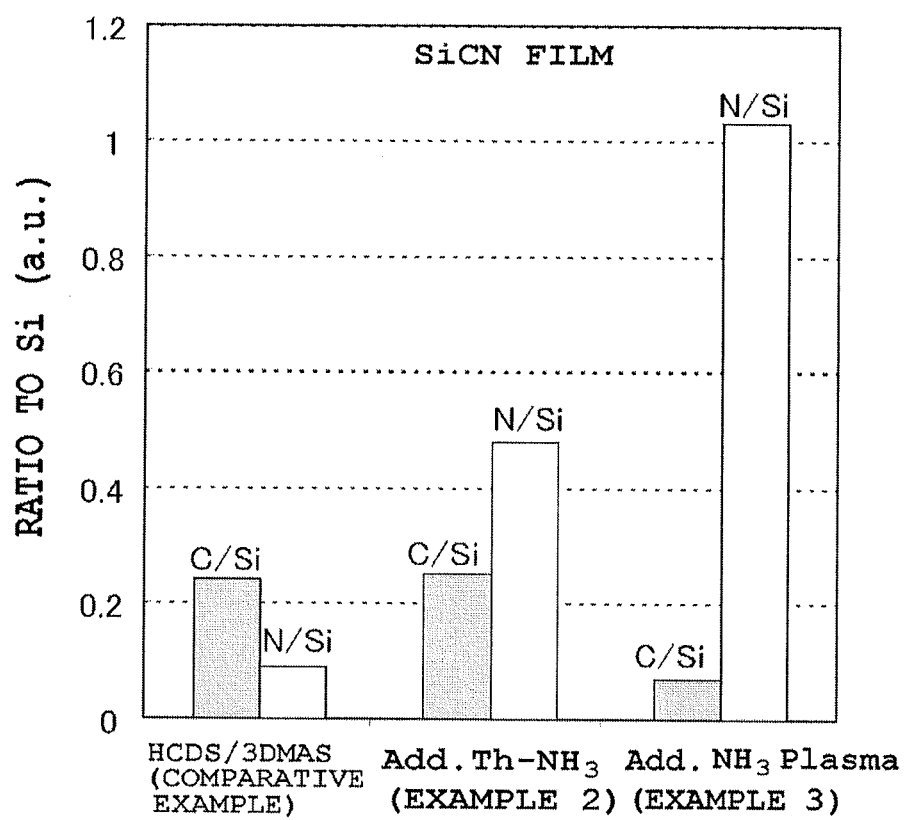
FIG. 15B is a graph chart showing a measurement result of C/Si ratio and N/Si ratio according to example 2 of the present invention.

Further as shown in FIGS. 15A and 15B, in the SiCN film formed in this example, it was found that the ratio of the N-component was increased, and the ratio of the C-component and the ratio of the Si-component were reduced, and the N-concentration was higher than the C-concentration.

FIG. 15A is a graph chart showing a measurement result of the XPS spectrum according to this example, wherein binding energy (eV) is taken on the horizontal axis, and intensity (count/sec) of a photoelectron is taken on the vertical axis respectively. Further, FIG. 15B is a graph chart showing the measurement result of the C—Si ratio and the N/Si ratio according to this example, wherein the ratio of the C-component and the N-component with respect to the Si component (arbitrary unit (a.u.)) is taken on the vertical axis. In each figure, "Add. Th-$NH_3$" shows the measurement result of the SiCN film formed in this example, and "HCDS/3DMAS" shows the measurement result of the SiCN formed in the comparative example. In addition, FIG. 15B shows the measurement result of example 3 ("Add. $NH_3$ Plasma") as will be described later, for comparison.

As shown in FIG. 15A, it is found that the SiCN formed in the comparative example is set in C-rich and Si-rich state in which Si—C bond and Si—Si bond are increased. Meanwhile, in the SiCN film formed in this example, it is found that Si—N bond is increased, and meanwhile Si—C bond and Si—Si bond are reduced in N-rich state, compared with the SiCN formed in the comparative example. Further, as shown in FIG. 15B, in the SiCN formed in the comparative example, it is found that C/Si ratio is larger than N/Si ratio, and the C-concentration is higher than the N-concentration. Meanwhile, it is found that in the SiCN film formed in this example, N/Si ratio is larger than C/Si ratio, and the N-concentration is higher than the C-concentration. Namely, it is found that in the SiCN film formed in this example, by a thermal nitriding action of the $NH_3$ in step 3, the ratio of the N-component is increased, and the ratio of the C-component and the ratio of the Si-component are reduced, and further the N-concentration is higher than the C-concentration.

Example 3

By the first sequence of the above-described embodiment, the SiN film is formed on the wafer, and the film formation rate, the uniformity of the film thickness in-plane of the wafer, and the refractive index (R.I.) were measured. Further, in the comparative example, step 1 and step 2 of the first sequence were alternately repeated to form the SiCN, and the XPS spectrum was measured, and also the C/Si ratio and the N/Si ratio were calculated. In this example, the HCDS gas was used as the chlorosilane-based source gas, and the 3DMAS gas was used as the aminosilane-based source gas, and the $NH_3$ gas was used as the nitrogen-containing gas, to form the SiN film using plasma by the sequence of FIG. 3B. Meanwhile, in the comparative example, the HCDS gas was used as the chlorosilane-based source gas, and the 3DMAS gas was used as the aminosilane-based source gas, to form the SiCN by the sequence in which step 1 and step 2 of the sequence of FIG. 3A were alternately repeated. The processing conditions in each step at this time were set as follows.

(Step 1)
Temperature in the processing chamber: 550° C.
Pressure in the processing chamber: 399 Pa (3 Torr)
HCDS gas supply flow rate: 200 sccm
HCDS gas irradiation time: 12 seconds (Step 2)
Temperature in the processing chamber: 550° C.
Pressure in the processing chamber: 10 Pa (0.075 Torr)
3DMAS gas supply flow rate: 200 sccm
3DMAS gas irradiation time: 6 seconds (Step 3)
Temperature in the processing chamber: 550° C.
Pressure in the processing chamber: 30 Pa (0.225 Torr)
$NH_3$ gas supply flow rate: 4500 sccm
$NH_3$ gas irradiation time: 24 seconds
RF power: 300 W As a result, the film formation rate of the SiN film formed in this example was 4.0 Å/cycle, and the uniformity of the film thickness in-plane of the wafer was 1.7%, and the refractive index of the film (R.I.) was 1.93. Namely, it was found that an excellent silicon insulating film could be formed at a film formation rate satisfying the production efficiency in the low temperature zone of 550° C.

Figure 16A:
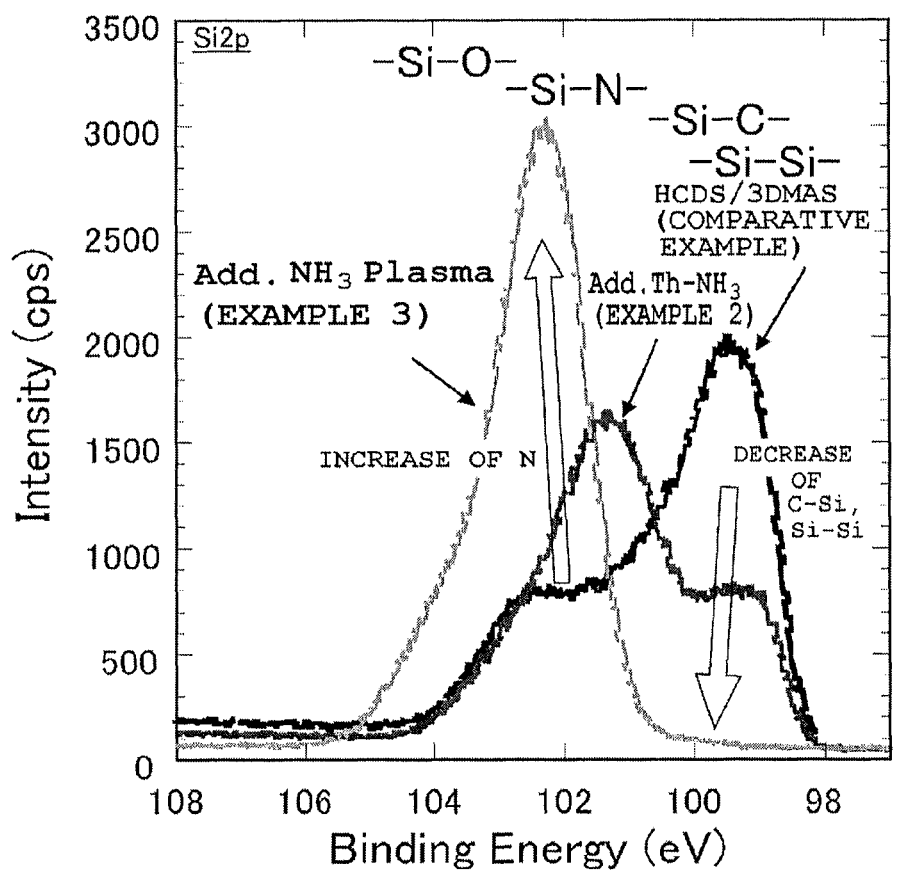
FIG. 16A is a graph chart showing a measurement result of XPS spectrum according to example 3 of the present invention.
Figure 16B:
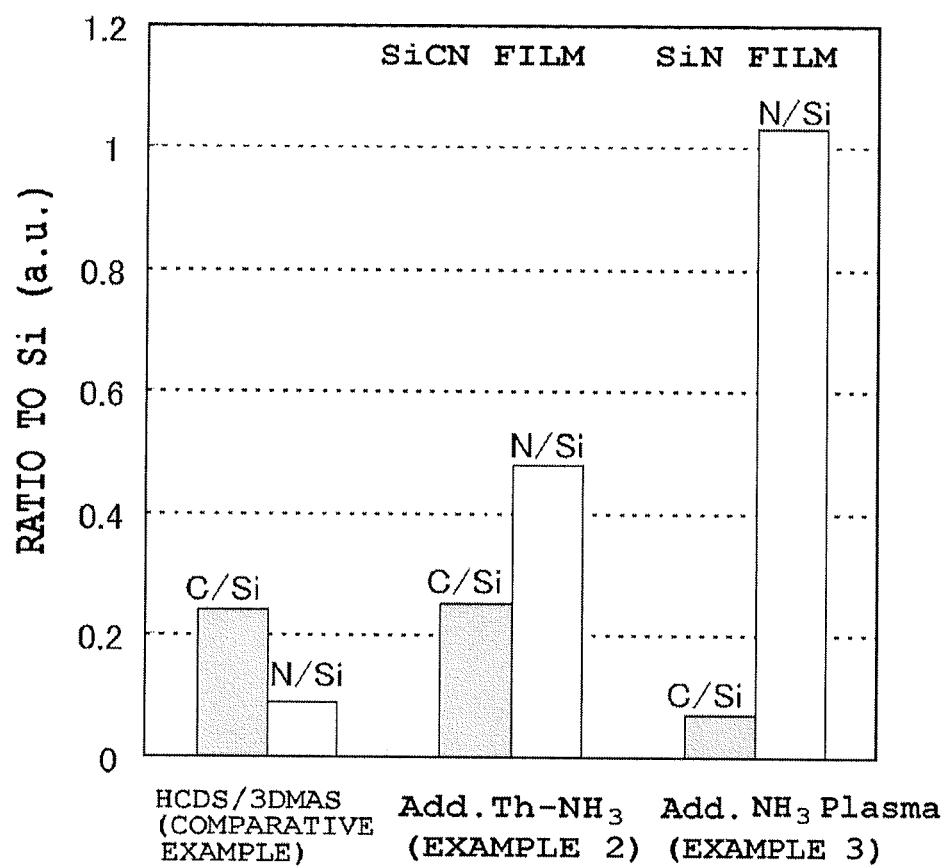
FIG. 16B is a graph chart showing a measurement result of C/Si ratio and N/Si ratio according to example 3 of the present invention.

Further, as shown in FIGS. 16A and 16B, in the SiN film formed in this example, it was found that the ratio of the N-component was remarkably increased, and the ratio of the Si-component was reduced, and further the ratio of the C-component was reduced to an impurity level.

FIG. 16A is a graph chart showing the measurement result of the XPS spectrum according to this example, wherein the binding energy (eV) is taken on the horizontal axis, and the intensity of the photoelectron (count/sec) is taken on the vertical axis respectively. Further, FIG. 16B is a graph chart showing the measurement result of the C/Si ratio and the N/Si ratio according to this example, wherein the ratio of the C-component and the N-component with respect to the Si-component (arbitrary unit (a.u.)) is taken on the vertical axis. In each figure, "Add. NH₃ Plasma" shows the measurement result of the SiN film formed in this example, and "HCDS/3DMAS" shows the measurement result of the SiCN formed in the comparative example. In addition, FIG. 16A shows the measurement result of the aforementioned example 2 ("Add. Th-NH₃"), for comparison.

As shown in FIG. 16A, it is found that the SiCN formed in the comparative example is set in C-rich and Si-rich state in which Si—C bond and Si—Si bond are increased. Meanwhile, in the SiN film formed in this example, it is found that Si—N bond is increased, and meanwhile Si—C bond and Si—Si bond are remarkably reduced and particularly Si—C bond is reduced to the impurity level, compared with the SiCN formed in the comparative example. Further, as shown in FIG. 16B, in the SiCN formed in the comparative example, it is found that C/Si ratio is larger than N/Si ratio, and the C-concentration is higher than the N-concentration. Meanwhile, it is found that in the SiN film formed in this example, N/Si ratio is remarkably larger than C/Si ratio, and the N-concentration is remarkably higher than the C-concentration. Namely, it is found that in the SiN film formed in this example, by a plasma nitriding action of the NH₃ in step 3, the ratio of the N-component is remarkably increased, and the ratio of the Si component is reduced and further the ratio of the C-component is remarkably reduced to the impurity level.

Example 4

By the third sequence of the above-described embodiment, the SiOC film was formed on the wafer, and the film formation rate, the uniformity of the film thickness in-plane of the wafer, and the refractive index (R.I.) were measured. In this example, the HCDS gas was used as the chlorosilane-based source gas, and the 3DMAS gas was used as the aminosilane-based source gas, and the N₂O gas was used as the oxygen-containing gas, to form a SiOC film by non-plasma. The processing conditions in each step at this time were set as follows.
(Step 1)
 Temperature in the processing chamber: 550° C.
 Pressure in the processing chamber: 399 Pa (3 Torr)
 HCDS gas supply flow rate: 200 sccm
 HCDS gas irradiation time: 12 seconds
(Step 2)
 Temperature in the processing chamber: 550° C.
 Pressure in the processing chamber: 10 Pa (0.075 Torr)
 3DMAS gas supply flow rate: 200 sccm
 3DMAS gas irradiation time: 6 seconds
(Step 3)
 Temperature in the processing chamber: 550° C.
 Pressure in the processing chamber: 10 Pa (0.075 Torr)
 N₂O gas supply flow rate: 1000 sccm
 N₂O gas irradiation time: 30 seconds As a result, the film formation rate of the SiOC film formed in this example was 0.61 Å/cycle, the uniformity in the film thickness in-plane of the wafer was 1.7%, and the refractive index (R.I.) was 1.62. Namely, it was found that an excellent silicon insulating film could be formed at a film formation rate satisfying the production efficiency in the low temperature zone of 550° C.

Example 5

By the third sequence of the above-described embodiment, the gas species of the oxygen-containing gas and the supply time in step 3 were respectively changed, to form the SiOCN film or the SiOC was on the wafer, and the O-concentration, C-concentration, and N-concentration of each film formed at this time were measured by XRF. In this example, the HCDS gas was used as the chlorosilane-based source gas, and the 3DMAS gas was used as the aminosilane-based source gas, and the O₂ gas, the NO gas, and the N₂O gas was used as the oxygen-containing gas, to form the SiOCN film or the SiOC film by non-plasma by the sequence of FIG. 5A. The processing conditions in each step at this time were the same as the processing conditions in the aforementioned example 4. However, the irradiation time of the oxygen-containing gas in step 3 was varied in a range of 1 to 120 seconds.

Figure 17:
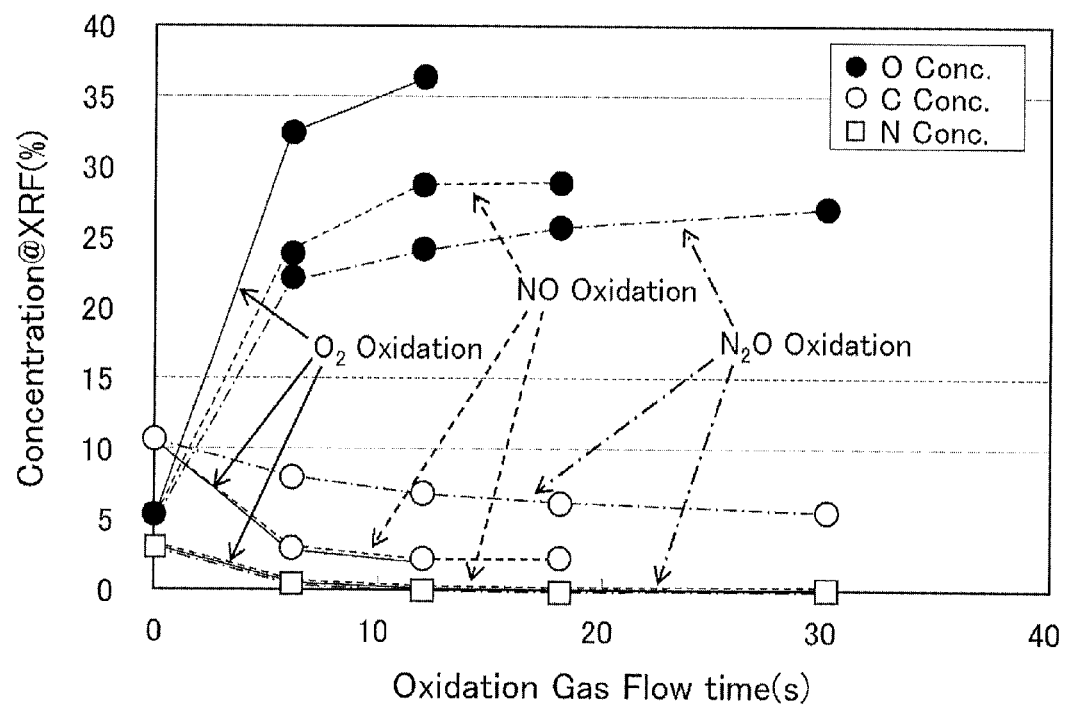
FIG. 17 is a graph chart showing a measurement result of XRF according to example 5 of the present invention.

FIG. 17 is a graph chart showing the measurement result of the XRF according to this example, wherein the supply time of the oxygen-containing gas (arbitrary unit (a.u.)) was taken on the horizontal axis, and the O-concentration, C-concentration, and N-concentration (arbitrary unit (a.u.)) are respectively taken on the vertical axis. Symbol ● in the figure indicates the O-concentration in the film, symbol ○ indicates the C-concentration in the film, and symbol □ in the figure indicates the N-concentration in the film respectively. Further, solid line in the figure indicates a case that the O₂ gas is used as the oxygen-containing gas, and broken line indicates a case that the NO gas is used as the oxygen-containing gas, and one dot chain line indicates a case that the N₂O gas is used as the oxygen-containing gas respectively. Further, Oxidation Gas Flow time=zero indicates a case that the oxygen-containing gas is not supplied, namely indicates a case that a substance containing Si, C, and N (called simply SiCN hereafter) is formed by the sequence of FIG. 5A in which step 1 and step 2 are alternately repeated (comparative example).

As shown in FIG. 17, in the case of not supplying the oxygen-containing gas (comparative example), it is found that the C-concentration is high, and C-rich SiCN is formed. It is also found that there are twice or more higher C-concentration than the N-concentration. According to FIG. 17, it appears that O is contained in SiCN. However, this is the O detected on an interface between SiCN and a base layer or on the surface of the SiCN, and is not the component of the SiCN, and therefore is not taken into consideration here. Meanwhile, in a case of supplying the oxygen-containing gas (example), it is found that oxidation occurs by supplying the oxygen-containing gas even in a case that any one of the O₂ gas, the NO gas, and the N₂O gas is used as the oxygen-containing gas, so that SiCN is changed to the SiOCN film. It is also found that as the supply time of the oxygen-containing gas is prolonged, the oxidation is progressed to increase the O-concentration (indicated by ●), and the C-concentration (indicated by ○) and the N-concentration (indicated by □) are reduced. It is found that when the supply time of the oxygen-containing gas is prolonged to some degree and oxidation is progressed to some degree, the N-component is set in the impurity level, and when the supply time of the oxygen-containing gas is further prolonged, the oxidation is further progressed to achieve substantial disappearance of the N-component, and the SiOC film is formed. It is found that the O-concentration in the film is highest when using the O₂ gas as the oxygen-containing gas (solid line), and is next high when using the NO gas (broken line), and is the next high when using the N₂O gas (one dot chain line). It is also found that the C-concentration in the film is lower when using the O₂ gas or the NO gas as the oxygen-containing gas (solid line and broken line), than a case using the N₂O gas (one dot chain line).

Namely, in this example, it is found that the SiOCN film is formed while increasing the ratio of the O-component, and reducing the ratio of the C-component, and further reducing the ratio of the N-component, by the thermal oxidizing action of the oxygen-containing gas in step 3. It is also found that by the thermal oxidizing action of the oxygen-containing gas in step 3, the SiOC film is formed while increasing the ratio of the O-component and reducing the ratio of the C-component, and further reducing the ratio of the N-component to the impurity level (or the N-component disappears substantially). The film formation rate of the SiOCN film and the SiOC film formed in this example, is 0.61 Å/cycle or more even in a case that any one of the $O_2$ gas, the NO gas, and the $N_2O$ gas is used as the oxygen-containing gas, and uniformity of the in-surface film thickness of the wafer surface is 1.7% or less. Namely, it is found that a high quality silicon insulating film can be formed in a low temperature region of 550° C. as well, while controlling the composition ratio, at the film formation rate of satisfying production efficiency.

Example 6

The SiOC film was formed on the wafer by the third sequence of the above-mentioned embodiment, and the O-concentration, the C-concentration, and the N-concentration of the SiOC film were measured by XPS. Further, an etching rate and a dielectric constant k of the SiOC film were measured. In this example, the HCDS gas was used as the chlorosilane-based source gas, the 3DMAS gas was used as the aminosilane-based source gas, and the $N_2$ gas was used as the oxygen-containing gas, to thereby form the SiOC film by non-plasma by the sequence of FIG. 5A. The processing conditions in each step at this time, are set to the same as the processing conditions in example 4.

Further, as comparative example 1, SiOCN film was formed on a wafer by an alternate-supply method of repeating n-times a cycle of supplying HCDS gas, supplying propylene ($C_3H_6$) gas, supplying ammonia ($NH_3$) gas, and supplying $O_2$ gas, with these steps as one cycle, and O-concentration, C-concentration, and N-concentration of the SiOCN film were measured by XPS. Further, an etching rate and a dielectric constant k of the SiOCN film of comparative example 1 were measured.

Further, as comparative example 2, SiN film was formed by an alternate-supply method of repeating n-times a cycle of supplying DCS gas and supplying $NH_3$ gas with these steps as one cycle, and the etching rate and the dielectric constant k of the SiN film were measured.

Figure 18:
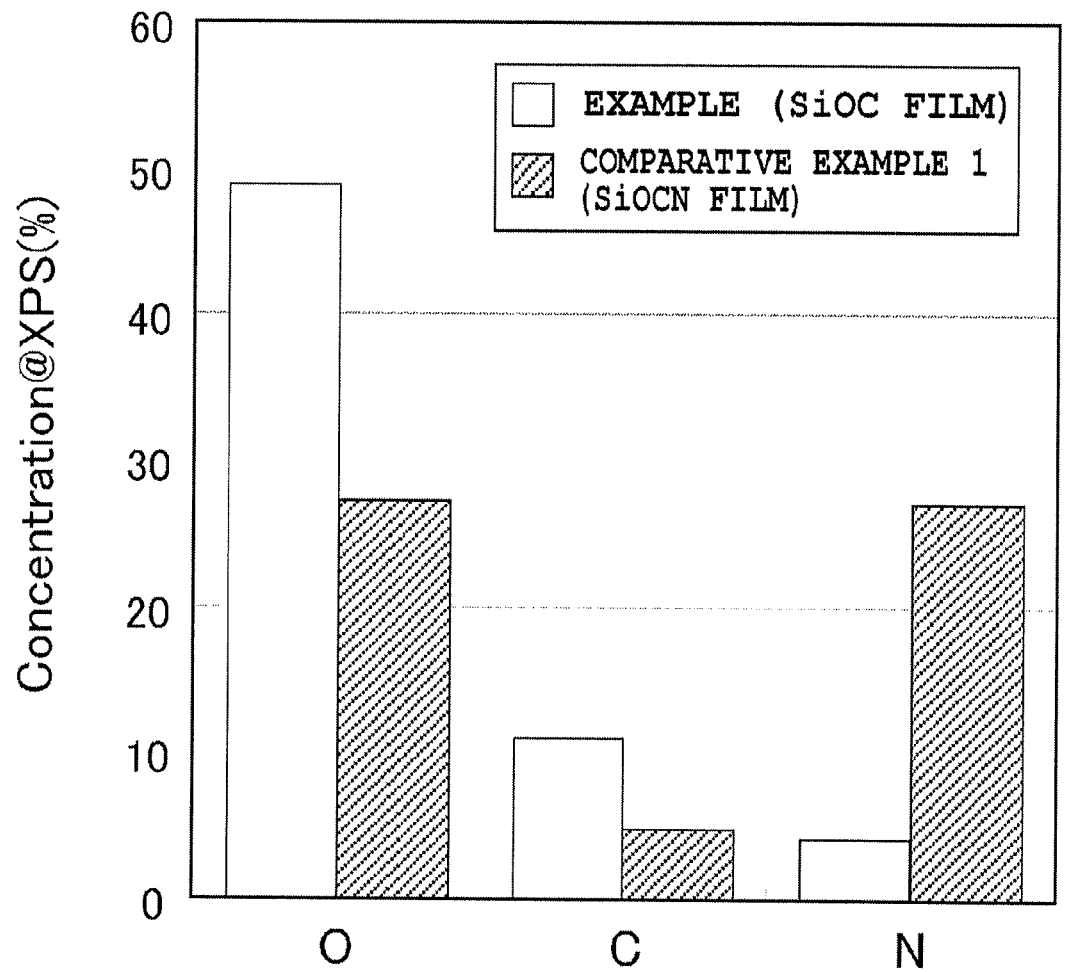
FIG. 18 is a graph chart showing a measurement result of the XPS spectrum according to example 6 of the present invention.

FIG. 18 is a graph chart showing a measurement result of a XPS spectrum of the SiOC film of this example and the SiOCN film of comparative example 1. The vertical axis indicates a concentration (%), and the horizontal axis indicates each element of 0, C, N in FIG. 18. According to FIG. 18, it is found that the O-concentration is higher, the C-concentration is higher, and the N-concentration is lower in the SiOC film of this example, than those of the comparative example 1. Particularly, it is found that the N-concentration is low to an impurity level in the SiOC film of this example. This reveals a fact that the SiOCN film of comparative example 1 is changed to the SiON film by decrease of C to the impurity level, or substantial disappearance of C prior to N, if oxidation is advanced. Meanwhile, the SiOC film of this example is formed in such a manner that N of the SiOCN film is decreased to the impurity level by oxidation. Namely, according to this example, it is found that if the oxidation is advanced, N is decreased to the impurity level or substantially disappears prior to C in the SiOCN film, and therefore the SiOCN film is changed to the SiOC film.

Figure 19:
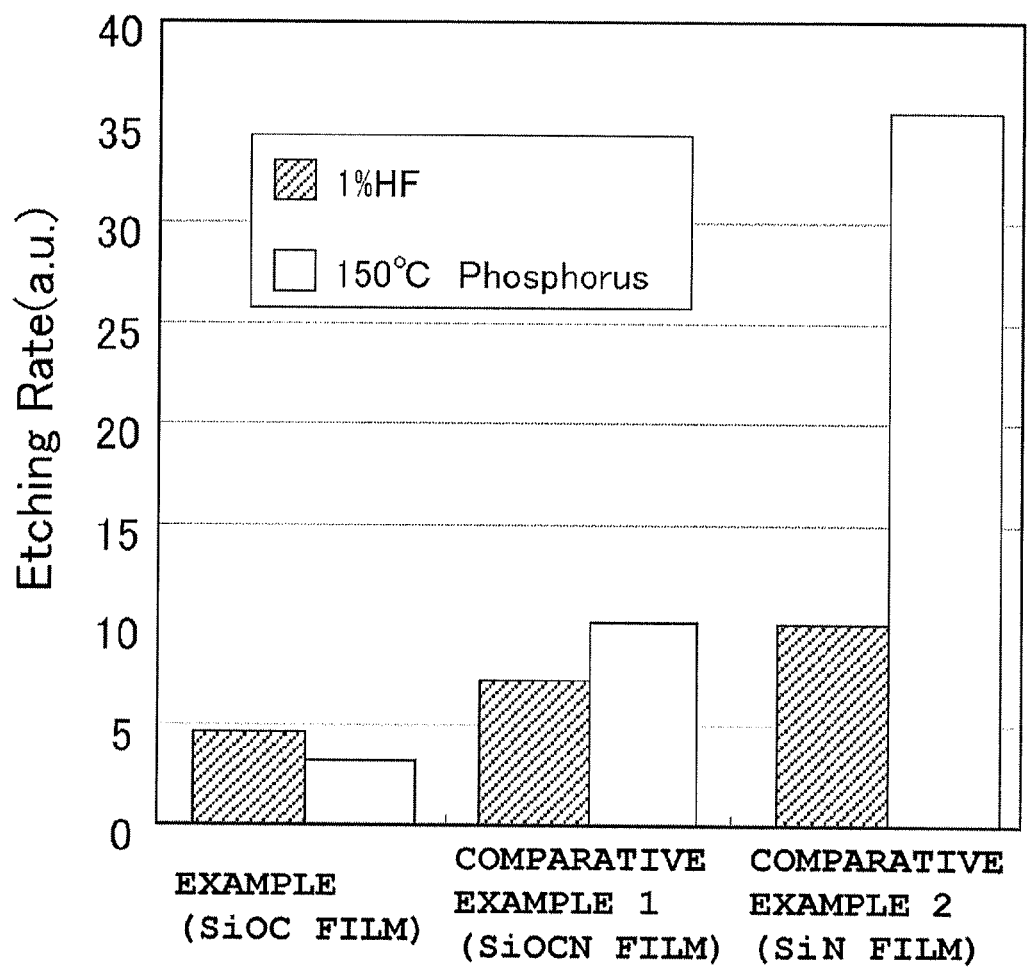
FIG. 19 is a graph chart showing a measurement result of an etching rate according to example 6 of the present invention.

FIG. 19 is a graph chart showing the measurement result of the etching rate when etching is applied to the SiOC film of this example, the SiOCN film of comparative example 1, and the SiN film of comparative example 2, using a hydrogen fluoride (HF) aqueous solution with a concentration of 1%, and the etching rate when etching is applied thereto using a heated phosphoric acid aqueous solution of 150° C. The vertical axis of FIG. 19 indicates the etching rate (arbitrary unit (a.u.)), and the horizontal axis indicates the example and comparative examples 1 and 2. According to FIG. 19, it is found that even in a case of using either one of the HF aqueous solution and the heated phosphoric acid aqueous solution is used, the etching rate of the SiOC film of this example is lowest, compared with the etching rates of the SiOCN film of comparative example 1 and the SiN film of comparative example 2. Namely, it is found that the SiOC film of this example has high resistance to HF and heated phosphoric acid. This is a result not contradictory to a general film characteristic such that resistance to HF is improved if the C-concentration is high, and resistance to heated phosphoric acid is improved if the N-concentration is low. The etching rate to 1% HF aqueous solution of the SiOC film of this example is 10 Å/min or less.

Figure 20:
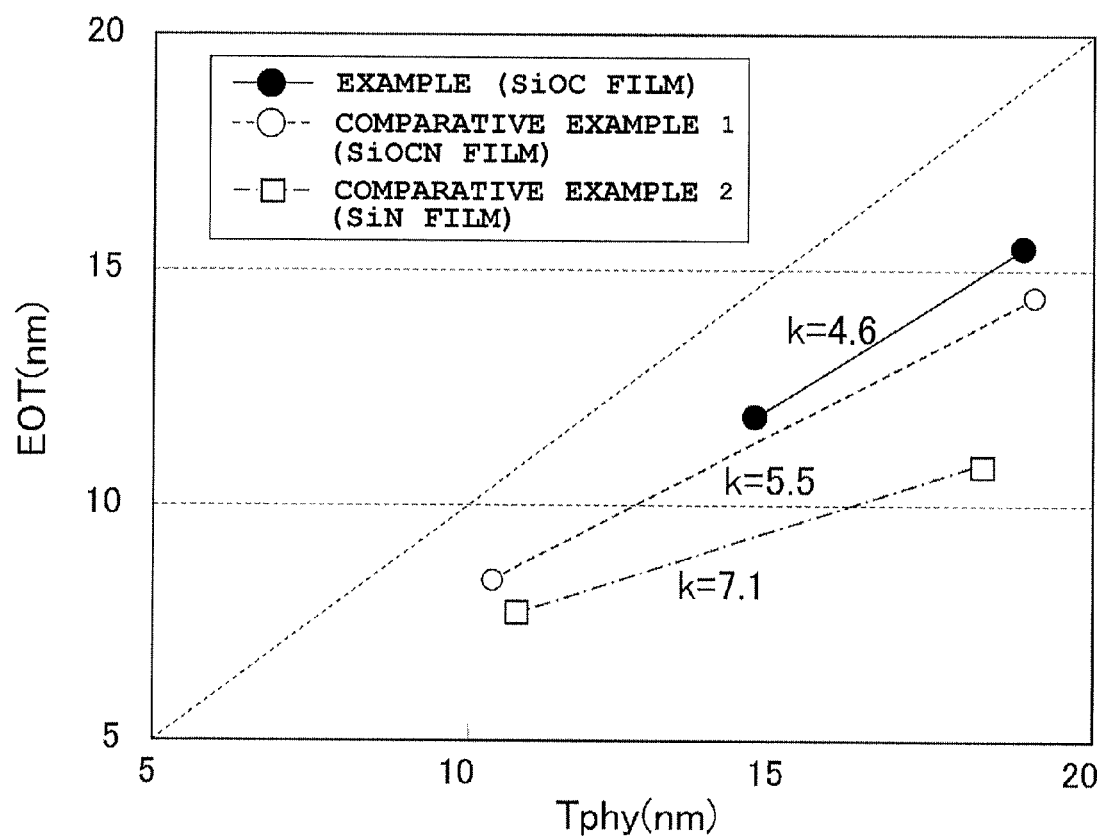
FIG. 20 is a graph chart showing a measurement result of a dielectric constant according to example 6 of the present invention.

FIG. 20 is a graph chart showing the measurement result of the dielectric constant k of the SiOC film of this example, the SiOCN film of comparative example 1, and the SiN film of comparative example 2 respectively. The horizontal axis of FIG. 20 indicates an optical film thickness (nm), and the vertical axis indicates EOT which is an electric film thickness, namely equivalent oxide thickness (nm) in FIG. 20. In the figure, ● indicates the SiOC film of this example, ○ indicates the SiOCN film of comparative example 1, and □ indicates the equivalent oxide film thickness with respect to the optical film thickness of the SiN film of comparative example 2 respectively. The dielectric constant k can be calculated from the inclination of the graph. As the inclination becomes larger, the dielectric constant k becomes small, and when the inclination is 1, the dielectric constant k is the same as the dielectric constant k of the thermal oxide film ($SiO_2$ film). According to FIG. 20, it is found that the dielectric constant k of the SiOC film of this example is 4.6, the dielectric constant k of the SiOCN film of comparative example 1 is 5.5, and the dielectric constant k of the SiN film of comparative example 2 is 7.1. Namely, it is found that the dielectric constant of 5 or less can be achieved by the SiOC film of this example.

This reveals a fact that the SiOC film with a dielectric constant of 5 or less, having high resistance to HF and heated phosphoric acid respectively can be formed in a lower temperature region of 550° C. or less.

Example 7

As sample 1, the SiO film was formed on the wafer by the third sequence of the above-mentioned embodiment, and the O-concentration, the C-concentration, and the N-concentration of the SiO film were measured. In sample 1, the hydrogen-containing gas was supplied together with the oxygen-containing gas in the step of supplying the oxygen-containing gas. Further, in sample 1, the HCDS gas was used as the chlorosilane-based source gas, and the 3DMAS gas was used as the aminosilane-based source gas, the $O_2$ gas was used as the oxygen-containing gas, and the $H_2$ gas was used as the hydrogen-containing gas, to thereby form the SiO film by non-plasma by the sequence of FIG. 5A. In sample 1, the cycle of steps 1, 2, and 3 was performed multiple numbers of times, with these steps as one cycle. The processing condition in each step at this time, was set as follows.

(Step 1)
  (Step 1)
    Temperature in the processing chamber: 550° C.
    Pressure in the processing chamber: 399 Pa (3 Torr)
    HCDS gas supply flow rate: 180 sccm
    HCDS gas irradiation time: 18 seconds
  (Step 2)
    Temperature in the processing chamber: 550° C.
    Pressure in the processing chamber: 399 Pa (3 Torr)
    3DMAS gas supply flow rate: 50 sccm
    3DMAS gas irradiation time: 12 seconds
  (Step 3)
    Temperature in the processing chamber: 550° C.
    Pressure in the processing chamber: 10 Pa (0.075 Torr)
    $O_2$ gas supply flow rate: 5000 sccm
    $H_2$ gas supply flow rate: 500 sccm
    Irradiation time of $O_2$ gas+$H_2$ gas: 6 seconds Further, as samples 2 to 4, the SiOCN film was formed on the wafer according to a modified example of the third sequence of the above-mentioned embodiment, and the O-concentration, the C-concentration, and the N-concentration of the SiOCN film were measured in each sample. Samples 2, 3, 4 are the samples of the SiOCN film formed on the wafer arranged in an upper portion, a middle portion, and a lower portion in the processing chamber respectively. Further, in samples 2 to 4, the hydrogen-containing gas was supplied together with the oxygen-containing gas in the step of supplying the oxygen-containing gas. Further, the HCDS gas was used as the chlorosilane-based source gas, the 3DMAS gas was used as the aminosilane-based source gas, the $O_2$ gas was used as the oxygen-containing gas, and the $H_2$ gas was used as the hydrogen-containing gas, to thereby form the SiOCN film by non-plasma by the sequence of FIG. 5C. In samples 2 to 4, by setting steps 1 and 2 as one set, and this set was performed three times, and thereafter step 3 was performed. Then, by setting the set of steps 1 and 2, and step 3 as one cycle, and this cycle was performed multiple numbers of times. The processing conditions in each step in this case were set as follows.

Figure 21:
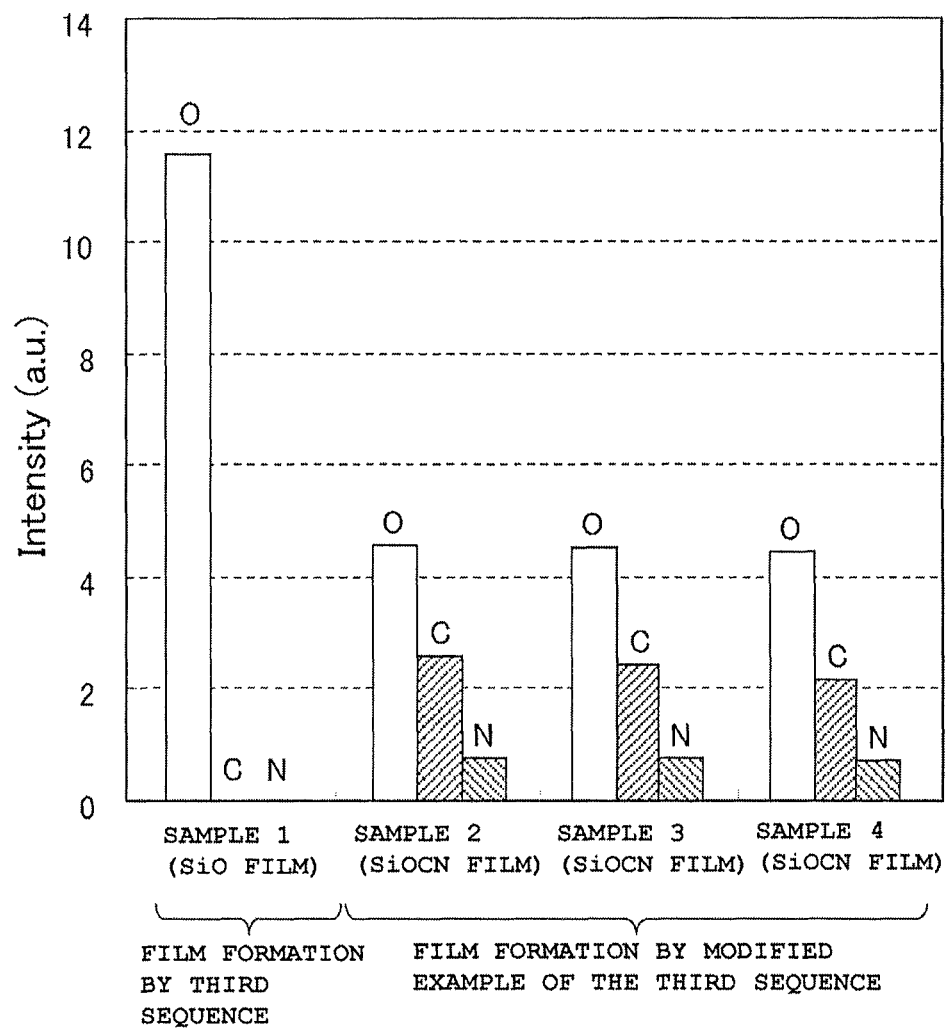
FIG. 21 is a graph chart showing a measurement result of O-concentration, C-concentration, and N-concentration according to example 7 of the present invention.

(Step 1)
  Temperature in the processing chamber: 550° C.
  Pressure in the processing chamber: 399 Pa (3 Torr)
  HCDS gas supply flow rate: 180 sccm
  HCDS gas irradiation time: 18 seconds
(Step 2)
  Temperature in the processing chamber: 500° C.
  Pressure in the processing chamber: 399 Pa (3 Torr)
  3DMAS gas supply flow rate: 50 sccm
  3DMAS gas irradiation time: 24 seconds
(Step 3)
  Temperature in the processing chamber: 500° C.
  Pressure in the processing chamber: 10 Pa (0.075 Torr)
  $O_2$ gas supply flow rate: 5000 sccm
  $H_2$ gas supply flow rate: 500 sccm
  Irradiation time of $O_2$ gas+$H_2$ gas: 6 seconds FIG. 21 shows a graph chart showing the measurement result of the O-concentration, the C-concentration, and the N-concentration in each of the samples 1 to 4. The vertical axis indicates Intensity, namely, the intensity of each element (arbitrary unit (a.u.)), and the horizontal axis indicates each sample in FIG. 21.

According to FIG. 21, in sample 1 in which the third sequence (FIG. 5A) is used, it is found that the SiO film is formed by desorption of the C-component and the N-component from the film. Namely, in step 3, it is found that the ratio of the C-component and the N-component in the film is remarkably decreased to the impurity level or substantially disappears by the action of thermal oxidation by oxidizing species (such as atomic oxygen, etc.) having a strong oxidizing power, the oxidizing species being generated by the reaction between the $O_2$ gas and the $H_2$ gas under a decompressed atmosphere, and the SiO film is thereby formed.

Further, according to FIG. 21, it is found that the SiOCN film is formed in samples 2 to 4 in which the modified example (FIG. 5C) of the third sequence is used. Namely, it is found that even in a case that the oxidizing species having a strong oxidizing power such as atomic oxygen, etc., is used, the desorption of the C-component and the N-component from the film is suppressed by performing step 3 after repeating steps 1 and 2 multiple number of times with these steps as one set so that the C-component and the N-component are remained in the film, and the SiOCN film is thereby formed. Further, samples 2, 3, 4 in FIG. 21 are the samples of the SiOCN films formed on the wafer arranged in the upper portion, the middle portion, and the lower portion respectively in the processing chamber, wherein each composition ratio of the SiOCN film is approximately the same. Therefore, it is found that the composition ratio can be uniformly controlled among wafers.

Further, according to FIG. 21, it is also found that the SiOC film can be formed depending on the processing condition. Namely, although the SiO film is formed in sample 1 by selecting the processing condition in each step as described above, and the SiOCN film is formed in samples 2 to 4 by selecting the processing condition in each step as described above, data shown in FIG. 21 shows that the C-concentration and the N-concentration in the film can be controlled depending on the film formation sequence and the processing condition. Namely, it is found from FIG. 21 that the composition ratio can be controlled so as to form the SiOC film for example, by selecting a prescribed sequence as the film formation sequence, or selecting a prescribed condition as the processing condition in each step.

Preferred aspects of the present invention will be supplementarily described hereafter.

(Supplementary Description 1)

According to an aspect of the present invention, there is provided a method for manufacturing a semiconductor device including:

forming a thin film containing a specific element and having a prescribed composition on a substrate by alternately performing the following steps prescribed number of times:

forming a first layer containing the specific element, nitrogen, and carbon on the substrate by alternately performing prescribed number of times: supplying a first source gas containing the specific element and a halogen-group to the substrate, and supplying a second source gas containing the specific element and an amino-group to the substrate; and forming a second layer by modifying the first layer by supplying a reactive gas different from each of the source gases, to the substrate.

Here, the case of "alternately performing the step of supplying the first source gas and the step of supplying the second source gas . . . " includes both cases of performing once a set of "supplying one of the source gases of the first source gas and the second source gas and thereafter supplying the other source gas different from one of the source gases of the first source gas and the second source gas, with these steps as one set, and repeating this set multiple numbers of times. This means that this set is performed once or more (prescribed number of times).

Further, the case of "alternately performing the step of forming the first layer and the step of forming the second layer" includes the following both cases: a case of setting the step of setting the first layer and the step of forming the second layer as one cycle, and performing this cycle once, and a case of repeating this cycle multiple numbers of times. This means that this cycle is performed once or more (prescribed number of times).

In this specification, the description similar to the above descriptions is used as having the same meaning.

(Supplementary Description 2)

There is provided the method of supplementary description 1, wherein in forming the second layer, a nitrogen-containing gas activated by at least one of heat and plasma is supplied to the substrate as the reactive gas, to form at least one of a carbonitride layer containing the specific element and a nitride layer containing the specific element as the second layer, and in forming the thin film, at least one of a carbonitride film containing the specific element and a nitride film containing the specific element is formed as the thin film.

(Supplementary Description 3)

There is provided the method of the supplementary description 1, wherein in forming the second layer, a thermally activated nitrogen-containing gas is supplied to the substrate as the reactive gas, to form a carbonitride layer containing the specific element as the second layer, and in forming the thin film, a carbonitride film containing the specific element is formed as the thin film.

(Supplementary Description 4)

There is provided the method of the supplementary description 1, wherein in forming the second layer, a plasma activated nitrogen-containing gas is supplied to the substrate as the reactive gas, to form at least one of a carbonitride layer containing the specific element and a nitride layer containing the specific element as the second layer, and in forming the thin film, at least one of a carbonitride film containing the specific element and a nitride film containing the specific element is formed as the thin film.

(Supplementary Description 5)

There is provided the method of the supplementary description 1, wherein in forming the second layer, a thermally activated carbon-containing gas is supplied to the substrate as the reactive gas, to form a carbonitride layer containing the specific element as the second layer, and in forming the thin film, a carbonitride film containing the specific element is formed as the thin film.

(Supplementary Description 6)

There is provided the method of the supplementary description 1, wherein in forming the second layer, an oxygen-containing gas activated by at least one of heat and plasma is supplied to the substrate as the reactive gas, to form at least one of an oxycarbonitride layer containing the specific element, an oxycarbide layer containing the specific element and an oxide layer containing the specific element as the second layer, and in forming the thin film, at least one of an oxycarbonitride film containing the specific element, an oxycarbide film containing the specific element and an oxide film containing the specific element is formed as the thin film.

(Supplementary Description 7)

There is provided the method of the supplementary description 1, wherein in forming the second layer, thermally activated oxygen-containing gas is supplied to the substrate as the reactive gas, to form at least one of an oxycarbonitride layer containing the specific element and an oxycarbide layer containing the specific element as the second layer, and in forming the thin film, at least one of an oxycarbonitride film containing the specific element and an oxycarbide film containing the specific element is formed as the thin film.

(Supplementary Description 8)

There is provided the method of the supplementary description 1, wherein in forming the second layer, a plasma activated oxygen-containing gas is supplied to the substrate as the reactive gas, to form at least one of an oxycarbonitride layer containing the specific element, an oxycarbide layer containing the specific element, and an oxide layer containing the specific element as the second layer, and in forming the thin film, at least one of an oxycarbonitride film containing the specific element, an oxycarbide film containing the specific element, and an oxide layer containing the specific element is formed as the thin film.

(Supplementary Description 9)

There is provided the method of the supplementary description 1, wherein in forming the second layer, a thermally activated boron-containing gas is supplied to the substrate as the reactive gas, to form a boron carbonitride layer containing the specific element as the second layer, and in forming the thin film, a boron carbonitride film containing the specific element is formed as the thin film.

(Supplementary Description 10)

There is provided the method of the supplementary description 1, wherein in forming the second layer, thermally activated carbon-containing gas and nitrogen-containing gas are supplied to the substrate as reactive gases, to form a carbonitride layer containing the specific element as the second layer, and in forming the thin film, a carbonitride film containing the specific element is formed as the thin film.

(Supplementary Description 11)

There is provided the method of the supplementary description 1, wherein in forming the second layer, a thermally activated carbon-containing gas is supplied to the substrate as the reactive gas, and thereafter a thermally activated nitrogen-containing gas is supplied to the substrate as the reactive gas, to thereby form a carbonitride layer containing the specific element as the second layer, and in forming the thin film, a carbonitride film containing the specific element is formed as the thin film.

(Supplementary Description 12)

There is provided the method of the supplementary description 1, wherein in forming the second layer, thermally activated carbon-containing gas and oxygen-containing gas are supplied to the substrate as reactive gases, to form an oxycarbonitride layer containing the specific element as the second layer, and in forming the thin film, an oxycarbonitride film containing the specific element is formed as the thin film.

(Supplementary Description 13)

There is provided the method of the supplementary description 1, wherein in forming the second layer, a thermally activated carbon-containing gas is supplied to the substrate as the reactive gas, and thereafter a thermally activated oxygen-containing gas is supplied to the substrate as the reactive gas, to form an oxycarbonitride layer containing the specific element as the second layer, and in forming the thin film, an oxycarbonitride film containing the specific element is formed as the thin film.

(Supplementary Description 14)

There is provided the method of the supplementary description 1, wherein in forming the second layer, thermally activated boron-containing gas and nitrogen-containing gas are supplied to the substrate as reactive gases, to form a boron carbonitride layer containing the specific element as the second layer, and in forming the thin film, a boron carbonitride film containing the specific element is formed as the thin film.

(Supplementary Description 15)

There is provide the method of the supplementary description 1, wherein in forming the second layer, a thermally activated boron-containing gas is supplied to the substrate as the reactive gas, and thereafter a thermally activated nitrogen-containing gas is supplied to the substrate as the reactive gas, to form a boron carbonitride layer containing the specific element as the second layer, and in forming the thin film, a boron carbonitride film containing the specific element is formed as the thin film.

(Supplementary Description 16)

There is provided the method of the supplementary description 1, wherein in forming the second layer, thermally activated nitrogen-containing gas and oxygen-containing gas are supplied to the substrate as reactive gases, to form an oxycarbonitride layer containing the specific element as the second layer, and in forming the thin film, an oxycarbonitride film containing the specific element is formed as the thin film.

(Supplementary Description 17)

There is provided the method of the supplementary description 1, wherein in forming the second layer, a thermally activated nitrogen-containing gas is supplied and thereafter a thermally activated oxygen-containing gas is supplied to the substrate as the reactive gas, to form an oxycarbonitride layer containing the specific element as the second layer, and in forming the thin film, an oxycarbonitride film containing the specific element is formed as the thin film.

(Supplementary Description 18)

There is provided the method of the supplementary description 1, wherein in forming the second layer, thermally activated carbon-containing gas, nitrogen-containing gas, and oxygen-containing gas are supplied to the substrate as reactive gases, to form an oxycarbonitride layer containing the specific element as the second layer, and in forming the thin film, an oxycarbonitride film containing the specific element is formed as the thin film.

(Supplementary Description 19)

There is provided the method of the supplementary description 1, wherein in forming the second layer, a thermally activated carbon-containing gas is supplied to the substrate as the reactive gas, and thereafter a thermally activated nitrogen-containing gas is supplied to the substrate as the reactive gas, and thereafter a thermally activated oxygen-containing gas is supplied to the substrate as the reactive gas, to form an oxycarbonitride layer containing the specific element as the second layer, and in forming the thin film, an oxycarbonitride film containing the specific element is formed as the thin film.

(Supplementary Description 20)

There is provided the method of the supplementary description 1, wherein in forming the second layer, thermally activated carbon-containing gas, boron-containing gas, and nitrogen-containing gas are supplied to the substrate as reactive gases, to form a boron carbonitride layer containing the specific element, and in forming the thin film, a boron carbonitride film containing the specific element is formed as the thin film.

(Supplementary Description 21)

There is provided the method of the supplementary description 1, wherein in forming the second layer, a thermally activated carbon-containing as is supplied to the substrate as the reactive gas, and thereafter a thermally activated boron-containing gas is supplied to the substrate as the reactive gas, and thereafter a thermally activated nitrogen-containing gas is supplied to the substrate as the reactive gas, to form a boron carbonitride layer containing the specific element as the second layer, and in forming the thin film, a boron carbonitride film containing the specific element is formed as the thin film.

(Supplementary Description 22)

According to other aspect of the present invention, there is provided a method for processing a substrate, including:

forming a thin film containing a specific element and having a prescribed composition on a substrate by alternately performing the following steps prescribed number of times:

forming a first layer containing the specific element, nitrogen, and carbon on the substrate by alternately performing prescribed number of times supplying a first source gas containing the specific element and a halogen-group to the substrate, and supplying a second source gas containing the specific element and an amino-group to the substrate; and forming a second layer by modifying the first layer by supplying a reactive gas different from each of the source gases, to the substrate.

(Supplementary Description 23)

According to further other aspect of the present invention, there is provided a substrate processing apparatus, including:

a processing chamber configured to house a substrate;

a first source gas supply system configured to supply a first source gas containing a specific element and a halogen-group to a substrate in the processing chamber;

a second source gas supply system configured to supply the specific element and an amino-group to the substrate in the processing chamber;

a reactive gas supply system configured to supply a reactive gas different from each of the source gases, to the substrate in the processing chamber; and a controller configured to control the first source gas supply system, the second source gas supply system, and the reactive gas supply system, so that a thin film containing the specific element and having a prescribed composition is formed on the substrate by alternately performing the following processes prescribed number of times:

a process of forming a first layer containing the specific element, nitrogen, and carbon on the substrate by alternately performing prescribed number of times:

a process of supplying a first source gas to the substrate in the processing chamber, and a process of supplying the second source gas to the substrate in the processing chamber; and a process of forming a second layer by modifying the first layer by supplying the reactive gas to the substrate in the processing chamber.

(Supplementary Description 24)

According to further other aspect of the present invention, there is provided a program configured to cause a computer to execute a procedure of forming a thin film containing a specific element and having a prescribed composition on a substrate by alternately performing:

a procedure of forming a first layer containing the specific element, nitrogen, and carbon on the substrate by alternately performing prescribed number of times: a procedure of supplying a first source gas containing the specific element and a halogen-group to the substrate in a processing chamber of a substrate processing apparatus, and a procedure of supplying a second source gas containing the specific element and an amino-group to the substrate in the processing chamber; and a procedure of forming a second layer by modifying the first layer by supplying a reactive gas different from each of the source gases, to the substrate in the processing chamber.

(Supplementary Description 25)

According to further other aspect of the present invention, there is provided a non-transitory computer-readable recording medium recording a program for causing a computer to execute:

forming a thin film having a prescribed composition and containing a specific element on a substrate by alternately performing the following procedures prescribed number of times:

a procedure of forming a first layer containing the specific element, nitrogen, and carbon on the substrate by alternately performing prescribed number of times: a procedure of supplying a first source gas containing the specific element and a halogen-group to the substrate in a processing chamber of a substrate processing apparatus, and a procedure of supplying a second source gas containing the specific element and an amino-group to the substrate in the processing chamber; and a procedure of forming a second layer by modifying the first layer by supplying a reactive gas different from each of the source gases, to the substrate in the processing chamber.

DESCRIPTION OF SIGNS AND NUMERALS

121 Controller
200 Wafer
201 Processing chamber
202 Processing furnace
203 Reaction tube
207 Heater
231 Exhaust pipe
232a First gas supply pipe
232b Second gas supply pipe
232c Third gas supply pipe
232d Fourth gas supply pipe
232i Fifth gas supply pipe
232j Sixth gas supply pipe

What is claimed is:

1. A method for manufacturing a semiconductor device, comprising:
  forming a thin film containing a specific element and having a prescribed composition on a substrate by alternately performing prescribed number of times:
    forming a first layer containing the specific element, nitrogen, and carbon on the substrate by alternately repeating multiple number of times:
      supplying a first source gas containing the specific element and a halogen-group to the substrate, and
      supplying a second source gas containing the specific element and an amino-group to the substrate; and
    forming a second layer by modifying the first layer by supplying a reactive gas different from each of the source gases, to the substrate.

2. The method of claim 1, wherein
in forming the second layer, a nitrogen-containing gas activated by at least one of heat or plasma is supplied to the substrate as the reactive gas, to form at least one of a carbonitride layer containing the specific element or a nitride layer containing the specific element as the second layer, and
in forming the thin film, at least one of a carbonitride film containing the specific element or a nitride film containing the specific element is formed as the thin film.

3. The method of claim 1, wherein
in forming the second layer, a thermally activated nitrogen-containing gas is supplied to the substrate as the reactive gas, to form a carbonitride layer containing the specific element as the second layer, and
in forming the thin film, a carbonitride film containing the specific element is formed as the thin film.

4. The method of claim 1, wherein
in forming the second layer, a plasma activated nitrogen-containing gas is supplied to the substrate as the reactive gas, to form at least one of a carbonitride layer containing the specific element or a nitride layer containing the specific element as the second layer, and
in forming the thin film, at least one of a carbonitride film containing the specific element or a nitride film containing the specific element is formed as the thin film.

5. The method of claim 1, wherein
in forming the second layer, a thermally activated carbon-containing gas is supplied to the substrate as the reactive gas, to form a carbonitride layer containing the specific element as the second layer, and
in forming the thin film, a carbonitride film containing the specific element is formed as the thin film.

6. The method of claim 1, wherein
in forming the second layer, an oxygen-containing gas activated by at least one of heat or plasma is supplied to the substrate as the reactive gas, to form at least one of an oxycarbonitride layer containing the specific element, an oxycarbide layer containing the specific element, or an oxide layer containing the specific element as the second layer, and
in forming the thin film, at least one of an oxycarbonitride film containing the specific element, an oxycarbide film containing the specific element, or an oxide film containing the specific element is formed as the thin film.

7. The method of claim 1, wherein
in forming the second layer, thermally activated oxygen-containing gas is supplied to the substrate as the reactive gas, to form at least one of an oxycarbonitride layer containing the specific element or an oxycarbide layer containing the specific element as the second layer, and
in forming the thin film, at least one of an oxycarbonitride film containing the specific element or an oxycarbide film containing the specific element is formed as the thin film.

8. The method of claim 1, wherein
in forming the second layer, a plasma activated oxygen-containing gas is supplied to the substrate as the reactive gas, to form at least one of an oxycarbonitride layer containing the specific element, an oxycarbide layer containing the specific element, or an oxide layer containing the specific element as the second layer, and
in forming the thin film, at least one of an oxycarbonitride film containing the specific element, an oxycarbide film containing the specific element, or an oxide layer containing the specific element is formed as the thin film.

9. The method of claim 1, wherein
in forming the second layer, a thermally activated boron-containing gas is supplied to the substrate as the reactive gas, to form a boron carbonitride layer containing the specific element as the second layer, and
in forming the thin film, a boron carbonitride film containing the specific element is formed as the thin film.

10. The method of claim 1, wherein
in forming the second layer, thermally activated carbon-containing gas and nitrogen-containing gas are supplied to the substrate as reactive gases, to form a carbonitride layer containing the specific element as the second layer, and
in forming the thin film, a carbonitride film containing the specific element is formed as the thin film.

11. The method of claim 1, wherein
in forming the second layer, thermally activated carbon-containing gas and oxygen-containing gas are supplied to the substrate as reactive gases, to form an oxycarbonitride layer containing the specific element as the second layer, and
in forming the thin film, an oxycarbonitride film containing the specific element is formed as the thin film.

12. The method of claim 1, wherein
in forming the second layer, thermally activated boron-containing gas and nitrogen-containing gas are supplied to the substrate as reactive gases, to form a boron carbonitride layer as the second layer containing the specific element, and
in forming the thin film, a boron carbonitride film containing the specific element is formed as the thin film.

13. The method of claim 1, wherein
in forming the second layer, thermally activated nitrogen-containing gas and oxygen-containing gas are supplied to the substrate as reactive gases, to form an oxycarbonitride layer containing the specific element as the second layer, and
in forming the thin film, an oxycarbonitride film containing the specific element is formed as the thin film.

14. The method of claim 1, wherein
in forming the second layer, thermally activated carbon-containing gas, nitrogen-containing gas, and oxygen-containing gas are supplied to the substrate as reactive gases, to form an oxycarbonitride layer containing the specific element as the second layer, and
in forming the thin film, an oxycarbonitride film containing the specific element is formed as the thin film.

15. The method of claim 1, wherein
in forming the second layer, thermally activated carbon-containing gas, boron-containing gas, and nitrogen-containing gas are supplied to the substrate as reactive gases, to form a boron carbonitride layer containing the specific element as the second layer, and
in forming the thin film, a boron carbonitride film containing the specific element is formed as the thin film.

16. A method for processing a substrate comprising:
forming a thin film containing a specific element and having a prescribed composition on a substrate by alternately performing prescribed number of times:
forming a first layer containing the specific element, nitrogen, and carbon on the substrate by alternately repeating multiple number of times:
supplying a first source gas containing the specific element and a halogen-group to the substrate, and
supplying a second source gas containing the specific element and an amino-group to the substrate; and
forming a second layer by modifying the first layer by supplying a reactive gas different from each of the source gases, to the substrate.

17. A substrate processing apparatus comprising:
a processing chamber configured to house a substrate;
a first source gas supply system configured to supply a first source gas containing a specific element and a halogen-group to the substrate in the processing chamber;
a second source gas supply system configured to supply a second source gas containing the specific element and an amino-group to the substrate in the processing chamber;
a reactive gas supply system configured to supply a reactive gas different from each of the source gases, to the substrate in the processing chamber; and
a controller configured to control the first source gas supply system, the second source gas supply system, and the reactive gas supply system, so that a thin film containing the specific element and having a prescribed composition is formed on the substrate by alternately performing prescribed number of times:
a process of forming a first layer containing the specific element, nitrogen, and carbon on the substrate by alternately repeating multiple number of times:
a process of supplying the first source gas to the substrate in the processing chamber, and
a process of supplying the second source gas to the substrate in the processing chamber; and
a process of forming a second layer by modifying the first layer by supplying the reactive gas to the substrate in the processing chamber.

18. A non-transitory computer-readable recording medium recording a program for causing a computer to execute:
a procedure of forming a thin film containing a specific element and having a prescribed composition on a substrate by alternately performing prescribed number of times:
a procedure of forming a first layer containing the specific element, nitrogen, and carbon on the substrate by alternately repeating multiple number of times:
a procedure of supplying a first source gas containing the specific element and a halogen-group to the substrate in a processing chamber of a substrate processing apparatus, and
a procedure of supplying a second source gas containing the specific element and an amino-group to the substrate in the processing chamber; and
a procedure of forming a second layer by modifying the first layer by supplying a reactive gas different from each of the source gases, to the substrate in the processing chamber.

* * * * *